US008356261B1

(12) United States Patent
Socha

(10) Patent No.: US 8,356,261 B1
(45) Date of Patent: Jan. 15, 2013

(54) DETERMINING THE GRADIENT AND HESSIAN OF THE IMAGE LOG SLOPE FOR DESIGN RULE OPTIMIZATION FOR ACCELERATING SOURCE MASK OPTIMIZATION (SMO)

(75) Inventor: Robert John Socha, Campbell, CA (US)

(73) Assignee: ASML Netherlands B.V., Veldhoven (NL)

( * ) Notice: Subject to any disclaimer, the term of this patent is extended or adjusted under 35 U.S.C. 154(b) by 144 days.

(21) Appl. No.: 12/830,258

(22) Filed: Jul. 2, 2010

Related U.S. Application Data

(60) Provisional application No. 61/222,883, filed on Jul. 2, 2009.

(51) Int. Cl.
*G06F 17/50* (2006.01)
(52) U.S. Cl. .................. 716/54; 716/53; 716/55; 716/56
(58) Field of Classification Search .................. 716/53, 716/54, 55
See application file for complete search history.

(56) References Cited

U.S. PATENT DOCUMENTS

| 2005/0168498 | A1* | 8/2005 | Granik | 345/698 |
| 2006/0068334 | A1* | 3/2006 | Sandstrom et al. | 430/322 |
| 2008/0174756 | A1* | 7/2008 | Granik | 355/67 |

* cited by examiner

*Primary Examiner* — Vuthe Siek
*Assistant Examiner* — Mohammed Alam
(74) *Attorney, Agent, or Firm* — Pillsbury Winthrop Shaw Pittman LLP

(57) ABSTRACT

The Hessian (second derivative) of the image log slope (ILS) can be quickly and accurately calculated without the need to use approximate methods from the gradient of the ILS with respect to mask transmission and source intensity. The Hessian has been traditionally calculated using a finite-difference approach. Calculating the Hessian through a finite-difference approach is slow and is an approximate method. The gradient of the ILS improves the speed of calculation of the Hessian, and thus accelerated SMO operation is realized. The results of ILS evaluation can be used in design for manufacturing (DFM) to suggest changes in the design rules to improve imaging. For a fixed illumination, this information can help remove forbidden pitches and help select design rules for 1-D and 2-D patterns on a mask design layout.

20 Claims, 47 Drawing Sheets

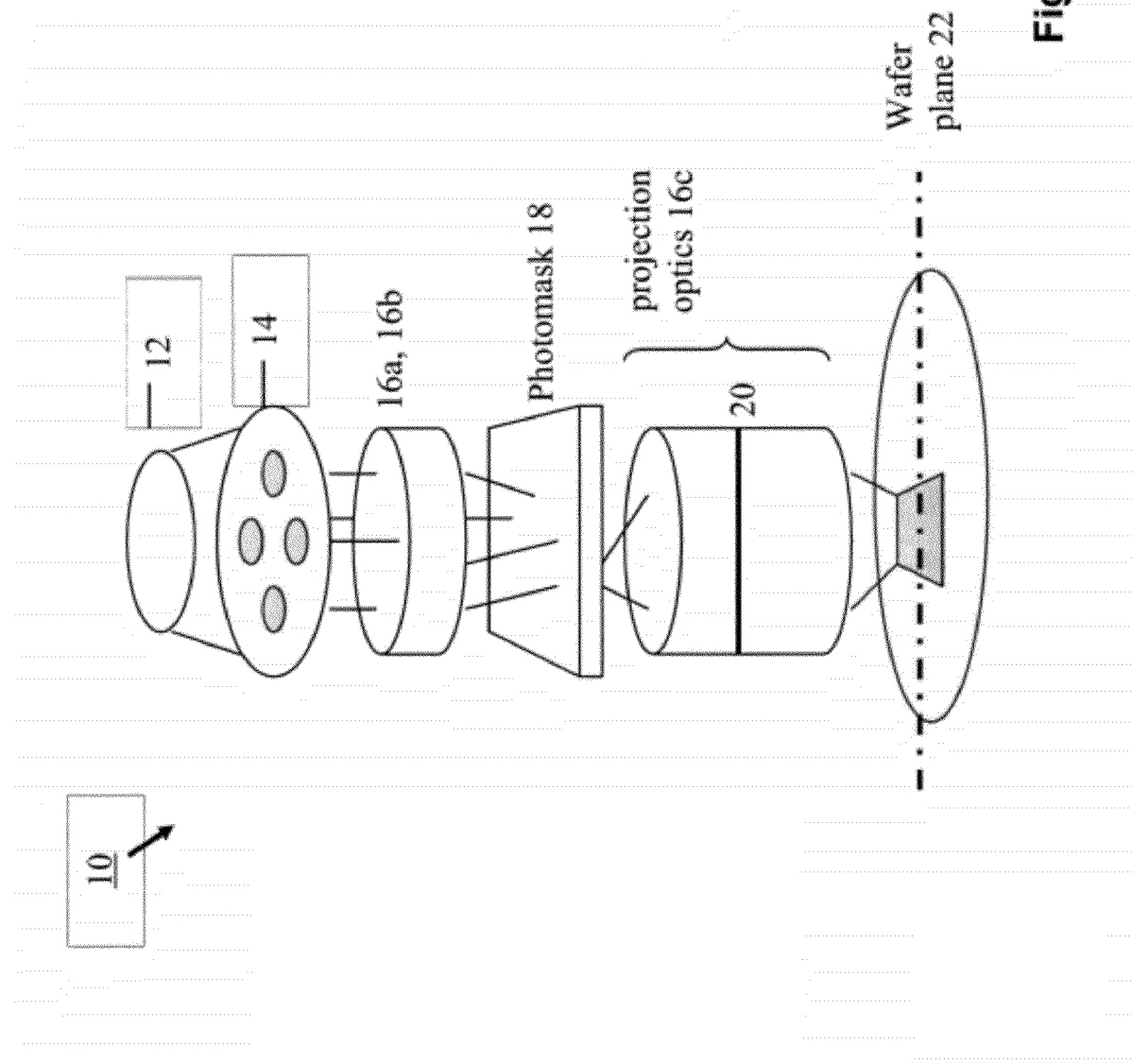

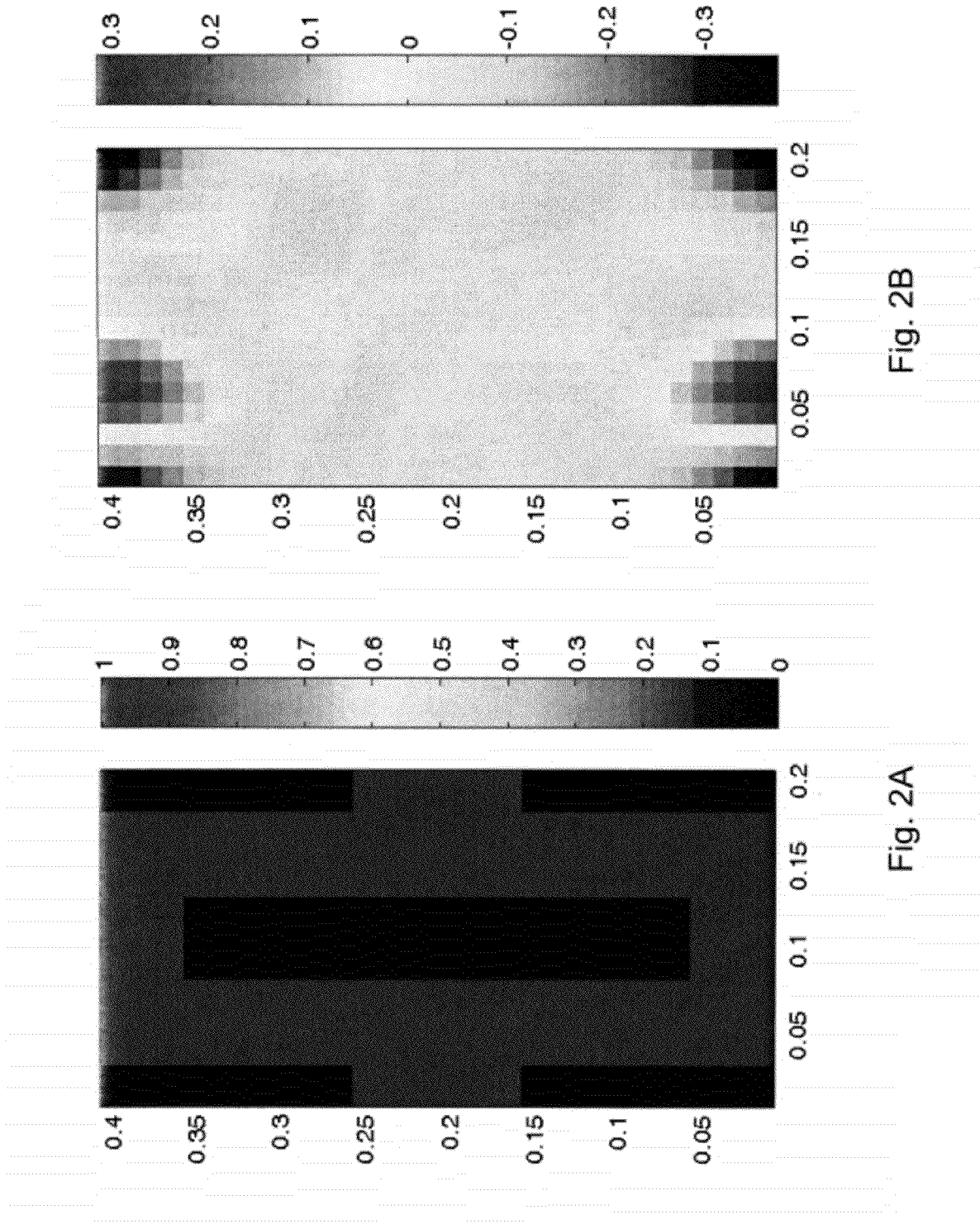

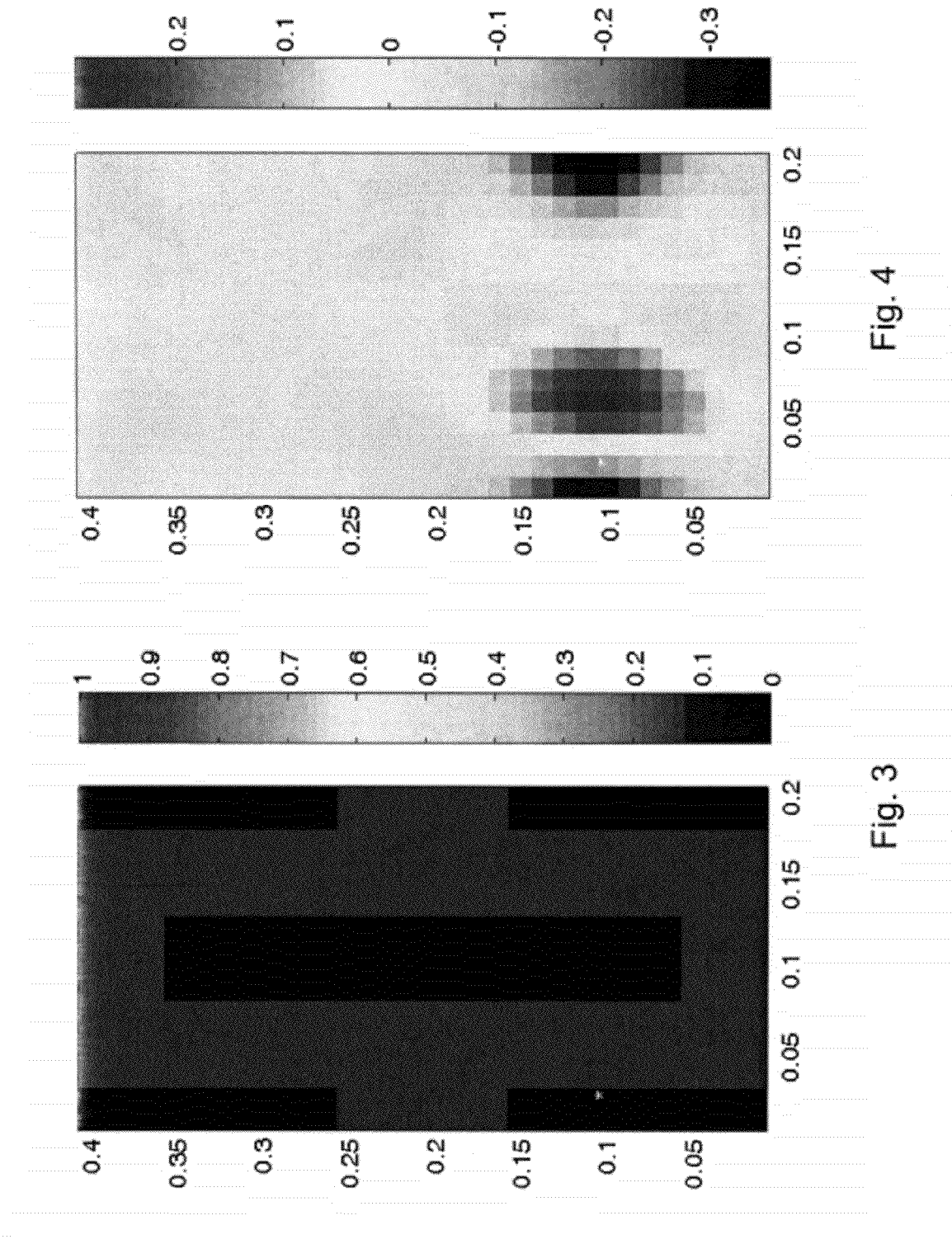

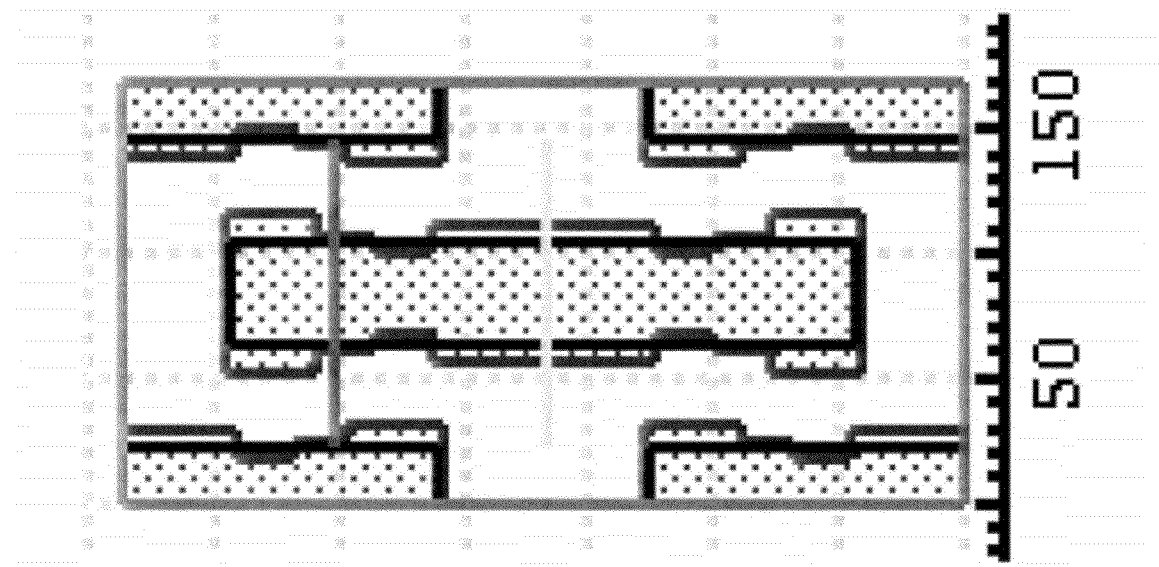

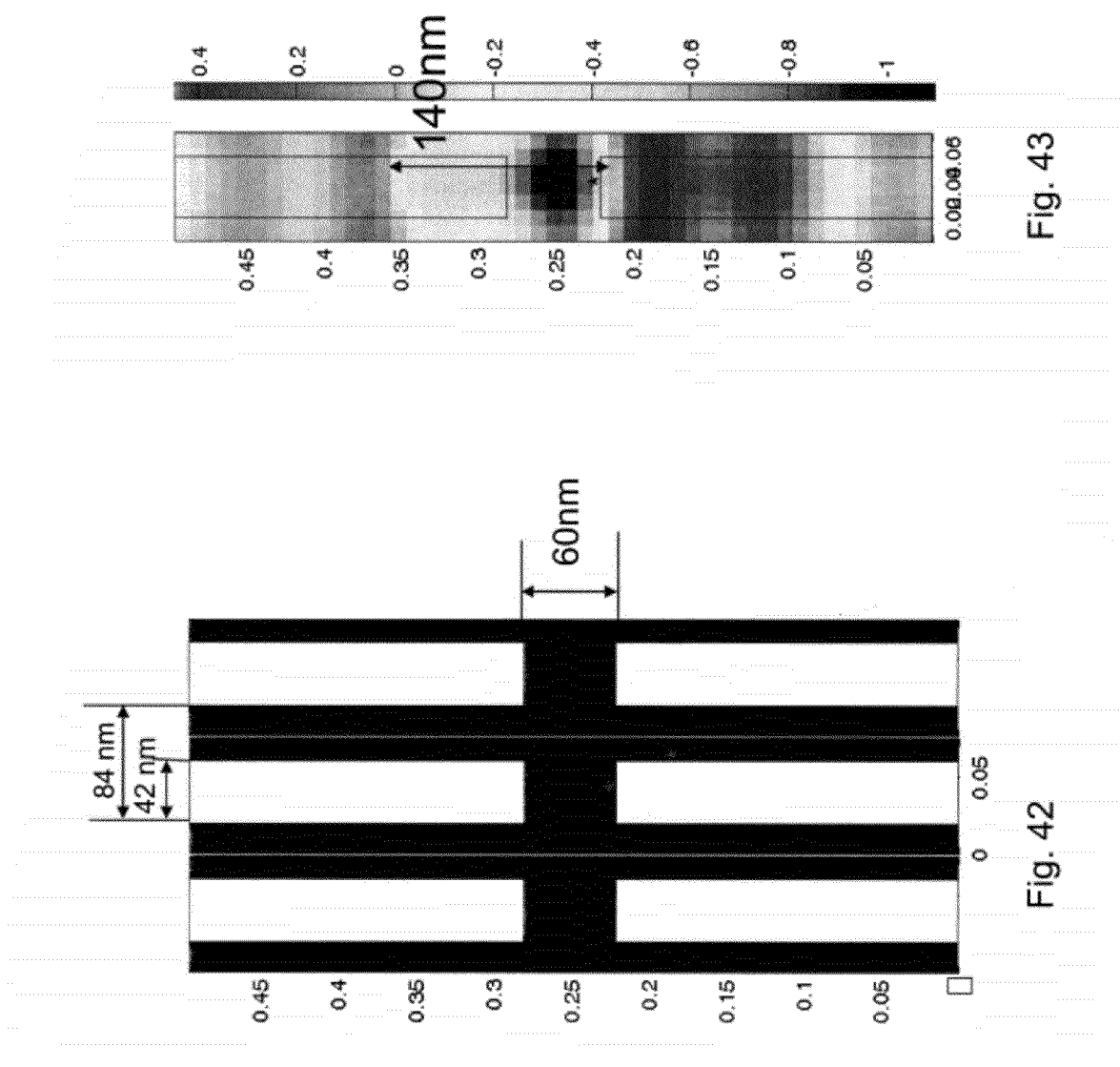

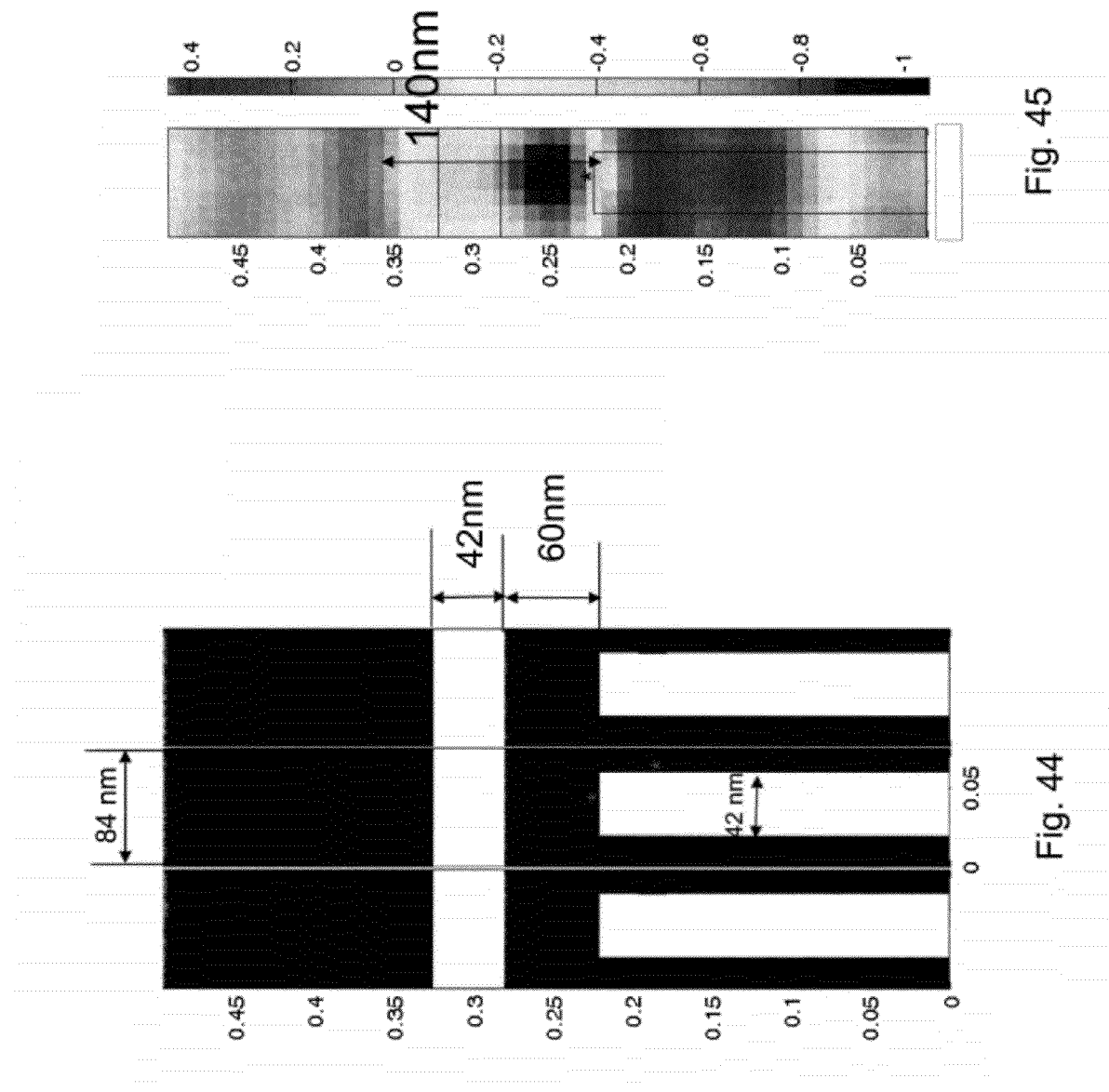

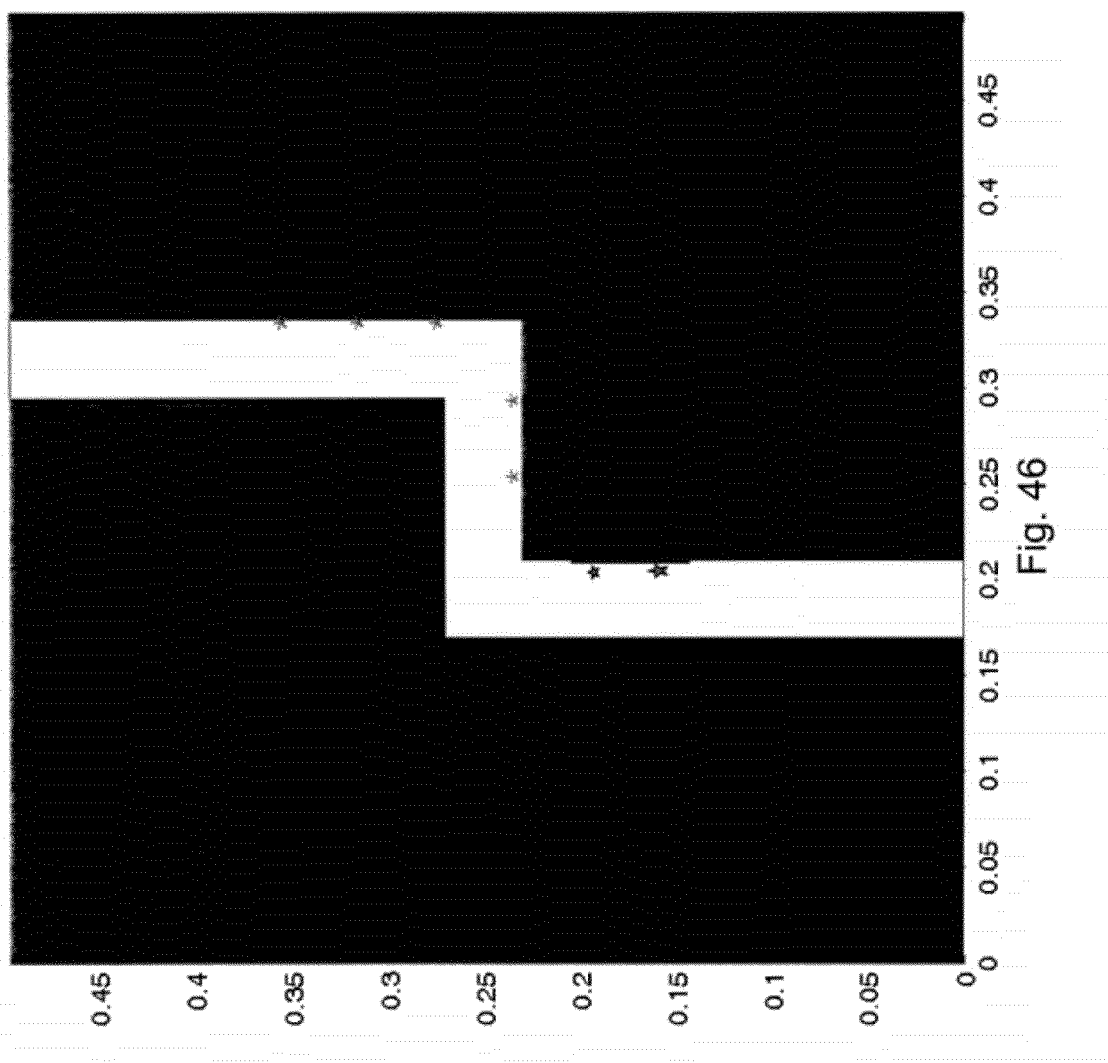

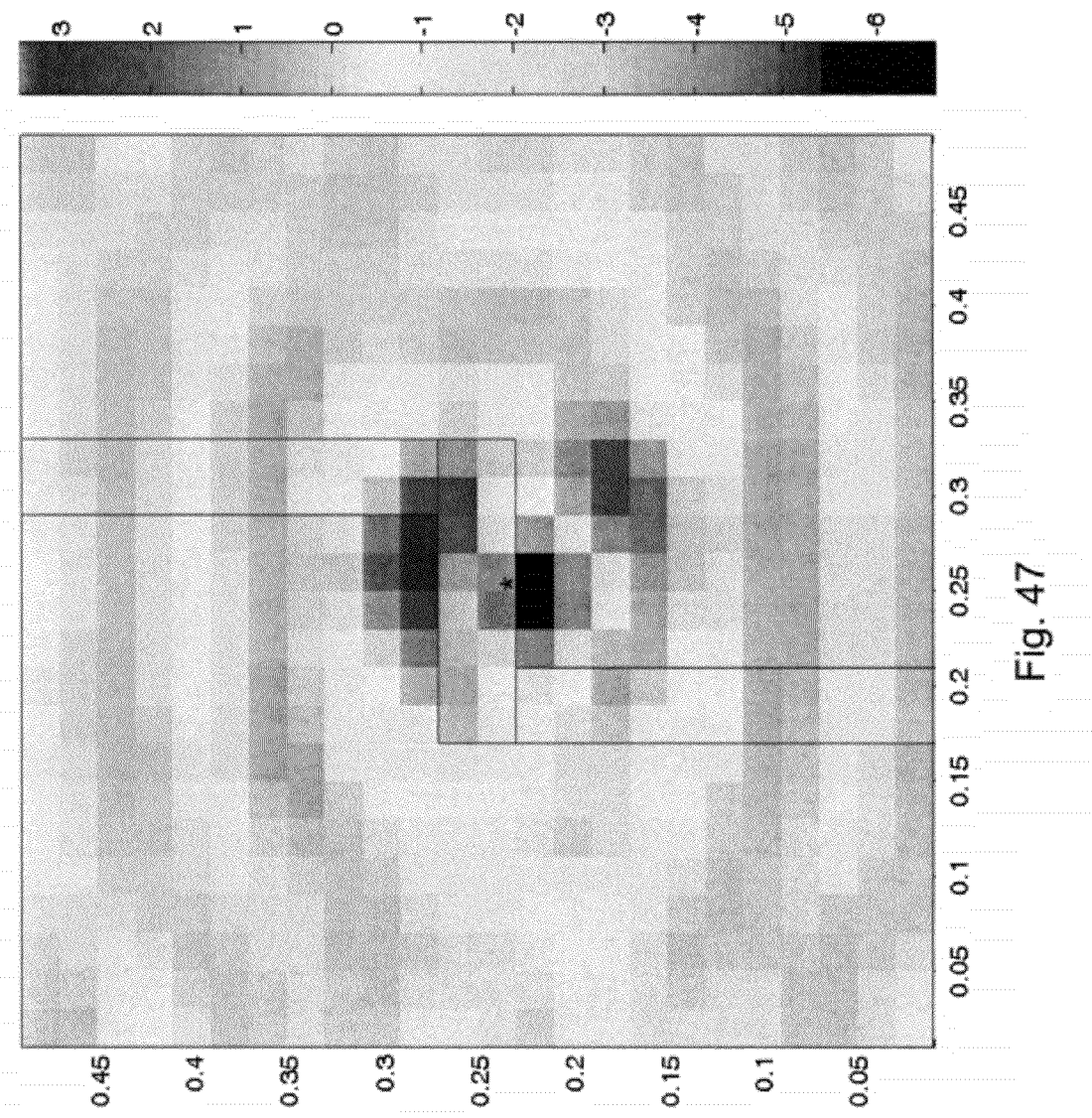

DETERMINING THE GRADIENT AND HESSIAN OF THE IMAGE LOG SLOPE FOR DESIGN RULE OPTIMIZATION FOR ACCELERATING SOURCE MASK OPTIMIZATION (SMO)

CROSS-REFERENCE TO RELATED APPLICATIONS

The present application claims the benefit of U.S. Provisional Patent Application No. 61/222,883, titled, "Determining the Gradient and Hessian of the ILS for Use in Source and Mask Optimization," filed on Jul. 2, 2009, which is incorporated herein by reference in its entirety.

FIELD OF THE INVENTION

The present invention relates generally to photolithography, and more particularly to a method for simultaneously optimizing a mask pattern and an illumination source.

BACKGROUND

A lithographic apparatus can be used, for example, in the manufacture of integrated circuits (ICs). In such a case, the photolithographic mask (also referred to interchangeably as a "reticle" or a "patterning device") may contain a circuit pattern corresponding to an individual layer of the IC, and this pattern can be imaged onto a target portion (e.g. comprising one or more dies) on a substrate (silicon wafer) that has been coated with a layer of radiation-sensitive material (resist). In general, a single wafer will contain a whole network of adjacent target portions that are successively irradiated via the projection system, one at a time. In one type of lithographic projection apparatus, each target portion is irradiated by exposing the entire mask pattern onto the target portion in one go; such an apparatus is commonly referred to as a wafer stepper. In an alternative apparatus, commonly referred to as a step-and-scan apparatus, each target portion is irradiated by progressively scanning the mask pattern under the projection beam in a given reference direction (the "scanning" direction) while synchronously scanning the substrate table parallel or anti-parallel to this direction. Since, in general, the projection system will have a magnification factor M (generally <1), the speed V at which the substrate table is scanned will be a factor M times that at which the mask table is scanned.

In a manufacturing process using a lithographic projection apparatus, a mask pattern is imaged onto a substrate that is at least partially covered by a layer of radiation-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc.

For the sake of simplicity, the projection system may hereinafter be referred to as the "lens" or 'optics"; however, this should be broadly interpreted as encompassing various types of projection systems, including refractive optics, reflective optics, and catadioptric systems, for example. The radiation system may also include components operating according to any of these design types for directing, shaping or controlling the projection beam of radiation, and such components may also be referred to below, collectively or singularly, as a "lens". Further, the lithographic apparatus may be of a type having two or more substrate tables (and/or two or more mask tables). In such "multiple stage" devices the additional tables may be used in parallel, or preparatory steps may be carried out on one or more tables while one or more other tables are being used for exposures. The photolithographic masks referred to above comprise geometric patterns corresponding to the circuit components to be integrated onto a silicon wafer. The patterns used to create such masks are generated utilizing CAD (computer-aided design) programs, this process is often being referred to as EDA (electronic design automation). Most CAD programs follow a set of predetermined design rules in order to create functional masks. These rules are set by processing and design limitations. For example, design rules define the space tolerance between circuit devices (such as gates, capacitors, etc.) or interconnect lines, so as to ensure that the circuit devices or lines do not interact with one another in an undesirable way. The design rule limitations are typically referred to as "critical dimensions" (CD). A critical dimension of a circuit can be defined as the smallest width of a line or hole or the smallest space between two lines or two holes. Thus, the CD determines the overall size and density of the designed circuit. In a typical lithography process flow, the mask and source are optimized for critical (and/or non-critical) areas of the mask design layout. Image Log Slope (ILS) of an intensity profile at certain evaluation points in the mask design layout (e.g., at an edge of a critical polygon in the mask layout) is often used as a parameter for optimizing the design rule. In certain cases, the design rule of the non-critical areas are re-optimized once the mask type and source is fixed for the critical area. A complete lithographic process window (PW) optimization process through conventional source-mask-optimization (SMO) thus becomes time-consuming and laborious.

Therefore, there is a need for a method that can improve lithographic imaging of the mask by optimizing the design rules, which in turn, results in simplifying and accelerating the overall SMO process.

SUMMARY

Embodiments of the present invention provide methods, computer program products and apparatuses for optimizing design rules for simplifying and speeding the SMO process. This is done by determining the gradient and Hessian of ILS at selected points on a mask design layout. One or more edges/fragments of a feature in the mask design layout are moved and/or positioned until a desired ILS is obtained. This is done primarily by design rule optimization while keeping the illumination source fixed, or changing the illumination source n in a controlled manner. The present invention precludes the need to continually fine-tuning and repeating an entire full-fledged source-mask optimization process.

According to an embodiment, there is provided a method for optimizing a mask pattern and an illumination source comprising providing illumination from the illumination source to a plurality of source points and a predetermined mask pattern; selecting evaluation points in an image plane of an image formed by the illumination provided to the predetermined mask pattern; determining an image log slope (ILS) of illumination at each evaluation point; determining the Hessian of the image log slope; and determining an optimal mask pattern and illumination source which maximizes the image log slope at the selected evaluation points.

According to a further embodiment, there is provided a computer readable medium containing instructions for a computer to cause optimizing a mask pattern and an illumination source comprising providing illumination from the illumination source to a plurality of source points and a predetermined mask pattern; selecting evaluation points in an image plane of an image formed by the illumination provided to the predetermined mask pattern; determining an image log slope (ILS) of illumination at each evaluation point; determining the Hessian of the image log slope; and determining an optimal mask pattern and illumination source which maximizes the image log slope at the selected evaluation points.

According to various embodiments, the Hessian of the ILS is determined with respect to mask transmission and source intensity; the Hessian of ILS is accurately determined without using approximate methods based on the gradient of the ILS; the Hessian of the ILS is determined with respect to an illumination pupil and a mask pixel; and sub-resolution assist feature (SRAF) is added to the mask pattern to improve the ILS.

The results of ILS evaluation can be used in design for manufacturing (DFM) to suggest changes in the design rules to improve imaging. For a fixed illumination, this information can help remove forbidden pitches and help select design rules for 1-D and 2-D patterns on a mask design layout.

These and other objects, features, and advantages of the invention will be apparent from the disclosure. It is to be understood that the summary, detailed description, and drawings are not restrictive of the scope of the invention.

BRIEF DESCRIPTION OF THE DRAWINGS

The accompanying drawings, which are incorporated in and form a part of the specification, together with the description serve to explain the principles of the invention. In the drawings:

FIG. 1A is an exemplary block diagram illustrating a typical lithographic projection system.

FIGS. 2-6 show the gradient of ILS with respect to t of a brickwall pattern;

FIG. 41 shows the mask after source and mask co-optimization and optical proximity correction;

FIG. 42 shows a trench pattern used for calculating the gradient of the ILS with respect to t;

FIG. 43 shows the gradient of the ILS with respect to t for the end of trench location;

FIG. 44 shows a trench pattern used for calculating the gradient of the ILS with respect to t;

FIG. 45 shows the gradient of the ILS with respect to t for the end of trench location;

FIG. 46 shows an isolated trench having a bend and used to calculate the gradient of the ILS with respect to t;

FIG. 47 shows the gradient of the ILS with respect to t in the middle of the bend of the isolated trench;

DETAILED DESCRIPTION

Figure 1B:
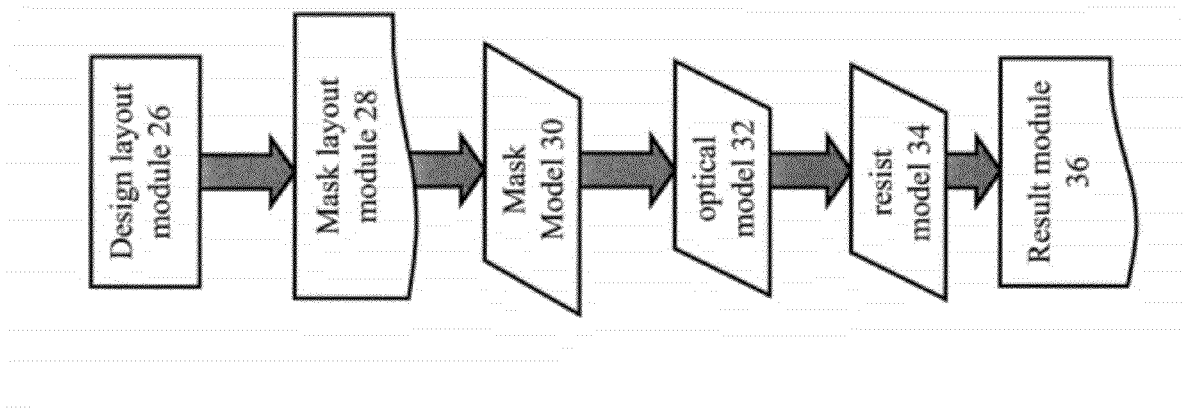
FIG. 1B is an exemplary block diagram illustrating the functional modules of a lithographic simulation model.

The present invention will now be described in detail with reference to the drawings, which are provided as illustrative examples of the invention so as to enable those skilled in the art to practice the invention. Notably, the figures and examples below are not meant to limit the scope of the present invention to a single embodiment, but other embodiments are possible by way of interchange of some or all of the described or illustrated elements. Moreover, where certain elements of the present invention can be partially or fully implemented using known components, only those portions of such known components that are necessary for an understanding of the present invention will be described, and detailed descriptions of other portions of such known components will be omitted so as not to obscure the invention. Embodiments described as being implemented in software should not be limited thereto, but can include embodiments implemented in hardware, or combinations of software and hardware, and vice-versa, as will be apparent to those skilled in the art, unless otherwise specified herein. In the present specification, an embodiment showing a singular component should not be considered limiting; rather, the invention is intended to encompass other embodiments including a plurality of the same component, and vice-versa, unless explicitly stated otherwise herein. Moreover, applicants do not intend for any term in the specification or claims to be ascribed an uncommon or special meaning unless explicitly set forth as such. Further, the present invention encompasses present and future known equivalents to the known components referred to herein by way of illustration.

General Environment in a Lithographic System for Implementing Example Embodiments of the Present Invention Prior to discussing the present invention, a brief discussion regarding the overall imaging process to be optimized is provided. FIG. 1A illustrates an exemplary lithographic projection system 10. The major components are a light source 12, which may be a deep-ultraviolet excimer laser source, illumination optics which define the partial coherence (denoted as sigma) and which may include specific source shaping optics 14, 16a and 16b; a mask or reticle 18; and projection optics 16c that produce an image of the reticle pattern onto the wafer plane 22. An adjustable filter or aperture 20 at the pupil plane may restrict the range of beam angles that impinge on the wafer plane 22, where the largest possible angle defines the numerical aperture of the projection optics NA=sin($\Theta_{max}$).

In a lithography system, these major system components are described by separate functional modules, for example, as illustrated in FIG. 1B. Referring to FIG. 1B, the functional modules include the design layout module 26, which defines the target design; the mask layout module 28, which defines how the mask is laid out using the target design to be utilized in the imaging process; the mask model module 30, which models the properties of the physical mask to be utilized during the simulation process; the optical model module 32, which defines the performance of the optical components of lithography system; and the resist model module 34, which defines the performance of the resist being utilized in the given process. As is known, the result of the simulation process produces, for example, predicted contours and CDs in the result module 36.

More specifically, it is noted that the properties of the illumination and projection optics are captured in the optical model module 32 that includes, but is not limited to, NA-sigma ($\sigma$) settings as well as any particular illumination source shape, where $\sigma$ (or sigma) is the inner and/or outer radial extent of the illuminator. The optical properties of the photo-resist layer coated on a substrate—i.e. refractive index, film thickness, propagation and polarization effects—may also be captured as part of the optical model module 32.

Finally, the resist model module 34 describes the effects of chemical processes which occur during resist exposure, PEB and development, in order to predict, for example, contours of resist features formed on the substrate wafer. The objective of the simulation is to accurately predict, for example, edge placements and critical dimensions (CDs), which can then be compared against the target design. The target design is generally defined as the pre-OPC mask layout, and will be provided in a standardized digital file format, such as GDSII or OASIS.

In general, the connection between the optical and the resist model is a simulated aerial image within the resist layer, which arises from the projection of light onto the substrate, refraction at the resist interface and multiple reflections in the resist film stack. The light intensity distribution (i.e. aerial image intensity) is turned into a latent "resist image" by absorption of photons, which is further modified by diffusion processes and various loading effects. Efficient simulation methods approximate the realistic 3-dimensional intensity distribution in the resist stack by a 2-dimensional aerial (and resist) image.

As discussed in the background section, this invention updates the design layout module 26 to produce an optimized mask layout module 28.

OVERVIEW OF THE PRESENT INVENTION

In a typical lithography design process, the lithographers know which areas in a mask are critically important to optimize illumination and/or other optical conditions. After optimizing illumination (usually by performing a source mask optimization (SMO) process), lithographers usually look for regions in the non-critical areas of the mask that have insufficient intensity for the photoresist to resolve. In other words, mask regions with insufficient Image Log Slope (ILS) are identified. At this point, lithographers have primarily two choices. The most common choice is adding the regions with insufficient ILS to redefine the critical area, and perform the source-mask optimization process again. In addition to performing multiple SMO processes, lithographers may perform a full-chip optimization process too. The alternative choice is recommending design rule changes for the mask design layout, as discussed in the present application. A design rule optimization process of the present invention will be described with reference to the accompanying drawings. The process is applicable for optimizing design rules for random target patterns or for periodic target patterns, such as, a memory cell.

At the center of the present invention is calculation of ILS and its first-order (gradient) and second-order (Hessian) partial derivatives. ILS can be computed at evaluation points, which may be at an edge of a pattern feature or inside a pattern feature. Evaluation points may include fragmentation points, which are usually at the edge of fragmented polygons into which a pattern feature is divided. Note that a fragmentation point may be at the edge or in the middle of a polygon.

After specifying the required inputs, the design data, usually in GDS II format, may be loaded into the model based Optical Proximity Correction (OPC) software. The model based OPC software then breaks the design data into a number of fragmented edges. The OPC software then assigns a fragmentation point to each edge fragment. The fragmentation of an edge depends on the surroundings of the geometry. For example, if the edge is an end of line, more fragmentation points are assigned at the end of line. Or if there is another piece of geometry close to a critical feature, more fragmentation points are assigned to the critical feature and to the nearby geometry. The assignment of the fragmentation points is a very complex process that depends on the geometry and the optical model. At each fragmentation point, the optical model and process model are applied, and the expected wafer position is measured at each fragmentation point. Typically the expected wafer position is the critical dimension, CD, of the wafer feature. If the CD does not match the design geometry, the fragmented edge is biased such that the CD moves to match the design geometry. The matching between the CD and the design is done through an iterative process.

In mathematics, the Hessian matrix (or simply the Hessian) is the square matrix of second-order partial derivatives of a function; that is, it describes the local curvature of a function of many variables. The function in the context of the present invention is the ILS. The ILS is a function of two variables, the source points (Js) and the mask electric field transmission, t. Therefore, the Hessian is calculated by taking the second-order partial derivatives of the ILS function. The Hessian second order partial derivatives are: $\partial^2 ILS/\partial J_{si}$, $\partial J_{sj}$, $\partial^2 ILS/\partial t_i \partial t_j$, and $\partial^2 ILS/\partial J_s \partial t$. These partial derivatives indicate the change in ILS as two illumination points change ($J_{si}$, $J_{sj}$), the change in ILS as two transmission points on the mask change ($t_i$, $t_j$), and the change in ILS as one illumination point and one transmission point on the mask change ($J_s$, t). Examples of the various types of calculated Hessian terms plotted with respect to the variables (i.e., source points or transmission points on the mask) are shown in FIGS. 10-18, 25-30, and 34-39. An important Hessian element is the $\partial^2 ILS/\partial J_s \partial t$ second order partial derivative. This partial derivative indicates the change in the source and mask transmission to optimize the design. Since the mask and source have non-linear relationship on the wafer image ILS, this mask-source partial derivative is important to model this non-linear relationship. The Hessian is traditionally calculated using a finite-difference approach. Calculating the Hessian through a finite-difference approach is slow and is an approximate method. However, the Hessian (second derivative) of image log slope (ILS) can be calculate only from the gradient of the ILS. This is extremely fast and accurate. Thus one does not have to sacrifice speed for accuracy when calculating the Hessian. In addition to improving the speed of calculation of the Hessian, the gradient of the ILS with respect to mask transmission can be used in design for manufacturing (DFM) to suggest changes in the design rules to improve imaging. For a fixed illumination, this information can help remove forbidden pitches and help select design rules for 1-D and 2-D patterns on a mask design layout. Persons skilled the art will appreciate that the term "fixed illumination" or "fixed source" characterizes a set of predefined optical conditions in the lithography apparatus. Optical conditions include optical settings such as illumination shape, projection optics numerical aperture (NA) etc. Optical conditions may also comprise other optical conditions present in the lithographic apparatus, such as, intensity fluctuations, divergence of the laser beam, illumination aberration, apodization, chromatic aberrations, and even thin-film properties of the wafer.

With respect to mask transmission and source intensity, the Hessian of the ILS can be quickly and accurately calculated without the need to use approximate methods from the gradient of the ILS. When optimizing the design rule, there are two types of scenarios: both the source and mask are allowed to change, the source is fixed and only the mask is allowed to change. When both the source and mask are allowed to change all three Hessian elements are needed, $\partial^2 ILS/\partial J_{si}\partial J_{sj}$, $\partial^2 ILS/\partial t_i \partial t_j$, and $\partial^2 ILS/\partial J_s \partial t$. When the source is fixed and only the mask is allowed to change, only one Hessian element is needed, $\partial^2 ILS/\partial t_i \partial t_j$. Several examples for modifying a design based on the ILS with respect to mask transmission are shown. These examples show how the design rules can be modified for a fixed source.

The gradient and Hessian of the ILS can be derived with respect to the illumination pupil, $J_s$, and the mask pixel, t, where t is the mask transmission in the spatial domain at the selected pixel's coordinate point. It is shown that the gradient and Hessian of the ILS is a function of six components. These components are the electric field, e, at the wafer plane and the derivatives of the electric field. The six components are e, $\partial e/\partial x$, $\partial e/\partial y$, $\partial e/\partial t$, $\partial^2 e/\partial x \partial t$, and $\partial^2 e/\partial u \partial t$, where these six electric field components are the contributions due to each source point. Since the electric field needs to be calculated for the contribution for each source pixel, the current source-mask optimizer (SMO) methodology of calculating the transmission cross coefficient (TCC) for a point source illuminator is the best methodology for calculating these electric field contributions. The next section elaborates the mathematical framework of the present invention.

Figure 50:
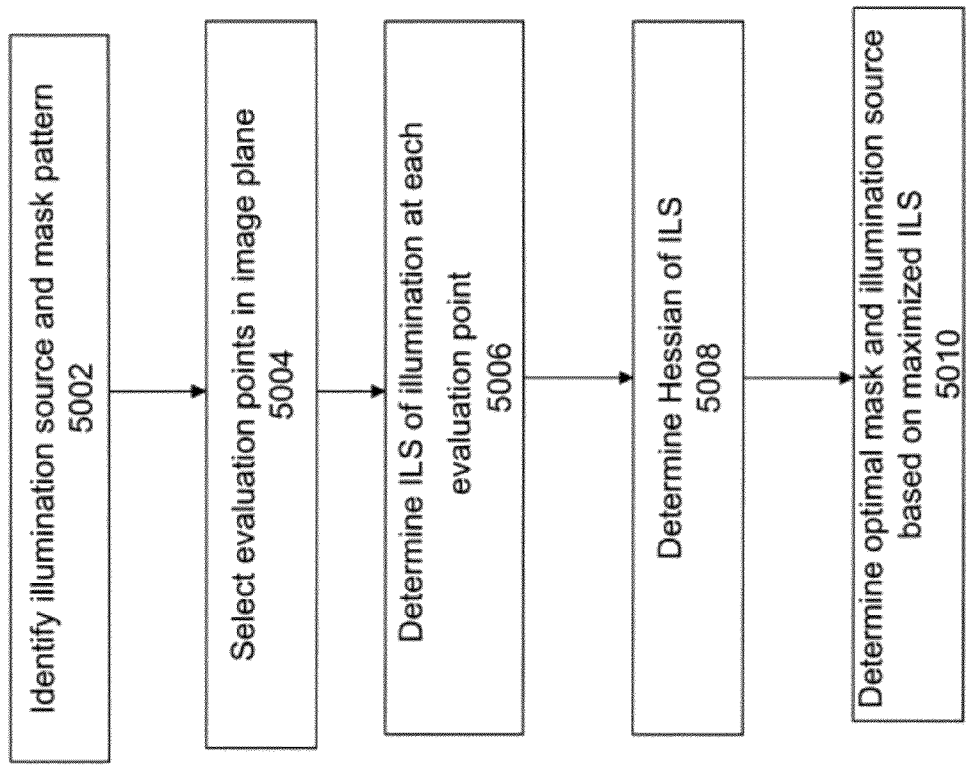
FIG. 50 is a flowchart illustrating an example methodology according to aspects of the invention.

As shown in the flowchart of FIG. 50, the present invention defines evaluation points in an image plane, determines ILS of illumination at each evaluation point, determines Hessian of ILS from the gradient of ILS in an accurate manner, and determines optimal mask and illumination source based on maximization of ILS. Maximization of ILS is achieved by iteratively updating the design rules. For example, edges of a pattern are repositioned, or distance between two pattern edges are increased/decreased until a satisfactory ILS is obtained.

Mathematical Framework of the Present Invention 1.1 Definition of the Intensity, I, from the Electric Field, e, or Pseudo-Electric Field, f.

Intensity expressed using Abbe Formulation:

$$I(x,y) = \int d\alpha_s d\beta_s J_s(\alpha_s, \beta_s) e(x,y;\alpha_s,\beta_s) e^*(x,y;\alpha_s,\beta_s)$$

where $(\alpha_s, \beta_s)$ is the coordinate in the source and (x,y) is a coordinate on the wafer, $e(x,y) = t(x',y') * k(x,y; x',y')$ for a given source point $(\alpha_s, \beta_s)$, (x',y') is the coordinate on the mask. Kernel is given by k. In addition, $e^*(x,y) = t(x',y') * k^*(x,y; x',y')$ (t is constrained to be real) where $$t(x', y') = \sum_i t_i(x', y')$$

($t_i$ is the electric field transmission of a pixel on the mask).

Intensity expressed using SOCs Formulation:

$$I(x, y) = \sum_k \lambda_k f_k(x, y) f_k^*(x, y)$$

where $f(x,y) = t(x',y') * \phi_i(x,y; x',y')$ for a given kernel k, where $\phi$ is inverse Fourier transform of the kernel.

The derivative of I with respect to x and y are also needed to calculate the ILS. These derivatives are defined below. It is important to note that these derivatives can be calculated with the Fourier transform property:

$$FT\left\{\frac{\partial}{\partial x} e(x)\right\} = ik_x E(k_x).$$

In this document with the exception of the intensity, I, the spatial domain components are represented by lower case and the frequency domain components are represented by upper case.

$$\frac{\partial I}{\partial x} = \int d\alpha_s d\beta_s J_s(\alpha_s, \beta_s)\left(\frac{\partial e}{\partial x} e^* + e \frac{\partial e^*}{\partial x}\right)$$

$$\frac{\partial I}{\partial y} = \int d\alpha_s d\beta_s J_s(\alpha_s, \beta_s)\left(\frac{\partial e}{\partial y} e^* + e \frac{\partial e^*}{\partial y}\right)$$

It is important note that I, $\partial I/\partial x$ and $\partial I/\partial y$ are scalar components.

1.2 ILS Definition

From the intensity I and the normal derivatives of I with respect to x and y, the ILS is calculated. The intensity and derivative calculations were shown above.

$$ILS = \hat{n} g \nabla \ln I$$

where $\hat{n}$ is the normal from the geometry at the ILS evaluation point.

$$ILS = \frac{1}{I}\left[\left(\frac{\partial I}{\partial x}\right)^2 + \left(\frac{\partial I}{\partial y}\right)^2\right]^{1/2}$$

$$\frac{\partial I}{\partial x} = \cos(n)\hat{x} \cdot \nabla I$$

$$\frac{\partial I}{\partial y} = \cos(n)\hat{y} \cdot \nabla I$$

1.3 ILS Gradient with Respect to $J_s$ and $t_i$

The gradient of the ILS with respect to one source pixel, $J_s$, is defined below. In linear algebra, this gradient term is a row vector.

$$\frac{\partial ILS}{\partial J_s} = -\frac{1}{I^2}\frac{\partial I}{\partial J_s}\left[\left(\frac{\partial I}{\partial x}\right)^2 + \left(\frac{\partial I}{\partial y}\right)^2\right]^{1/2} +$$
$$\frac{1}{I}\left[\left(\frac{\partial I}{\partial x}\right)^2 + \left(\frac{\partial I}{\partial y}\right)^2\right]^{-1/2}\left(\frac{\partial I}{\partial x}\frac{\partial^2 I}{\partial x \partial J_s} + \frac{\partial I}{\partial y}\frac{\partial^2 I}{\partial y \partial J_s}\right)$$

The intensity terms, I, ∂I/∂x, and ∂I/∂y, were defined above, and the derivative terms with respect to $J_s$, ∂I/∂$J_s$, ∂²I/∂x∂$J_s$, and ∂²I/∂y∂$J_s$, are defined below.

The gradient of the ILS with respect to one mask pixel, t, is defined below. In linear algebra, this gradient term is a row vector.

$$\frac{\partial ILS}{\partial t} = -\frac{1}{I^2}\frac{\partial I}{\partial t}\left[\left(\frac{\partial I}{\partial x}\right)^2 + \left(\frac{\partial I}{\partial y}\right)^2\right]^{1/2} +$$
$$\frac{1}{I}\left[\left(\frac{\partial I}{\partial x}\right)^2 + \left(\frac{\partial I}{\partial y}\right)^2\right]^{-1/2}\left(\frac{\partial I}{\partial x}\frac{\partial^2 I}{\partial x \partial t} + \frac{\partial I}{\partial y}\frac{\partial^2 I}{\partial y \partial t}\right)$$

The intensity terms, I, ∂I/∂x, and ∂I/∂y, were defined in section above, and the derivative terms with respect to t, ∂I/∂t, ∂²I/∂x∂t, and ∂²I/∂y∂t, are defined below.

1.4 ILS Hessian with Respect to $J_s$ and $t_i$

The Hessian of the ILS with respect to two source pixels, $J_{si}$ and $J_{sj}$ is defined below. Because the source is defined to be spatially incoherent, the Hessian of the ILS with respect to $J_{si}$ and $J_{sj}$ is only a function of the gradient terms of I. These gradient terms are ∂I/∂$J_s$, ∂²I/∂x∂$J_s$, and ∂²I/∂y∂$J_s$. These gradient terms can easily be calculated from the electric field terms e, ∂e/∂x, and ∂e/∂y.

$$\frac{\partial^2 ILS}{\partial J_{si}\partial J_{sj}} = \frac{2}{I^3}\frac{\partial I}{\partial J_{si}}\frac{\partial I}{\partial J_{sj}}\left[\left(\frac{\partial I}{\partial x}\right)^2 + \left(\frac{\partial I}{\partial y}\right)^2\right]^{1/2}$$
$$-\frac{1}{I^2}\frac{\partial^2 I}{\partial J_{si}\partial J_{sj}}\left[\left(\frac{\partial I}{\partial x}\right)^2 + \left(\frac{\partial I}{\partial y}\right)^2\right]^{1/2}$$
$$-\frac{1}{I^2}\frac{\partial I}{\partial J_{si}}\left[\left(\frac{\partial I}{\partial x}\right)^2 + \left(\frac{\partial I}{\partial y}\right)^2\right]^{-1/2}\left(\frac{\partial I}{\partial x}\frac{\partial^2 I}{\partial x\partial J_{sj}} + \frac{\partial I}{\partial y}\frac{\partial^2 I}{\partial y\partial J_{sj}}\right)$$
$$-\frac{1}{I^2}\frac{\partial I}{\partial J_{sj}}\left[\left(\frac{\partial I}{\partial x}\right)^2 + \left(\frac{\partial I}{\partial y}\right)^2\right]^{-1/2}\left(\frac{\partial I}{\partial x}\frac{\partial^2 I}{\partial x\partial J_{si}} + \frac{\partial I}{\partial y}\frac{\partial^2 I}{\partial y\partial J_{si}}\right)$$
$$-\frac{1}{I}\left[\left(\frac{\partial I}{\partial x}\right)^2 + \left(\frac{\partial I}{\partial y}\right)^2\right]^{-3/2}\left(\frac{\partial I}{\partial x}\frac{\partial^2 I}{\partial x\partial J_{si}} + \right.$$
$$\left.\frac{\partial I}{\partial y}\frac{\partial^2 I}{\partial y\partial J_{si}}\right)\left(\frac{\partial I}{\partial x}\frac{\partial^2 I}{\partial x\partial J_{sj}} + \frac{\partial I}{\partial y}\frac{\partial^2 I}{\partial y\partial J_{sj}}\right)$$
$$+\frac{1}{I}\left[\left(\frac{\partial I}{\partial x}\right)^2 + \left(\frac{\partial I}{\partial y}\right)^2\right]^{-1/2}\left(\frac{\partial^2 I}{\partial x\partial J_{sj}}\frac{\partial^2 I}{\partial x\partial J_{si}} + \frac{\partial^2 I}{\partial y\partial J_{sj}}\frac{\partial^2 I}{\partial y\partial J_{si}} + \right.$$
$$\left.\frac{\partial I}{\partial x}\frac{\partial^3 I}{\partial x\partial J_{si}\partial J_{sj}} + \frac{\partial I}{\partial y}\frac{\partial^3 I}{\partial y\partial J_{si}\partial J_{sj}}\right)$$

because $$\frac{\partial^2 I}{\partial J_{si}\partial J_{sj}}, \frac{\partial^3 I}{\partial x\partial J_{si}\partial J_{sj}}, \text{ and}$$

$$\frac{\partial^3 I}{\partial y\partial J_{si}\partial J_{sj}} = 0, \frac{\partial^2 ILS}{\partial J_{si}\partial J_{sj}} \text{ reduces to:}$$

$$\frac{\partial^2 ILS}{\partial J_{si}\partial J_{sj}} = \frac{2}{I^3}\frac{\partial I}{\partial J_{si}}\frac{\partial I}{\partial J_{sj}}\left[\left(\frac{\partial I}{\partial x}\right)^2 + \left(\frac{\partial I}{\partial y}\right)^2\right]^{1/2}$$

-continued $$-\frac{1}{I^2}\frac{\partial I}{\partial J_{si}}\left[\left(\frac{\partial I}{\partial x}\right)^2 + \left(\frac{\partial I}{\partial y}\right)^2\right]^{-1/2}\left(\frac{\partial I}{\partial x}\frac{\partial^2 I}{\partial x\partial J_{sj}} + \frac{\partial I}{\partial y}\frac{\partial^2 I}{\partial y\partial J_{sj}}\right)$$
$$-\frac{1}{I^2}\frac{\partial I}{\partial J_{sj}}\left[\left(\frac{\partial I}{\partial x}\right)^2 + \left(\frac{\partial I}{\partial y}\right)^2\right]^{-1/2}\left(\frac{\partial I}{\partial x}\frac{\partial^2 I}{\partial x\partial J_{si}} + \frac{\partial I}{\partial y}\frac{\partial^2 I}{\partial y\partial J_{si}}\right)$$
$$-\frac{1}{I}\left[\left(\frac{\partial I}{\partial x}\right)^2 + \left(\frac{\partial I}{\partial y}\right)^2\right]^{-3/2}\left(\frac{\partial I}{\partial x}\frac{\partial^2 I}{\partial x\partial J_{si}} + \right.$$
$$\left.\frac{\partial I}{\partial y}\frac{\partial^2 I}{\partial y\partial J_{si}}\right)\left(\frac{\partial I}{\partial x}\frac{\partial^2 I}{\partial x\partial J_{sj}} + \frac{\partial I}{\partial y}\frac{\partial^2 I}{\partial y\partial J_{sj}}\right)$$
$$+\frac{1}{I}\left[\left(\frac{\partial I}{\partial x}\right)^2 + \left(\frac{\partial I}{\partial y}\right)^2\right]^{-1/2}\left(\frac{\partial^2 I}{\partial x\partial J_{sj}}\frac{\partial^2 I}{\partial x\partial J_{si}} + \frac{\partial^2 I}{\partial y\partial J_{sj}}\frac{\partial^2 I}{\partial y\partial J_{si}}\right)$$

Because Hessian terms of I with respect to $J_s$ are all zero, the Hessian of the ILS with respect to $J_s$ is only a function of the gradient terms of I with respect to $J_s$. Since the gradient terms are defined to be row vectors, the Hessian matrix, ∂²ILS/∂$J_{si}$∂$J_{sj}$, can be calculated with liner algebra as shown below.

$$\frac{\partial^2 ILS}{\partial J_{si}\partial J_{sj}} = \frac{2}{I^3}\left[\left(\frac{\partial I}{\partial x}\right)^2 + \left(\frac{\partial I}{\partial y}\right)^2\right]^{1/2}\left(\frac{\partial I}{\partial J_s}\right)\left(\frac{\partial I}{\partial J_s}\right)^T$$
$$-\frac{1}{I^2}\left[\left(\frac{\partial I}{\partial x}\right)^2 + \left(\frac{\partial I}{\partial y}\right)^2\right]^{-1/2}\left(\frac{\partial I}{\partial J_s}\right)\left(\frac{\partial I}{\partial x}\frac{\partial^2 I}{\partial x\partial J_s} + \frac{\partial I}{\partial y}\frac{\partial^2 I}{\partial y\partial J_s}\right)^T$$
$$-\frac{1}{I^2}\left[\left(\frac{\partial I}{\partial x}\right)^2 + \left(\frac{\partial I}{\partial y}\right)^2\right]^{-1/2}\left(\frac{\partial I}{\partial x}\frac{\partial^2 I}{\partial x\partial J_s} + \frac{\partial I}{\partial y}\frac{\partial^2 I}{\partial y\partial J_s}\right)\left(\frac{\partial I}{\partial J_s}\right)^T$$
$$-\frac{1}{I}\left[\left(\frac{\partial I}{\partial x}\right)^2 + \left(\frac{\partial I}{\partial y}\right)^2\right]^{-3/2}\left(\frac{\partial I}{\partial x}\frac{\partial^2 I}{\partial x\partial J_{s1}} + \right.$$
$$\left.\frac{\partial I}{\partial y}\frac{\partial^2 I}{\partial y\partial J_{s1}}\right)\left(\frac{\partial I}{\partial x}\frac{\partial^2 I}{\partial x\partial J_{s2}} + \frac{\partial I}{\partial y}\frac{\partial^2 I}{\partial y\partial J_{s2}}\right)^T$$
$$+\frac{1}{I}\left[\left(\frac{\partial I}{\partial x}\right)^2 + \left(\frac{\partial I}{\partial y}\right)^2\right]^{-1/2}\left[\left(\frac{\partial^2 I}{\partial x\partial J_s}\right)\left(\frac{\partial^2 I}{\partial x\partial J_s}\right)^T + \left(\frac{\partial^2 I}{\partial y\partial J_s}\right)\left(\frac{\partial^2 I}{\partial y\partial J_s}\right)^T\right]$$

The Hessian of the ILS with respect to two mask pixels, $t_i$ and $t_j$ is defined below. The Hessian terms, ∂²I/∂$t_i$∂$t_j$, ∂³I/∂x∂$t_i$∂$t_j$, and ∂³I/∂y∂$t_i$∂$t_j$, will be shown to be a function of the gradient terms of the electric field. These electric field terms are: ∂e/∂$t_i$, ∂e/∂$t_j$, ∂²e/∂x∂$t_i$, and ∂²e/∂y∂$t_j$. The electric field term ∂²e/∂$t_i$∂$t_j$ is zero because the electric field, e, a linear superposition of the mask pixel points $t_i$ and $t_j$, i.e., $e(t_i, t_j) = e(t_i) + e(t_j) = t_i * k + t_j * k$ $$\frac{\partial^2 ILS}{\partial t_i\partial t_j} = \frac{2}{I^3}\frac{\partial I}{\partial t_i}\frac{\partial I}{\partial t_j}\left[\left(\frac{\partial I}{\partial x}\right)^2 + \left(\frac{\partial I}{\partial y}\right)^2\right]^{1/2}$$
$$-\frac{1}{I^2}\frac{\partial^2 I}{\partial t_i\partial t_j}\left[\left(\frac{\partial I}{\partial x}\right)^2 + \left(\frac{\partial I}{\partial y}\right)^2\right]^{1/2}$$
$$-\frac{1}{I^2}\frac{\partial I}{\partial t_i}\left[\left(\frac{\partial I}{\partial x}\right)^2 + \left(\frac{\partial I}{\partial y}\right)^2\right]^{-1/2}\left(\frac{\partial I}{\partial x}\frac{\partial^2 I}{\partial x\partial t_j} + \frac{\partial I}{\partial y}\frac{\partial^2 I}{\partial y\partial t_j}\right)$$
$$-\frac{1}{I^2}\frac{\partial I}{\partial t_j}\left[\left(\frac{\partial I}{\partial x}\right)^2 + \left(\frac{\partial I}{\partial y}\right)^2\right]^{-1/2}\left(\frac{\partial I}{\partial x}\frac{\partial^2 I}{\partial x\partial t_i} + \frac{\partial I}{\partial y}\frac{\partial^2 I}{\partial y\partial t_i}\right)$$
$$-\frac{1}{I}\left[\left(\frac{\partial I}{\partial x}\right)^2 + \left(\frac{\partial I}{\partial y}\right)^2\right]^{-3/2}\left(\frac{\partial I}{\partial x}\frac{\partial^2 I}{\partial x\partial t_i} + \frac{\partial I}{\partial y}\frac{\partial^2 I}{\partial y\partial t_i}\right)\left(\frac{\partial I}{\partial x}\frac{\partial^2 I}{\partial x\partial t_j} + \frac{\partial I}{\partial y}\frac{\partial^2 I}{\partial y\partial t_j}\right)$$

-continued $$+ \frac{1}{I}\left[\left(\frac{\partial I}{\partial x}\right)^2 + \left(\frac{\partial I}{\partial y}\right)^2\right]^{-1/2}$$

$$\left(\frac{\partial^2 I}{\partial x \partial t_i}\frac{\partial^2 I}{\partial x \partial t_j} + \frac{\partial^2 I}{\partial y \partial t_i}\frac{\partial^2 I}{\partial y \partial t_j} + \frac{\partial I}{\partial x}\frac{\partial^3 I}{\partial x \partial t_i \partial t_j} + \frac{\partial I}{\partial y}\frac{\partial^3 I}{\partial y \partial t_i \partial t_j}\right)$$

Since the gradient terms are defined to be row vectors, the Hessian matrix, $\partial^2 ILS/\partial t_i \partial t_j$, can be calculated with liner algebra as shown below.

$$\frac{\partial^2 ILS}{\partial t_i \partial t_j} = \frac{2}{I^3}\left[\left(\frac{\partial I}{\partial x}\right)^2 + \left(\frac{\partial I}{\partial y}\right)^2\right]^{1/2}\left(\frac{\partial I}{\partial t}\right)\left(\frac{\partial I}{\partial t}\right)^T$$

$$- \frac{1}{I^2}\left[\left(\frac{\partial I}{\partial x}\right)^2 + \left(\frac{\partial I}{\partial y}\right)^2\right]^{1/2}\frac{\partial^2 I}{\partial t_i \partial t_j}$$

$$- \frac{1}{I^2}\left[\left(\frac{\partial I}{\partial x}\right)^2 + \left(\frac{\partial I}{\partial y}\right)^2\right]^{-1/2}\left(\frac{\partial I}{\partial t}\right)\left(\frac{\partial I}{\partial x}\frac{\partial^2 I}{\partial x \partial t} + \frac{\partial I}{\partial y}\frac{\partial^2 I}{\partial y \partial t}\right)^T$$

$$- \frac{1}{I^2}\left[\left(\frac{\partial I}{\partial x}\right)^2 + \left(\frac{\partial I}{\partial y}\right)^2\right]^{-1/2}\left(\frac{\partial I}{\partial x}\frac{\partial^2 I}{\partial x \partial t} + \frac{\partial I}{\partial y}\frac{\partial^2 I}{\partial y \partial t}\right)\left(\frac{\partial I}{\partial t}\right)^T$$

$$- \frac{1}{I}\left[\left(\frac{\partial I}{\partial x}\right)^2 + \left(\frac{\partial I}{\partial y}\right)^2\right]^{-3/2}\left(\frac{\partial I}{\partial x}\frac{\partial^2 I}{\partial x \partial t} + \frac{\partial I}{\partial y}\frac{\partial^2 I}{\partial y \partial t}\right)\left(\frac{\partial I}{\partial x}\frac{\partial^2 I}{\partial x \partial t} + \frac{\partial I}{\partial y}\frac{\partial^2 I}{\partial y \partial t}\right)^T$$

$$+ \frac{1}{I}\left[\left(\frac{\partial I}{\partial x}\right)^2 + \left(\frac{\partial I}{\partial y}\right)^2\right]^{-1/2}\left[\left(\frac{\partial^2 I}{\partial x \partial t}\right)\left(\frac{\partial^2 I}{\partial x \partial t}\right)^T + \right.$$

$$\left.\left(\frac{\partial^2 I}{\partial y \partial t}\right)\left(\frac{\partial^2 I}{\partial y \partial t}\right)^T + \frac{\partial I}{\partial x}\frac{\partial^3 I}{\partial x \partial t_i \partial t_j} + \frac{\partial I}{\partial y}\frac{\partial^3 I}{\partial y \partial t_i \partial t_j}\right]$$

The Hessian of the ILS with respect to one source pixel, $J_s$, and one mask pixels, $t_i$, is defined below. The terms, $\partial^2 I/\partial t_i \partial J_s$, $\partial^3 I/\partial x \partial t_i \partial J_s$, and $\partial^3 i/\partial y \partial t_i \partial J_s$, will be shown to be a function of the gradient terms of the electric field. These electric field terms are: $\partial e/\partial t_i$, $\partial^2 e/\partial x \partial t_i$, and $\partial^2 e/\partial y \partial t_i$.

$$\frac{\partial^2 ILS}{\partial t \partial J_s} = \frac{2}{I^3}\frac{\partial I}{\partial t}\frac{\partial I}{\partial J_s}\left[\left(\frac{\partial I}{\partial x}\right)^2 + \left(\frac{\partial I}{\partial y}\right)^2\right]^{1/2}$$

$$- \frac{1}{I^2}\frac{\partial^2 I}{\partial t \partial J_s}\left[\left(\frac{\partial I}{\partial x}\right)^2 + \left(\frac{\partial I}{\partial y}\right)^2\right]^{1/2}$$

$$- \frac{1}{I^2}\frac{\partial I}{\partial t}\left[\left(\frac{\partial I}{\partial x}\right)^2 + \left(\frac{\partial I}{\partial y}\right)^2\right]^{-1/2}\left(\frac{\partial I}{\partial x}\frac{\partial^2 I}{\partial x \partial J_s} + \frac{\partial I}{\partial y}\frac{\partial^2 I}{\partial y \partial J_s}\right)$$

$$- \frac{1}{I^2}\frac{\partial I}{\partial J_s}\left[\left(\frac{\partial I}{\partial x}\right)^2 + \left(\frac{\partial I}{\partial y}\right)^2\right]^{-1/2}\left(\frac{\partial I}{\partial x}\frac{\partial^2 I}{\partial x \partial t} + \frac{\partial I}{\partial y}\frac{\partial^2 I}{\partial y \partial t}\right)$$

$$- \frac{1}{I}\left[\left(\frac{\partial I}{\partial x}\right)^2 + \left(\frac{\partial I}{\partial y}\right)^2\right]^{-3/2}\left(\frac{\partial I}{\partial x}\frac{\partial^2 I}{\partial x \partial t} + \frac{\partial I}{\partial y}\frac{\partial^2 I}{\partial y \partial t}\right)\left(\frac{\partial I}{\partial x}\frac{\partial^2 I}{\partial x \partial J_s} + \frac{\partial I}{\partial y}\frac{\partial^2 I}{\partial y \partial J_s}\right)$$

$$+ \frac{1}{I}\left[\left(\frac{\partial I}{\partial x}\right)^2 + \left(\frac{\partial I}{\partial y}\right)^2\right]^{-1/2}\left(\frac{\partial^2 I}{\partial x \partial t}\frac{\partial^2 I}{\partial x \partial J_s} + \right.$$

$$\left.\frac{\partial^2 I}{\partial y \partial t}\frac{\partial^2 I}{\partial y \partial J_s} + \frac{\partial I}{\partial x}\frac{\partial^3 I}{\partial x \partial t \partial J_s} + \frac{\partial I}{\partial y}\frac{\partial^3 I}{\partial y \partial t \partial J_s}\right)$$

Since the gradient terms are defined to be row vectors, the Hessian matrix, $\partial^2 ILS/\partial t \partial J_s$, can be calculated with liner algebra as shown below.

$$\frac{\partial^2 ILS}{\partial t \partial J_s} = \frac{2}{I^3}\left[\left(\frac{\partial I}{\partial x}\right)^2 + \left(\frac{\partial I}{\partial y}\right)^2\right]^{1/2}\left(\frac{\partial I}{\partial t}\right)\left(\frac{\partial I}{\partial J_s}\right)^T$$

$$- \frac{1}{I^2}\left[\left(\frac{\partial I}{\partial x}\right)^2 + \left(\frac{\partial I}{\partial y}\right)^2\right]^{1/2}\frac{\partial^2 I}{\partial t \partial J_s}$$

$$- \frac{1}{I^2}\left[\left(\frac{\partial I}{\partial x}\right)^2 + \left(\frac{\partial I}{\partial y}\right)^2\right]^{-1/2}\left(\frac{\partial I}{\partial t}\right)\left(\frac{\partial I}{\partial x}\frac{\partial^2 I}{\partial x \partial J_s} + \frac{\partial I}{\partial y}\frac{\partial^2 I}{\partial y \partial J_s}\right)^T$$

$$- \frac{1}{I^2}\left[\left(\frac{\partial I}{\partial x}\right)^2 + \left(\frac{\partial I}{\partial y}\right)^2\right]^{-1/2}\left(\frac{\partial I}{\partial x}\frac{\partial^2 I}{\partial x \partial t} + \frac{\partial I}{\partial y}\frac{\partial^2 I}{\partial y \partial t}\right)\left(\frac{\partial I}{\partial J_s}\right)^T$$

$$- \frac{1}{I}\left[\left(\frac{\partial I}{\partial x}\right)^2 + \left(\frac{\partial I}{\partial y}\right)^2\right]^{-3/2}\left(\frac{\partial I}{\partial x}\frac{\partial^2 I}{\partial x \partial t} + \right.$$

$$\left.\frac{\partial I}{\partial y}\frac{\partial^2 I}{\partial y \partial t}\right)\left(\frac{\partial I}{\partial x}\frac{\partial^2 I}{\partial x \partial J_s} + \frac{\partial I}{\partial y}\frac{\partial^2 I}{\partial y \partial J_s}\right)^T$$

$$+ \frac{1}{I}\left[\left(\frac{\partial I}{\partial x}\right)^2 + \left(\frac{\partial I}{\partial y}\right)^2\right]^{-1/2}\left[\left(\frac{\partial^2 I}{\partial x \partial t}\right)\left(\frac{\partial^2 I}{\partial x \partial J_s}\right)^T + \right.$$

$$\left.\left(\frac{\partial^2 I}{\partial y \partial t}\right)\left(\frac{\partial^2 I}{\partial y \partial J_s}\right)^T + \frac{\partial I}{\partial x}\frac{\partial^3 I}{\partial x \partial t \partial J_s} + \frac{\partial I}{\partial y}\frac{\partial^3 I}{\partial y \partial t \partial J_s}\right]$$

1.5 Intensity Gradient with Respect to $J_s$ and $t$

The gradient with respect to $J_s$, $\partial I/\partial J_s$, is a row vector defined for every source point $(\alpha_s, \beta_s)$.

$$\frac{\partial I}{\partial J_s} = \int \delta(\alpha_s, \beta_s) e(x, y; \alpha_s, \beta_s) e^*(x, y; \alpha_s, \beta_s) =$$

$$e(x, y; \alpha_s, \beta_s) e^*(x, y; \alpha_s, \beta_s) = ee^*$$

Likewise $\partial^2 I/\partial x \partial J_s$ and $\partial^2 I/\partial y \partial J_s$ are row vectors defined for every source pixel $(\alpha_s, \beta_s)$.

$$\frac{\partial^2 I}{\partial x \partial J_s} = \frac{\partial e}{\partial x} e^* + e \frac{\partial e^*}{\partial x}$$

$$\frac{\partial^2 I}{\partial y \partial J_s} = \frac{\partial e}{\partial y} e^* + e \frac{\partial e^*}{\partial y}$$

The gradient with respect to $t$, $\partial I.\partial t$, is a vector defined for every mask pixel, $t$.

$$\frac{\partial I}{\partial t} = \int d\alpha_s d\beta_s J_s \left(\frac{\partial e}{\partial t} e^* + e \frac{\partial e^*}{\partial t}\right)$$

It is also possible to define $\partial I/\partial t$ as function of $f$ which is a linear summation of the TCC kernels, $\phi$.

$$\frac{\partial I}{\partial t} = \frac{\partial f}{\partial t} f^* + f \frac{\partial f^*}{\partial t}$$

$$\frac{\partial^2 I}{\partial x \partial t} = \int d\alpha_s d\beta_s J_s \left(\frac{\partial^2 e}{\partial x \partial t} e^* + \frac{\partial e}{\partial t}\frac{\partial e^*}{\partial x} + \frac{\partial e}{\partial x}\frac{\partial e^*}{\partial t} + e \frac{\partial^2 e^*}{\partial x \partial t}\right)$$

Or $$\frac{\partial^2 I}{\partial x \partial t} = \frac{\partial^2 f}{\partial x \partial t} f^* + \frac{\partial f}{\partial t}\frac{\partial f^*}{\partial x} + \frac{\partial f}{\partial x}\frac{\partial f^*}{\partial t} + f \frac{\partial^2 f^*}{\partial x \partial t}$$

$$\frac{\partial^2 I}{\partial y \partial t} = \int d\alpha_s d\beta_s J_s \left(\frac{\partial^2 e}{\partial y \partial t} e^* + \frac{\partial e}{\partial t}\frac{\partial e^*}{\partial y} + \frac{\partial e}{\partial y}\frac{\partial e^*}{\partial t} + e \frac{\partial^2 e^*}{\partial y \partial t}\right)$$

Or $$\frac{\partial^2 I}{\partial y \partial t} = \frac{\partial^2 f}{\partial y \partial t} f^* + \frac{\partial f}{\partial t}\frac{\partial f^*}{\partial y} + \frac{\partial f}{\partial y}\frac{\partial f^*}{\partial t} + f\frac{\partial^2 f^*}{\partial y \partial t}$$

1.6 Intensity Hessian Components with Respect to $J_s$ and $t_i$

The Hessian of I with respect to $t_i$ and $J_s$, $\partial^2 I/\partial t_i \partial J_s$ and with respect to $t_i$ and $t_j$, $\partial^2 I/\partial t_i \partial t_j$, are defined below. It is important to note again that the Hessian of I with respect to two source pixels, $J_{si}$ and $J_{sj}$, $\partial^2 I/\partial J_{si}\partial J_{sj}$, is zero because the source is defined to be spatially incoherent. As in the case for the Hessian of the ILS, the Hessian of intensity is shown in matrix algebra as well.

Calculation of $\partial^2 I/\partial t_i \partial J_s$ $$\frac{\partial^2 I}{\partial t_i \partial J_s} = \frac{\partial e}{\partial t_i}e^* + e\frac{\partial e^*}{\partial t_i} = \left(\frac{\partial e}{\partial t_i}\right)(e)^H + (e)\left(\frac{\partial e}{\partial t_i}\right)^H$$

$$\frac{\partial^3 I}{\partial x \partial t_i \partial J_s} = \frac{\partial^2 e}{\partial x \partial t_i}e^* + \frac{\partial e}{\partial t_i}\frac{\partial e^*}{\partial x} + \frac{\partial e}{\partial x}\frac{\partial e^*}{\partial t_i} + e\frac{\partial^2 e^*}{\partial x \partial t_i} =$$

$$\left(\frac{\partial^2 e}{\partial x \partial t_i}\right)(e)^H + \left(\frac{\partial e}{\partial t_i}\right)\left(\frac{\partial e}{\partial x}\right)^H + \left(\frac{\partial e}{\partial x}\right)\left(\frac{\partial e}{\partial t_i}\right)^H + (e)\left(\frac{\partial^2 e}{\partial x \partial t_i}\right)^H$$

$$\frac{\partial^3 I}{\partial x \partial t_i \partial J_s} = \frac{\partial^2 e}{\partial y \partial t_i}e^* + \frac{\partial e}{\partial t_i}\frac{\partial e^*}{\partial y} + \frac{\partial e}{\partial y}\frac{\partial e^*}{\partial t_i} + e\frac{\partial^2 e^*}{\partial y \partial t_i} =$$

$$\left(\frac{\partial^2 e}{\partial y \partial t_i}\right)(e)^H + \left(\frac{\partial e}{\partial t_i}\right)\left(\frac{\partial e}{\partial y}\right)^H + \left(\frac{\partial e}{\partial y}\right)\left(\frac{\partial e}{\partial t_i}\right)^H + (e)\left(\frac{\partial^2 e}{\partial y \partial t_i}\right)^H$$

Calculation of $\partial^2 I/\partial t_i \partial t_j$ $$\frac{\partial^2 I}{\partial t_i \partial t_j} = \int d\alpha_s d\beta_s J_s \left(\frac{\partial^2 e}{\partial t_i \partial t_j}e^* + \frac{\partial e}{\partial t_i}\frac{\partial e^*}{\partial t_j} + \frac{\partial e}{\partial t_j}\frac{\partial e^*}{\partial t_i} + e\frac{\partial^2 e^*}{\partial t_i \partial t_j}\right)$$

because $$\frac{\partial^2 e}{\partial t_i \partial t_j} = 0, \frac{\partial^2 I}{\partial t_i \partial t_j}$$

reduces to:

$$\frac{\partial^2 I}{\partial t_i \partial t_j} = \int d\alpha_s d\beta_s J_s \left(\frac{\partial e}{\partial t_i}\frac{\partial e^*}{\partial t_j} + \frac{\partial e}{\partial t_j}\frac{\partial e^*}{\partial t_i}\right)$$

$$\frac{\partial^3 I}{\partial x \partial t_i \partial t_j} =$$

$$\int d\alpha_s d\beta_s J_s \left(\frac{\partial^2 e}{\partial x \partial t_i}\frac{\partial e^*}{\partial t_j} + \frac{\partial e}{\partial t_i}\frac{\partial^2 e^*}{\partial x \partial t_j} + \frac{\partial^2 e}{\partial x \partial t_j}\frac{\partial e^*}{\partial t_i} + \frac{\partial e}{\partial t_j}\frac{\partial^2 e^*}{\partial x \partial t_i}\right)$$

$$\frac{\partial^3 I}{\partial y \partial t_i \partial t_j} =$$

$$\int d\alpha_s d\beta_s J_s \left(\frac{\partial^2 e}{\partial y \partial t_i}\frac{\partial e^*}{\partial t_j} + \frac{\partial e}{\partial t_i}\frac{\partial^2 e^*}{\partial y \partial t_j} + \frac{\partial^2 e}{\partial y \partial t_j}\frac{\partial e^*}{\partial t_i} + \frac{\partial e}{\partial t_j}\frac{\partial^2 e^*}{\partial y \partial t_i}\right)$$

In the equations above, all the derivatives of I with respect to x, $J_s$, $t_i$ and $t_j$ are functions of 6 electric field terms. From these 6 electric field terms, all the ILS Hessian terms can be calculated. These 6 electric field terms are:

1. $e$
2. $\frac{\partial e}{\partial x}$
3. $\frac{\partial e}{\partial y}$
4. $\frac{\partial e}{\partial t}$
5. $\frac{\partial^2 e}{\partial x \partial t}$
6. $\frac{\partial^2 e}{\partial y \partial t}$ It is important to note that only gradient terms are needed as $$\frac{\partial e}{\partial x} \text{ and } \frac{\partial e}{\partial y}$$

can be calculated from e by using the derivative property of the Fourier transform. Likewise $$\frac{\partial^2 e}{\partial x \partial t}$$

and $$\frac{\partial^2 e}{\partial y \partial t}$$

can be calculating from $$\frac{\partial e}{\partial t}$$

by using the derivative property of the Fourier transform.

EXAMPLE RESULTS OF THE PRESENT INVENTION

FIGS. 2 to 3 show example results for a brickwall, rectangular contact hole array, and brickwall patterns. In particular, FIGS. 2 to 18 show a 50 nm half-pitch brickwall. The results are for NA=1.2 ($k_1$=0.31), and for a binary mask. The mask pixel size is 12.5 nm and the source pixel size is 0.05 sigma. For the brickwall, three ILS evaluation points were selected. These points are long line semi dense area (x=25 nm, y=0 nm), long line dense area (25,100) and the end of line (0,150). When calculating the gradient of ILS with respect the mask pixel, ∂ILS/at, and the Hessian, $\partial^2$ILS/$\partial t_i \partial t_j$, the source is assumed to be the initial source shape of conventional illumination with σ=0.98.

FIGS. 2 to 6 show the gradient of ILS with respect to t for the brickwall pattern.

FIG. 2A is the location of the ILS evaluation point and FIG. 2B is the gradient of the ILS with respect to t, ∂ILS/∂t, at ILS evaluation point (25 nm, 0 nm). Note that the ∂ILS/∂t plot in FIG. 2B wants the mask transmission in the dark area to decrease and the transmission in the bright area to increase. This is not possible for a binary mask.

FIG. 3 is the location of the ILS evaluation point and FIG. 4 is the gradient of the ILS with respect to t, ∂ILS/∂t, at ILS evaluation point (25 nm, 100 nm). Note that the ∂ILS/∂t plot in FIG. 4 wants the mask transmission in the dark area to decrease and the transmission in the bright area to increase. This is not possible for a binary mask.

Figures 5, 6:
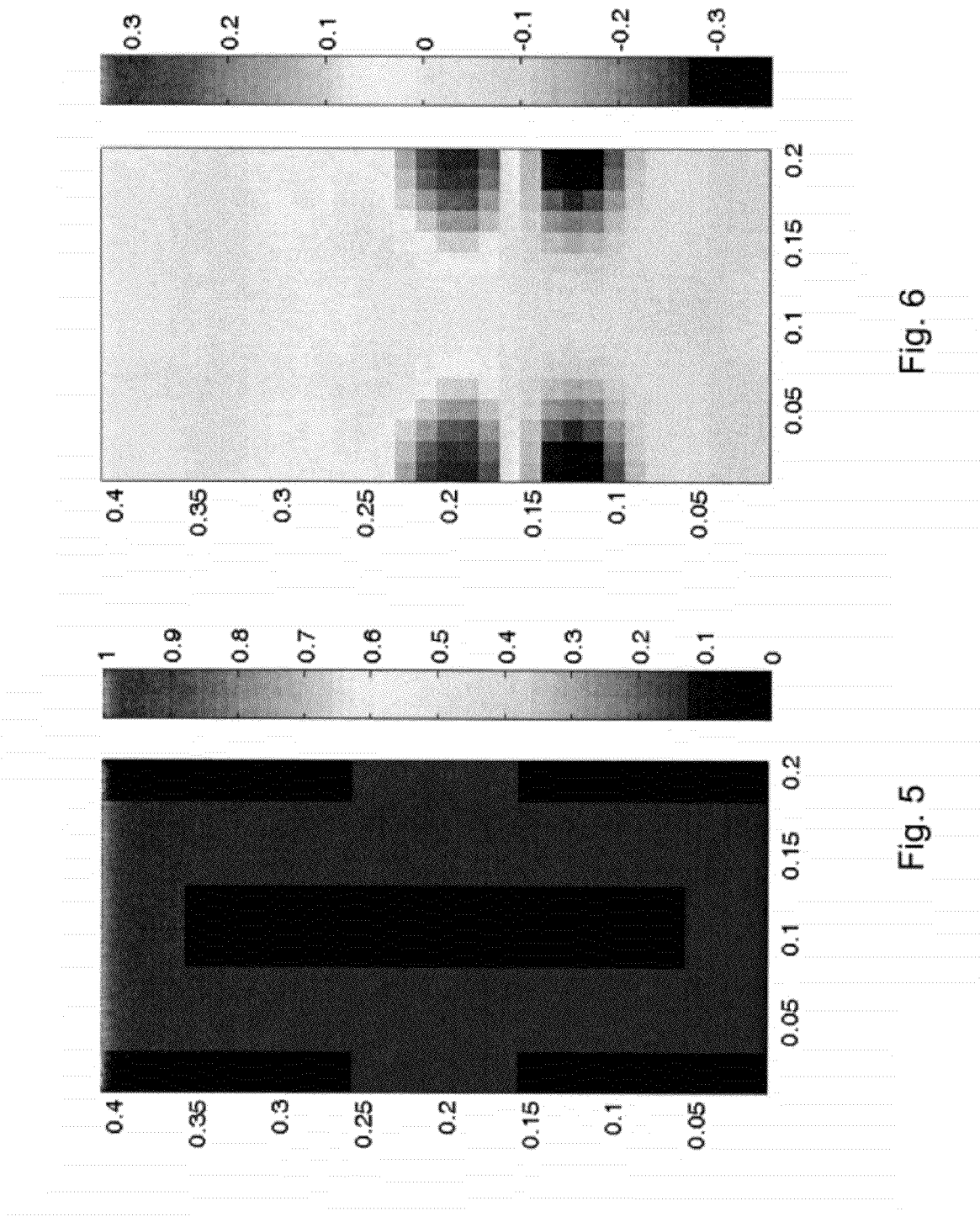

FIG. 5 is the location of the ILS evaluation point and FIG. 6 is the gradient of the ILS with respect to t, ∂ILS/∂t, at ILS evaluation point (0 nm, 150 nm). Note that the ∂ILS/∂t plot in FIG. 6 wants the mask transmission in the dark area to decrease and the transmission in the bright area to increase. This is not possible for a binary mask. However, the ∂ILS/∂t plot also wants to the EOL to become a hammerhead which is possible.

Figure 7:
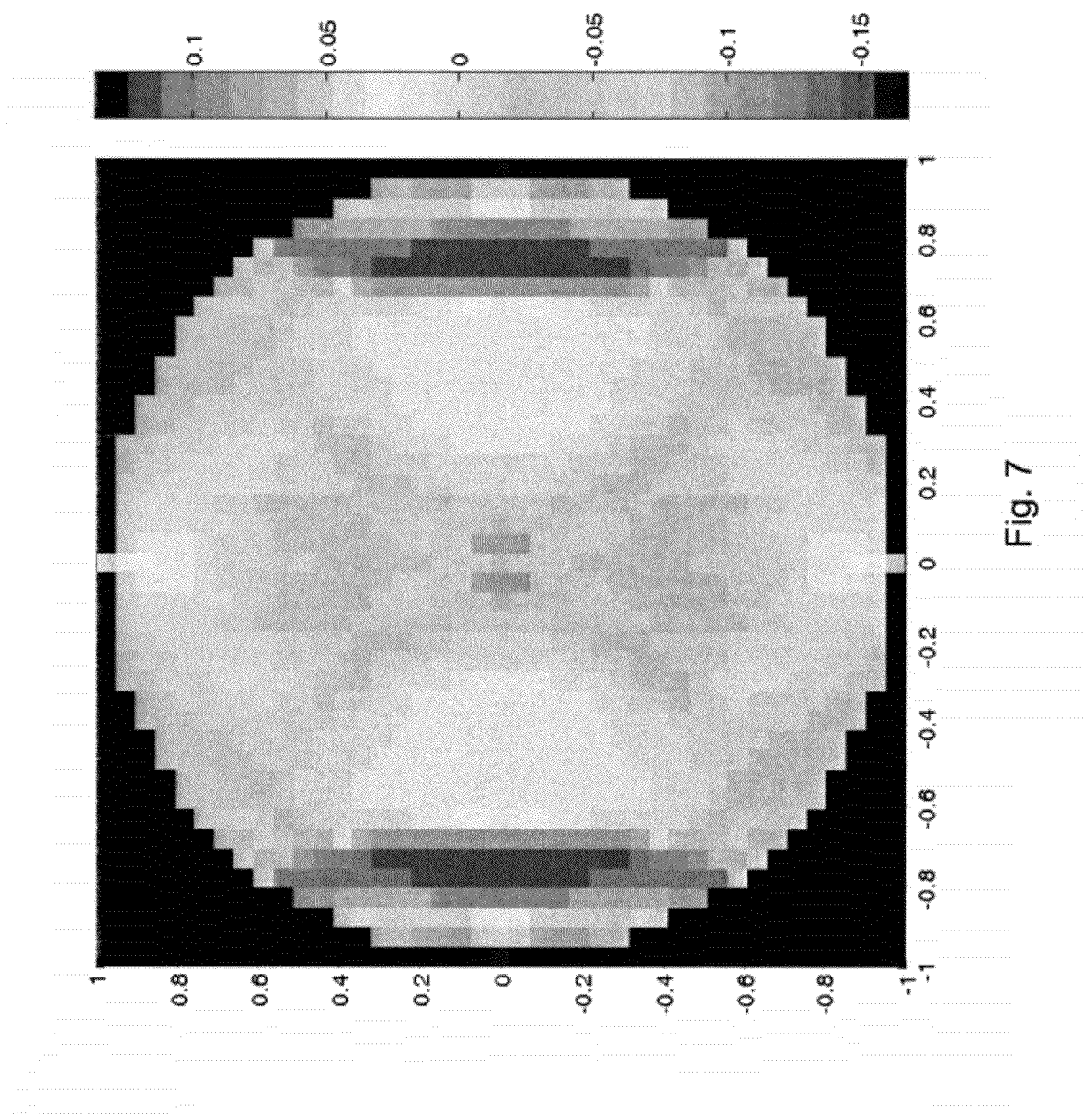
FIGS. 7-9 show the gradient of ILS with respect to $J_s$ of the brickwall pattern.
Figure 8:
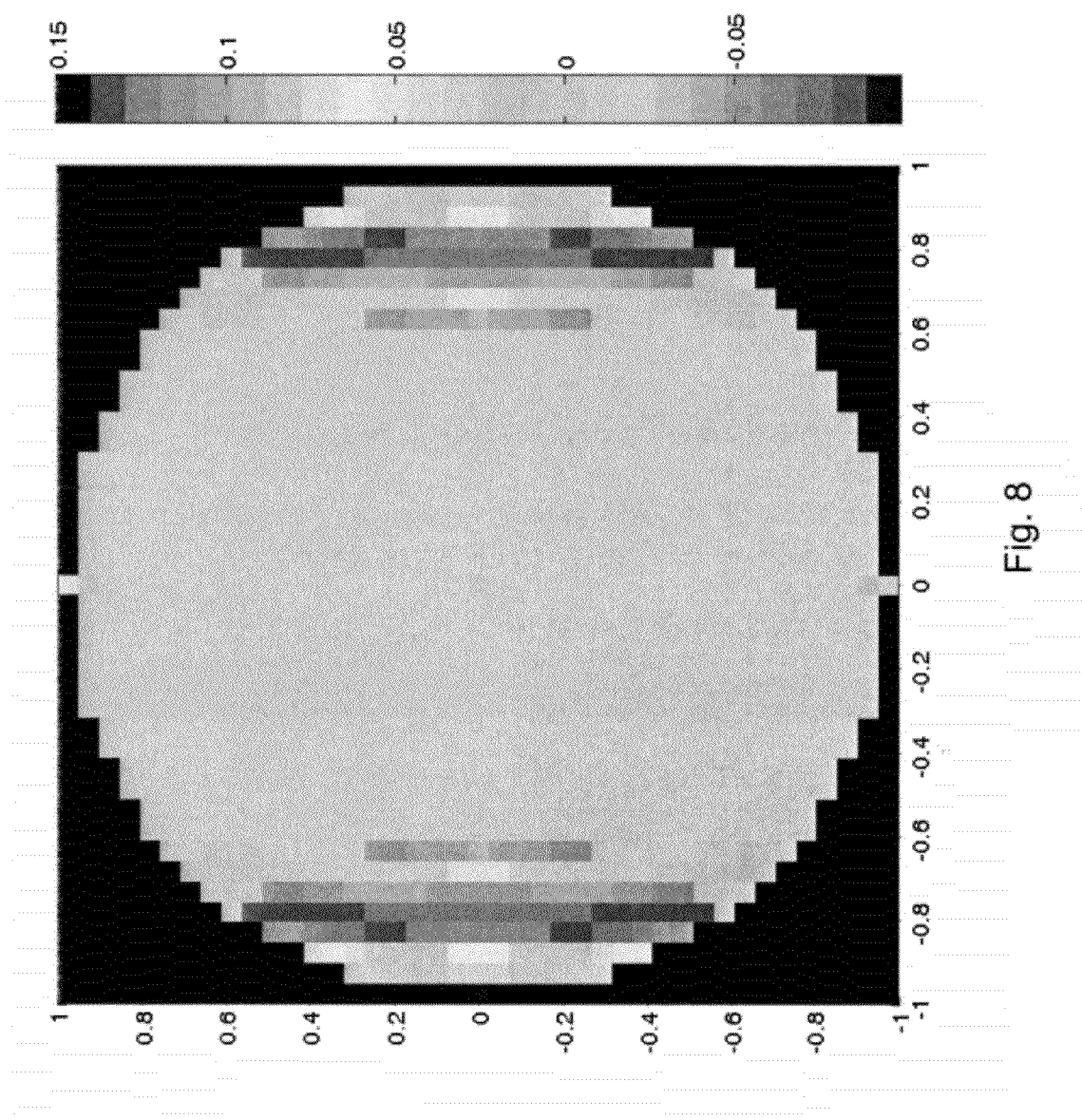
Figure 9:
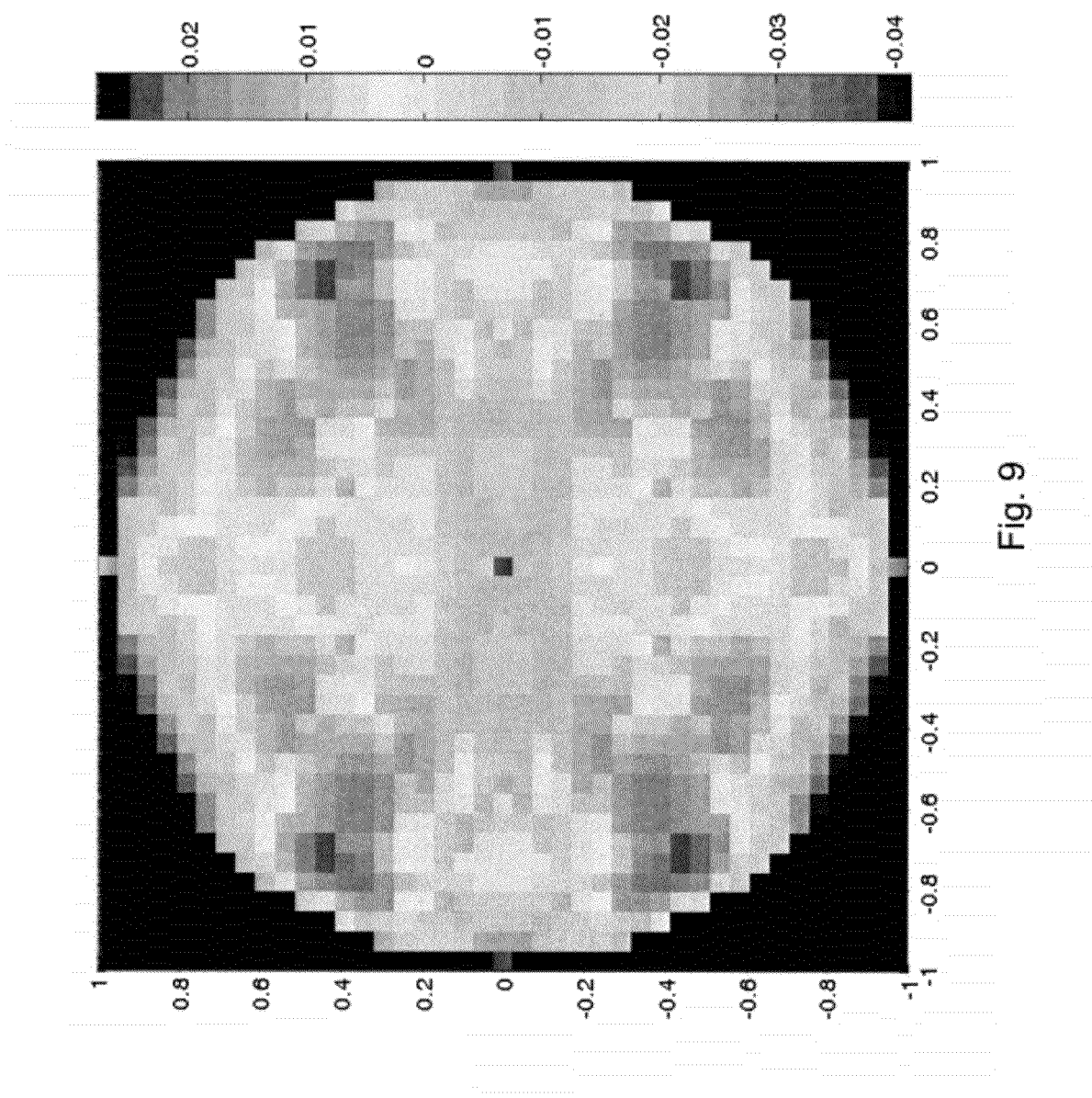

FIGS. 7 to 9 show the gradient of ILS with respect $J_s$ for the brickwall pattern.

FIG. 7 shows the gradient of the ILS with respect to t, ∂ILS/∂t, at ILS evaluation point (25 nm, 0 nm). The optimal illumination for this point is dipole x.

FIG. 8 shows the gradient of the ILS with respect to t, ∂ILS/∂t, at ILS evaluation point (25 nm, 100 nm). The optimal illumination for this point is dipole x.

FIG. 9 shows the gradient of the ILS with respect to t, ∂ILS/∂t, at ILS evaluation point (0 nm, 150 nm). The optimal illumination for this point is four-pole or dipole y.

FIGS. 10 to 18 show the Hessian of ILS with respect to t and $J_s$ for the brickwall pattern.

Figure 10:
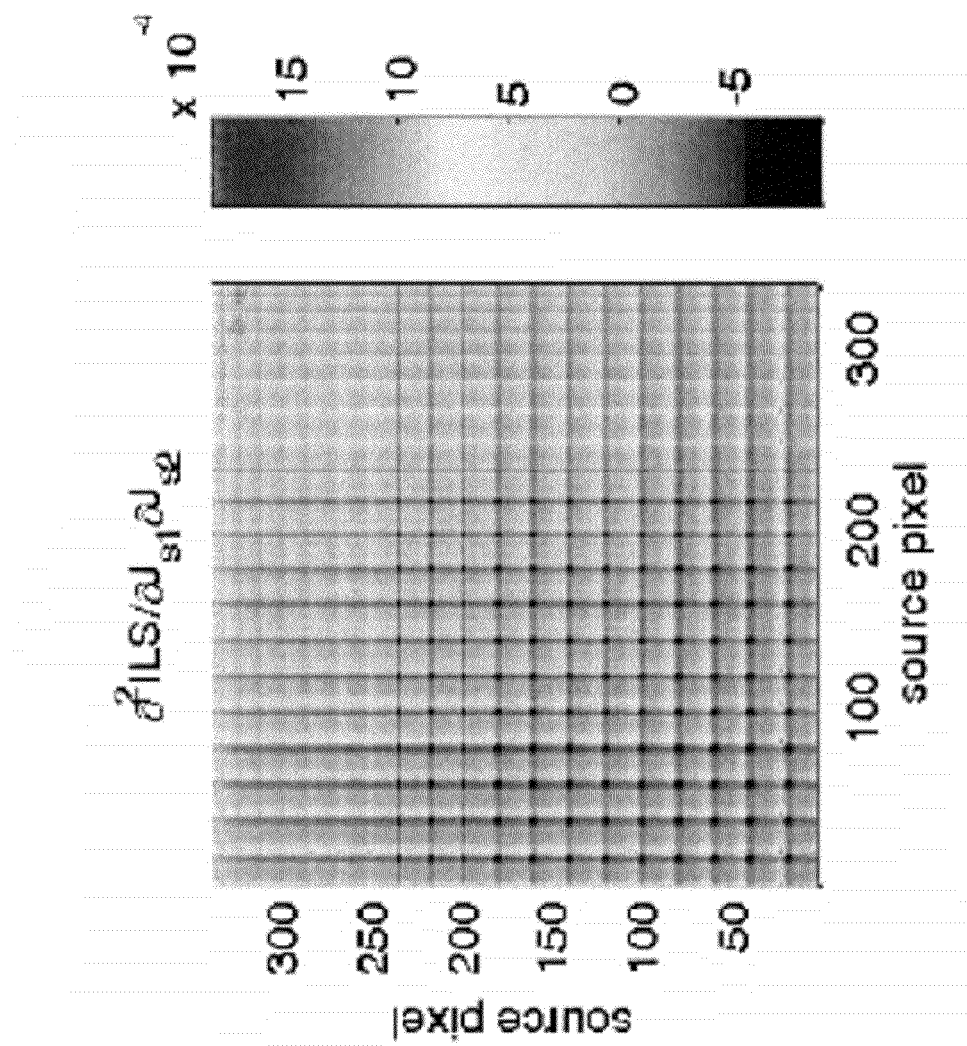
FIGS. 10-18 show the Hessian of ILS with respect to t and $J_s$ of the brickwall pattern.
Figure 11:
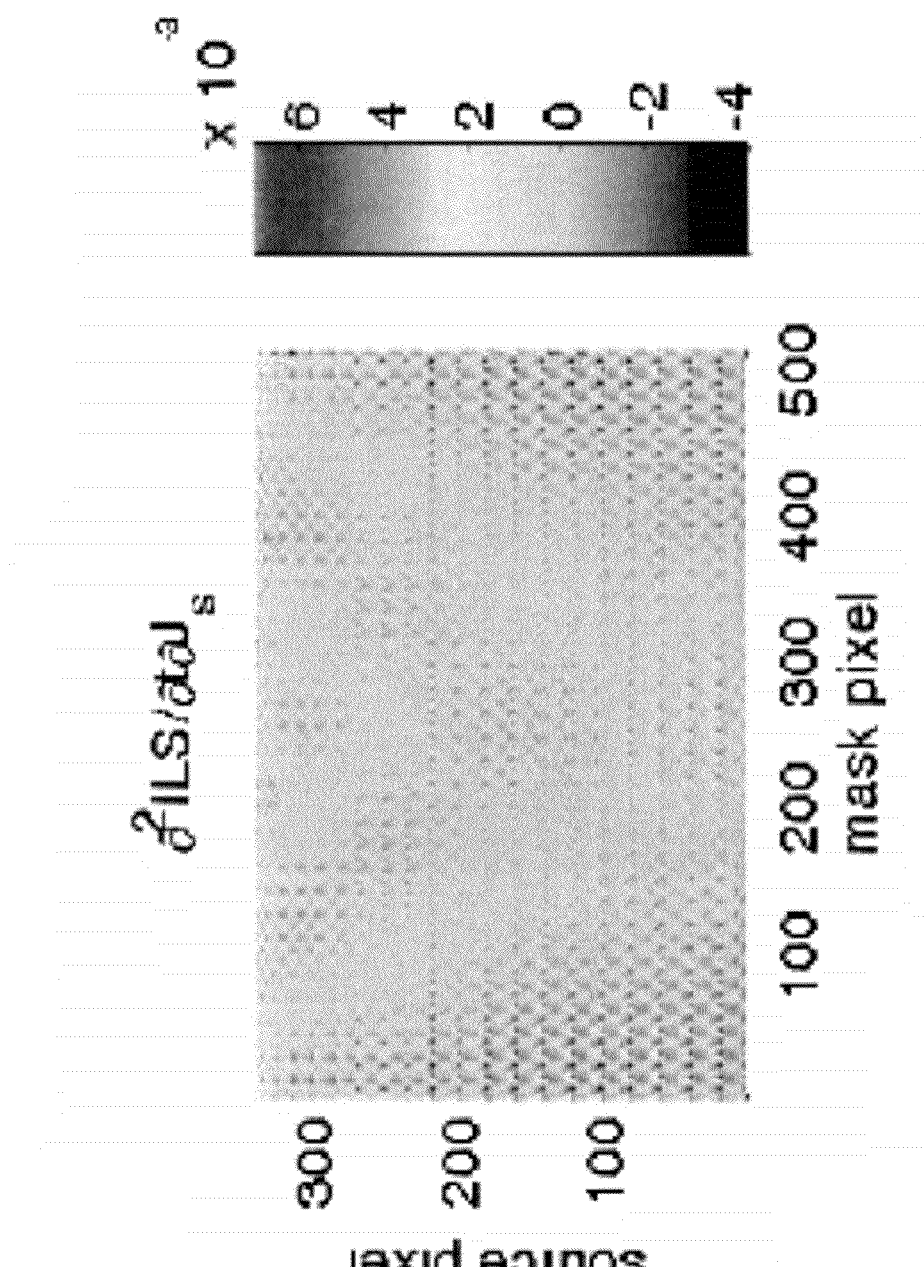
Figure 12:
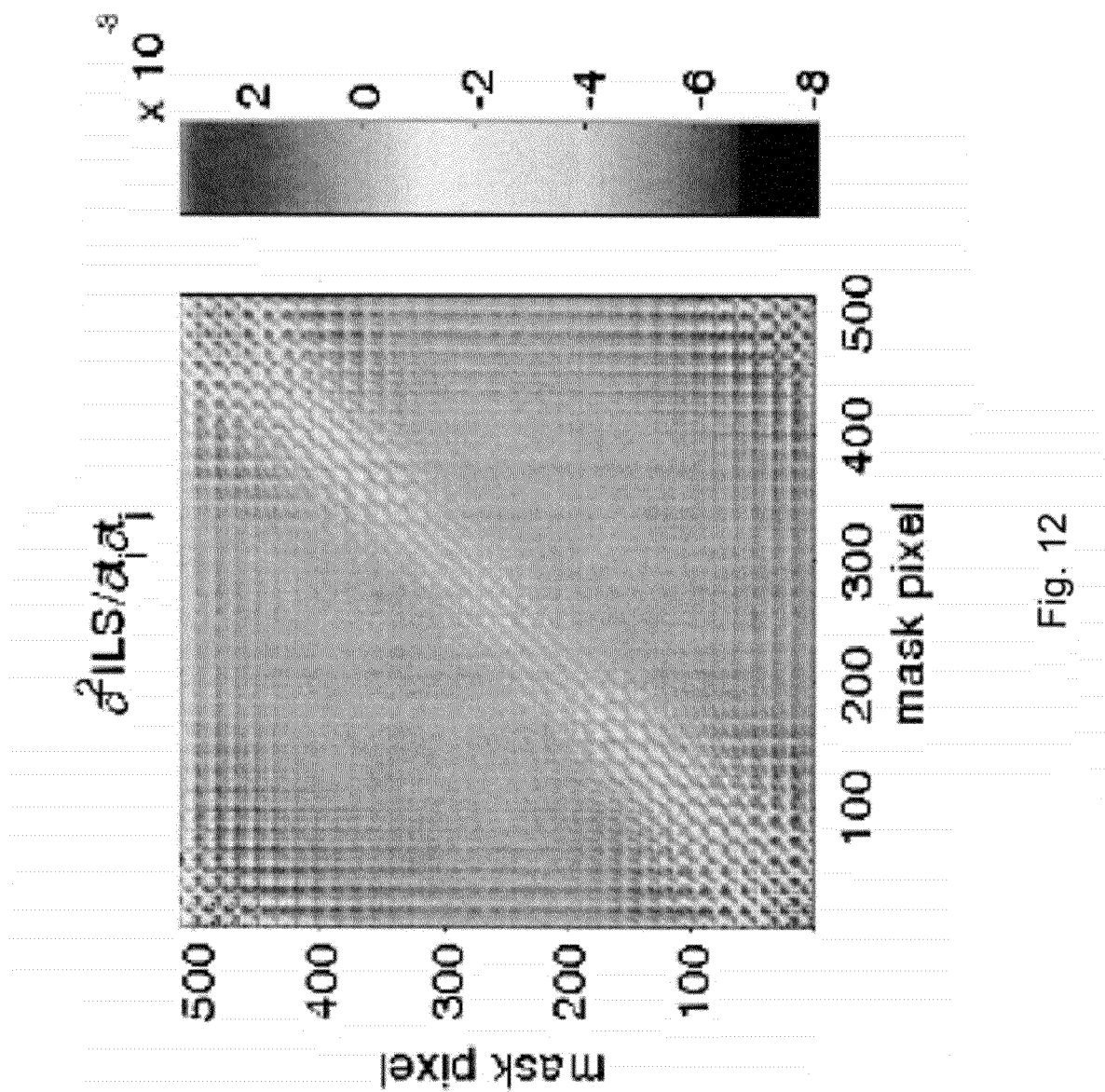

FIGS. 10-12 shows the Hessian of the ILS with respect to t and $J_s$ at ILS evaluation point (25 nm, 0 nm).

Figure 13:
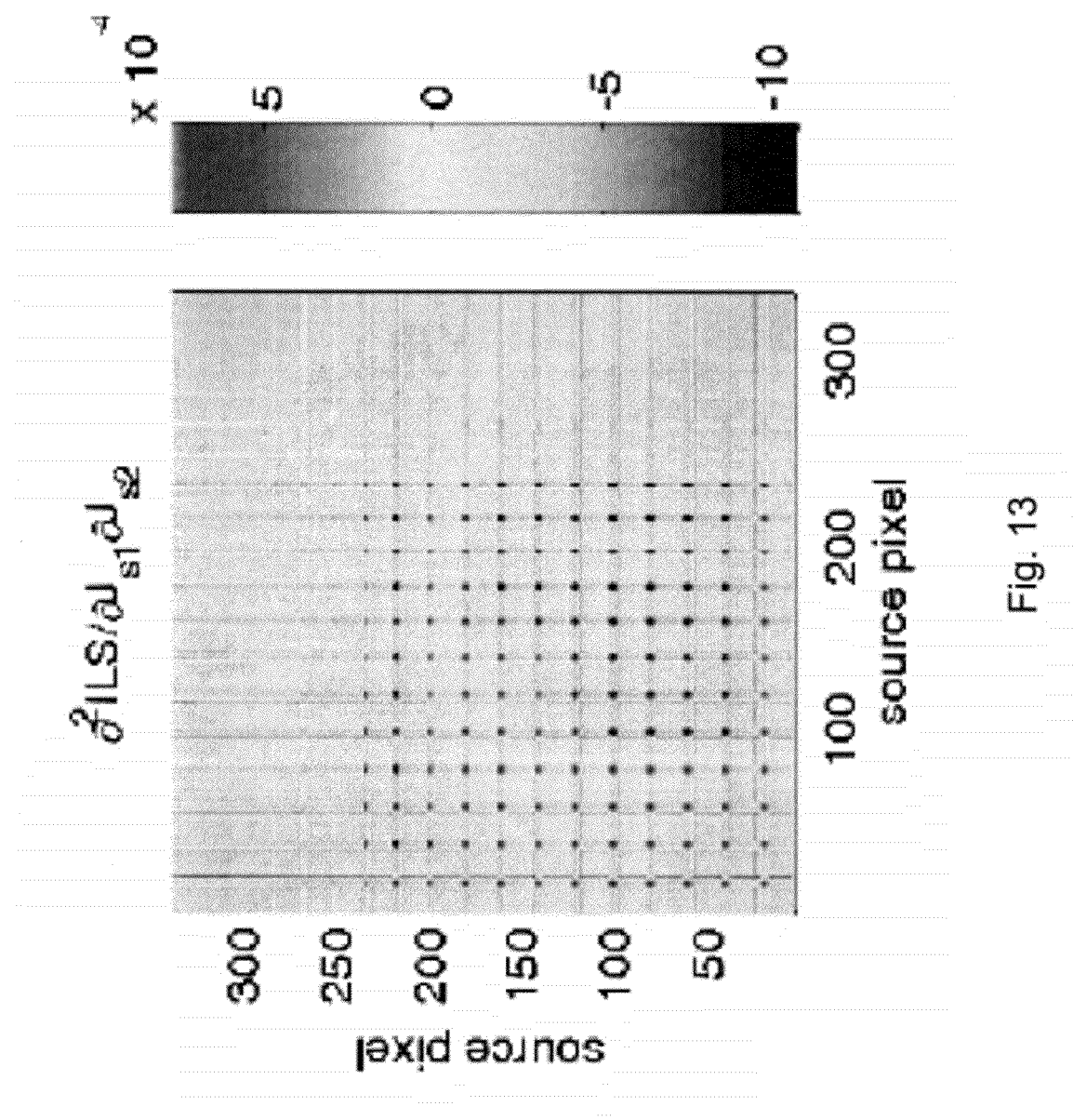
Figure 14:
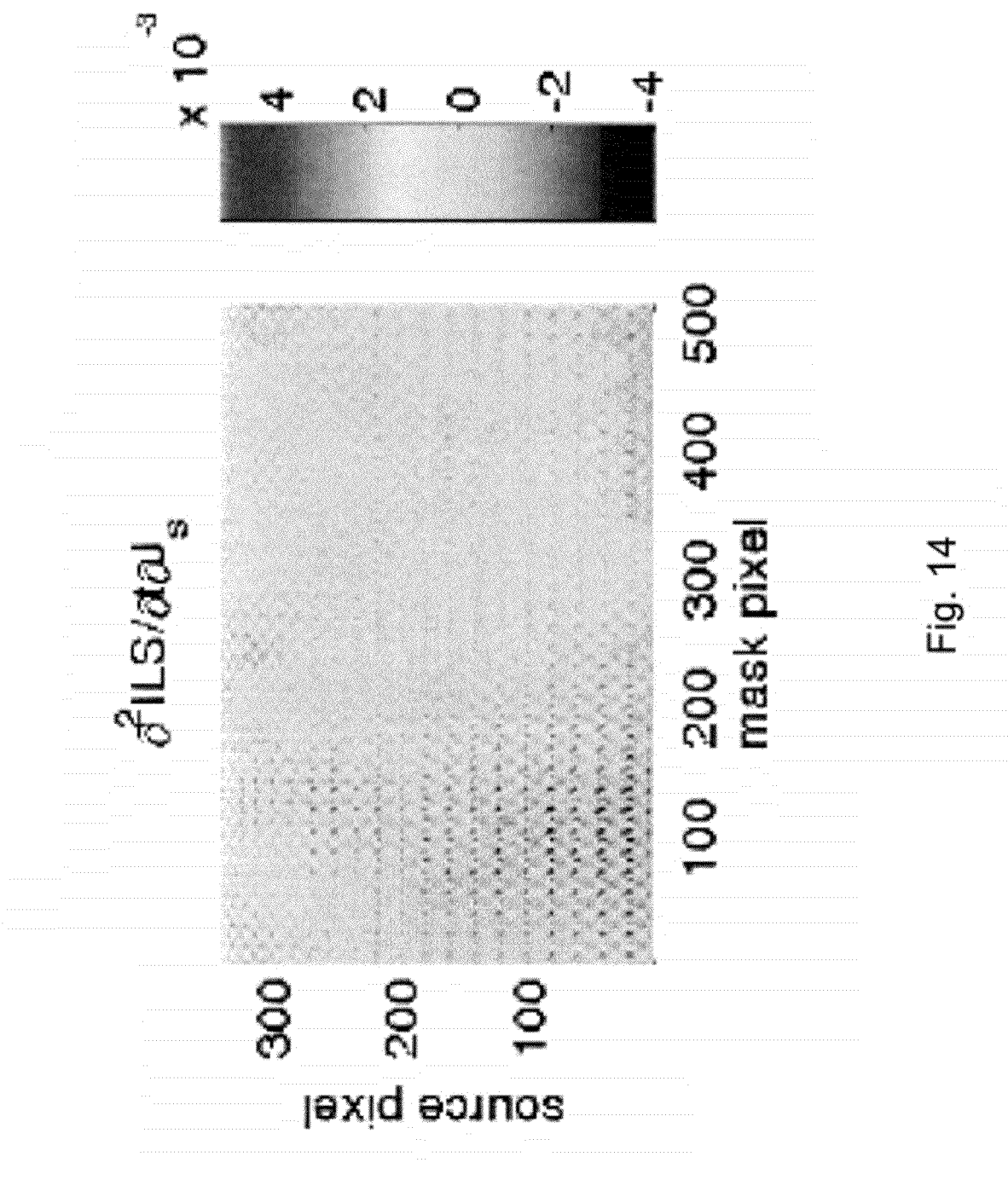
Figure 15:
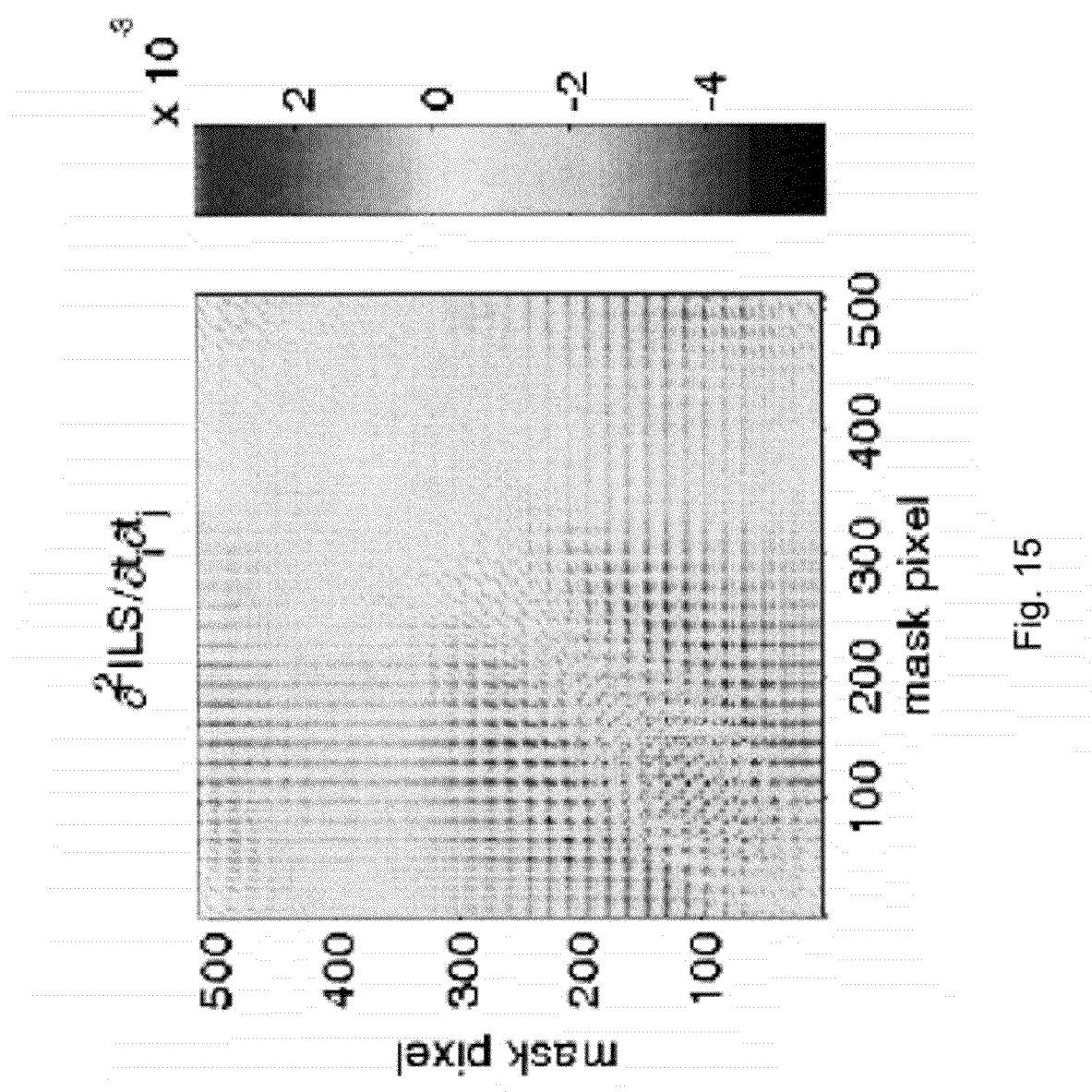

FIGS. 13-15 shows the Hessian of the ILS with respect to t and $J_s$ at ILS evaluation point (25 nm, 100 nm).

Figure 16:
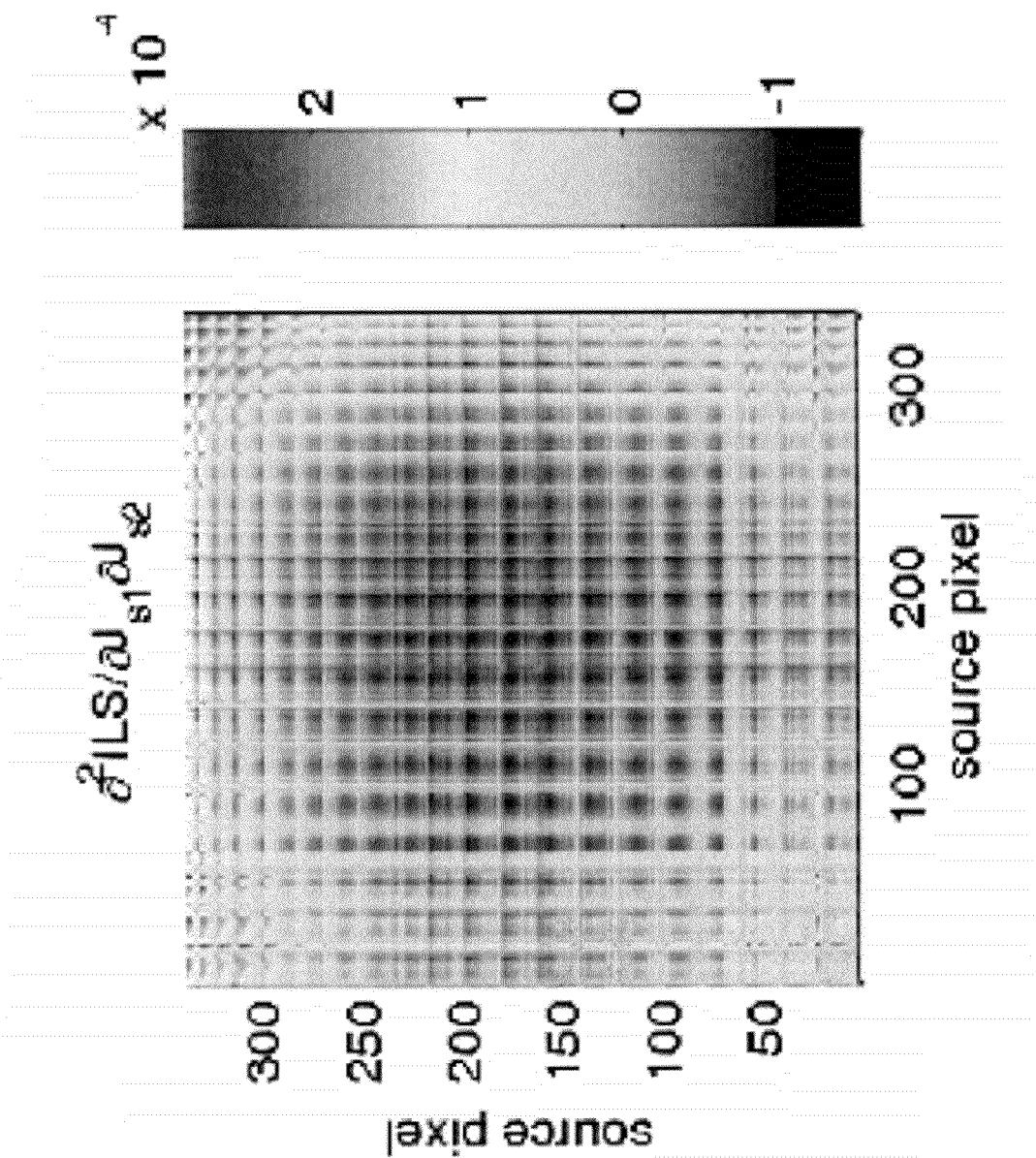
Figure 17:
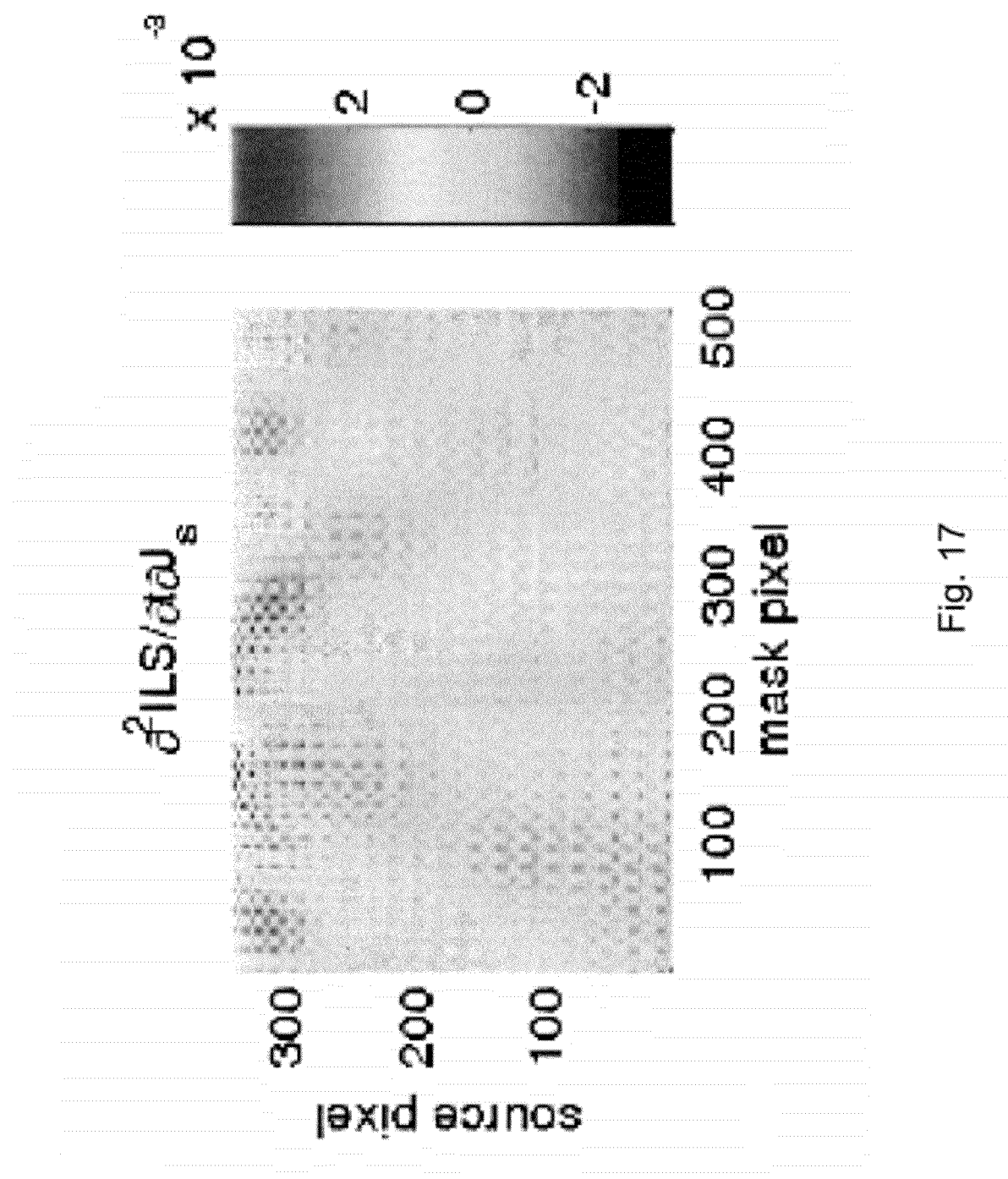
Figure 18:
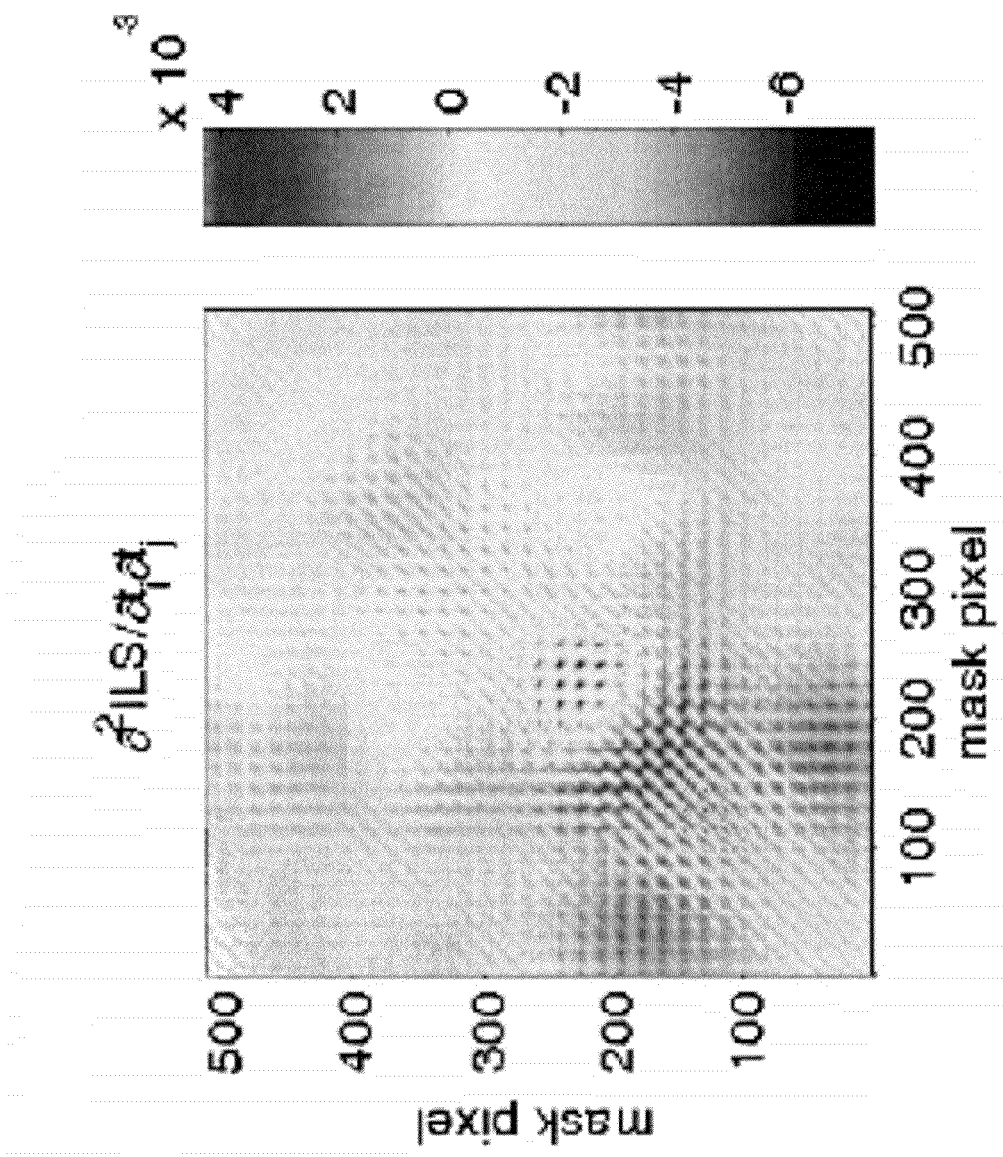

FIGS. 16-18 shows the Hessian of the ILS with respect to t and $J_s$ at ILS evaluation point (0 nm, 150 nm).

FIGS. 19 to 30 show a 42 nm half-pitch flash-like rectangular contact hole array. The contact hole size is 42 nm by 84 nm. The results are for NA=1.35 ($k_1$=0.29), and for a binary mask. The mask pixel size is 10.5 nm and the source pixel size is 0.05 sigma. For the contact, two ILS evaluation points were selected. These points are along side dense area (x=63 nm, y=525 nm), and short side isolated area (x=42 nm, y=567 nm). When calculating the gradient of ILS with respect the mask pixel, ∂ILS/∂t, and the Hessian, $\partial^2 ILS/\partial t_i \partial t_j$, the source is assumed to be the initial source shape of conventional illumination with σ=0.98.

FIGS. 19 to 22 show the gradient of ILS with respect to t.

Figure 20:
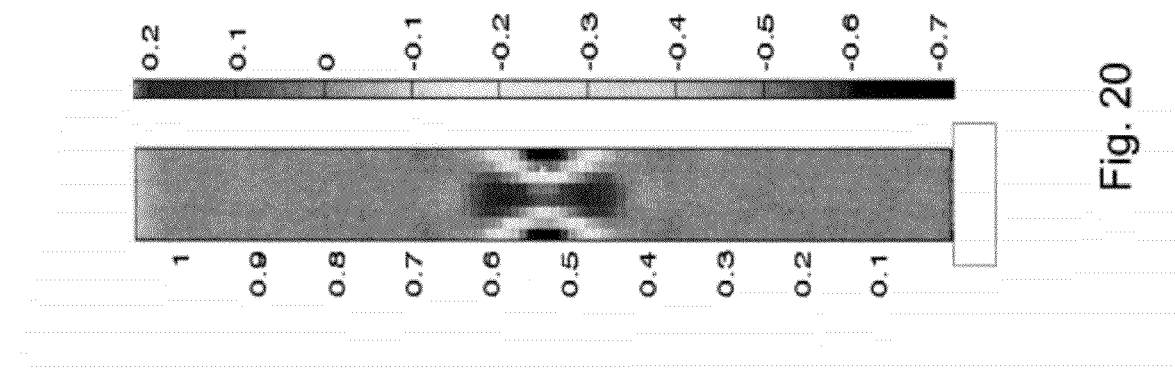
FIGS. 19-22 show the gradient of ILS with respect to t of a rectangular contact hole array pattern.
Figure 19:
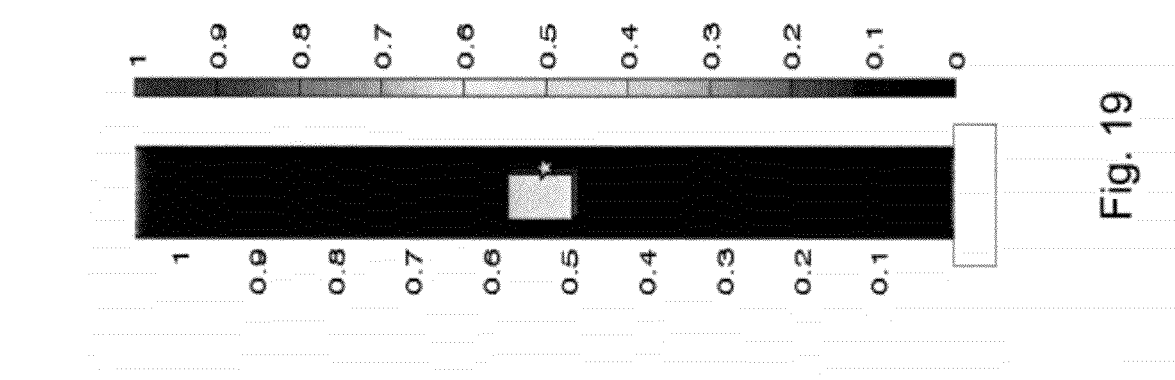

FIG. 19 shows the location of the ILS evaluation point (asterisk on the side of the contact hole) and FIG. 20 shows the gradient of the ILS with respect to t, ∂ILS/∂t, at ILS evaluation point (x=63 nm, y=525 nm). Note that the ∂ILS/∂t plot in FIG. 20 wants the mask transmission in the dark area to decrease. This is not possible for a binary mask. Also the ∂ILS/∂t plot wants the contact hole to grow in the vertical direction which is possible.

Figure 22:
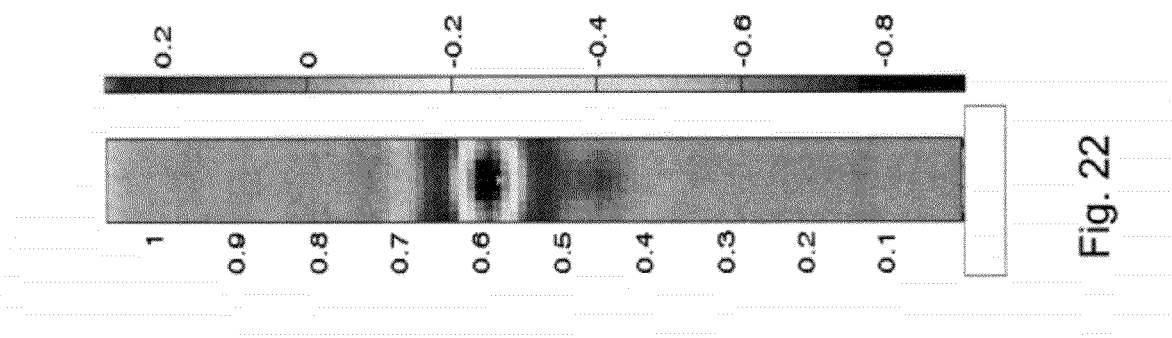
Figure 21:
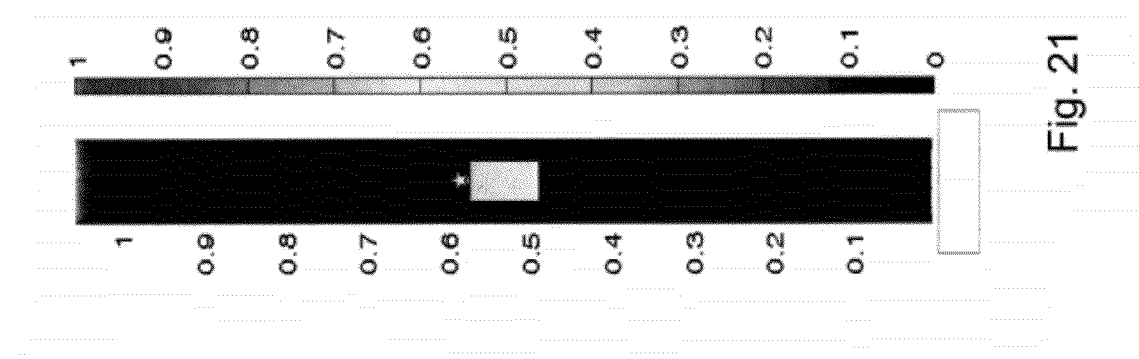

FIG. 21 shows the location of the ILS evaluation point (asterisk on the top of the contact hole) and FIG. 22 shows the gradient of the ILS with respect to t, ∂ILS/∂t, at ILS evaluation point (x=42 nm, y=567 nm). Note that the ∂ILS/∂t plot in FIG. 22 wants the mask transmission in the dark area to decrease. This is not possible for a binary mask. Also the ∂ILS/∂t plot wants the contact hole to have serifs or a hammerhead. Furthermore one can see the location of an SRAF at (x=0,y=750 nm) and (x=84,y=750 nm)

Figure 23:
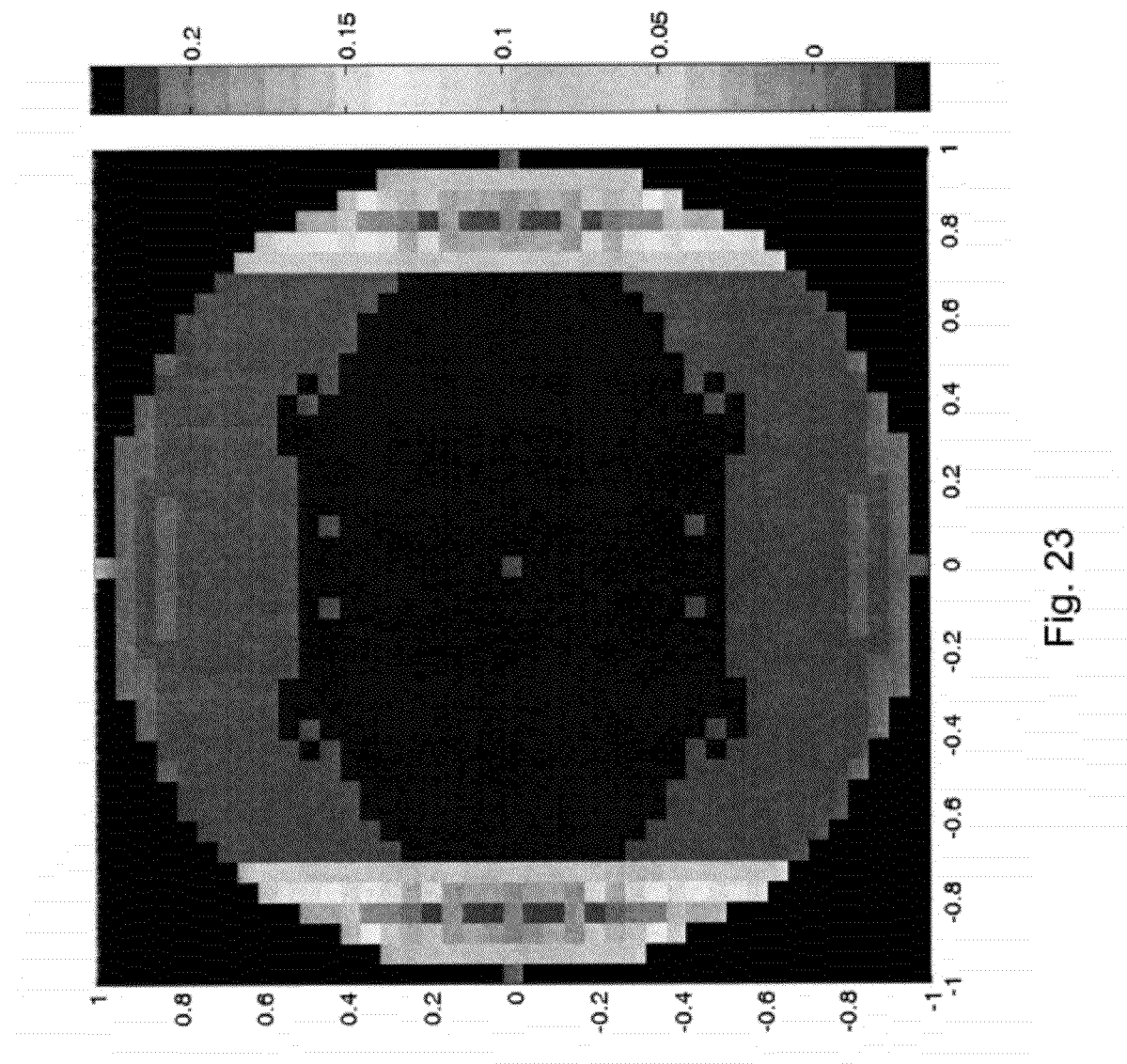
FIGS. 23-24 show the gradient of ILS with respect to $J_s$ of the rectangular contact hole array pattern.
Figure 24:
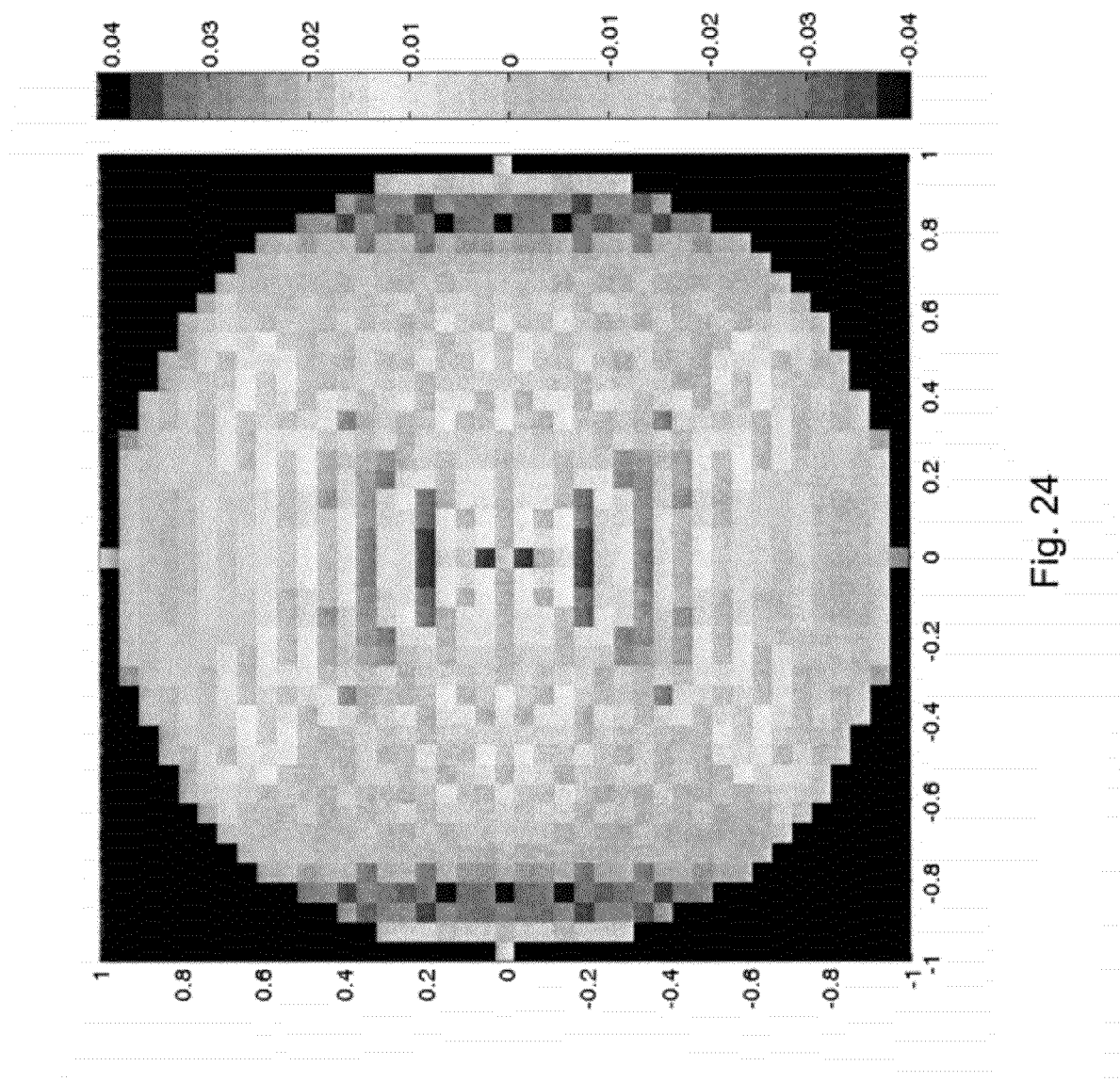

FIGS. 23 and 24 show the gradient of ILS with respect to $J_s$.

FIG. 23 shows the gradient of the ILS with respect to t, ∂ILS/∂t, at ILS evaluation point (x=63 nm, y=525 nm). The optimal illumination for this point is dipole x.

FIG. 24 shows the gradient of the ILS with respect to t, ∂ILS/∂t, at ILS evaluation point (x=42 nm, y=567 nm). The optimal illumination for this point is low sigma.

FIGS. 25 to 30 show the Hessian of ILS with respect to t and $J_s$.

Figure 25:
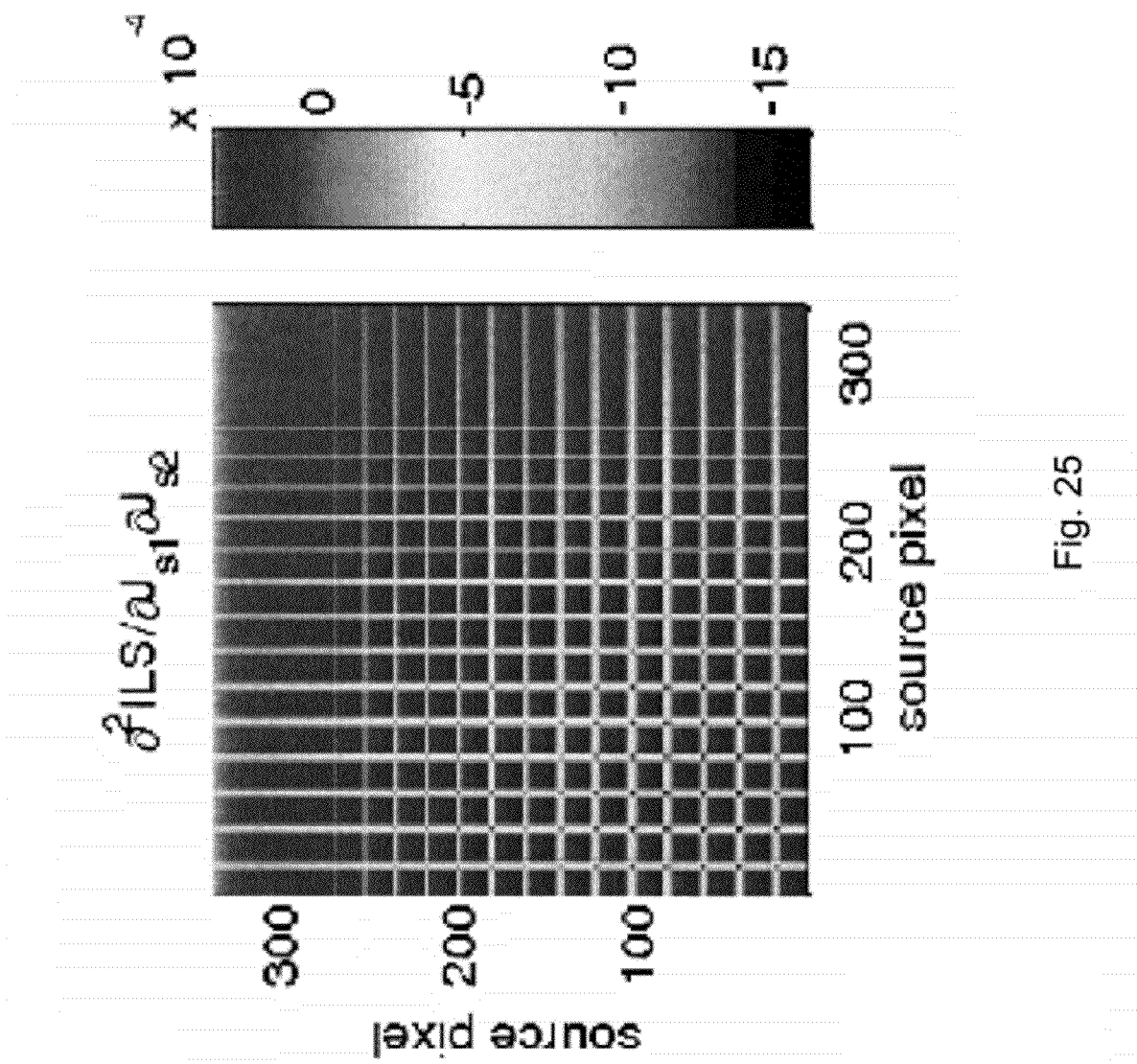
FIGS. 25-30 show the Hessian of ILS with respect to t and $J_s$ of the rectangular contact hole array pattern.
Figure 26:
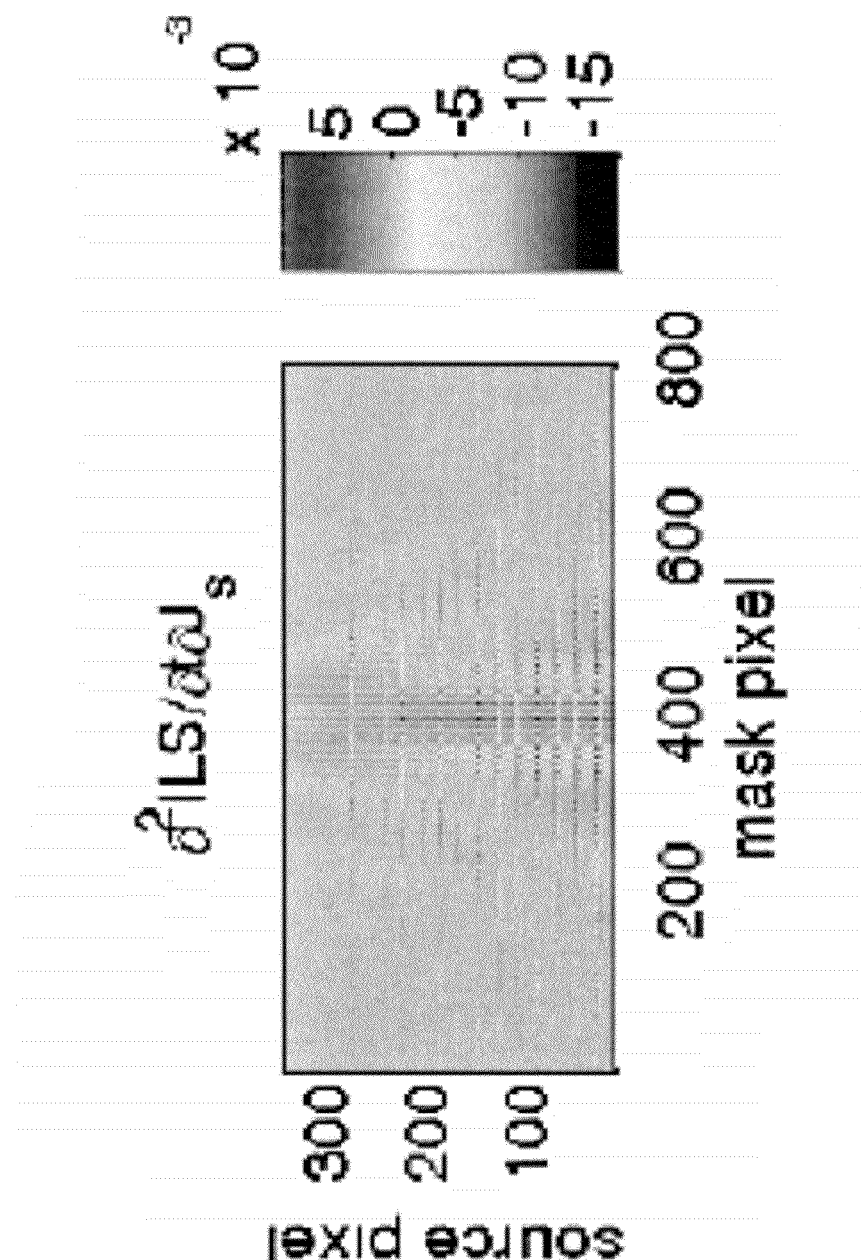
Figure 27:
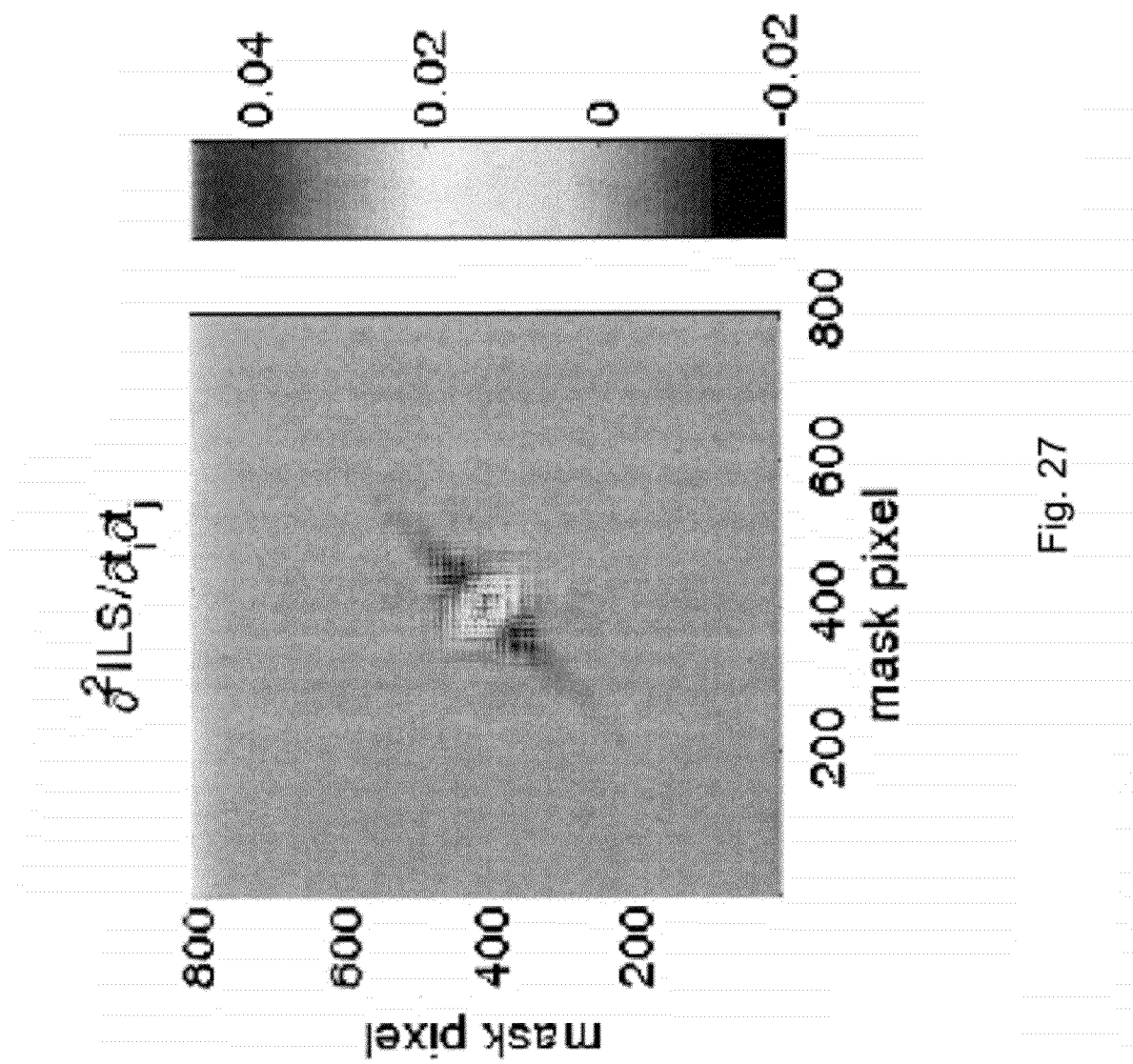

FIGS. 25 to 27 show the Hessian of the ILS with respect to t and $J_s$ at ILS evaluation point (x=63 nm, y=525 nm).

Figure 28:
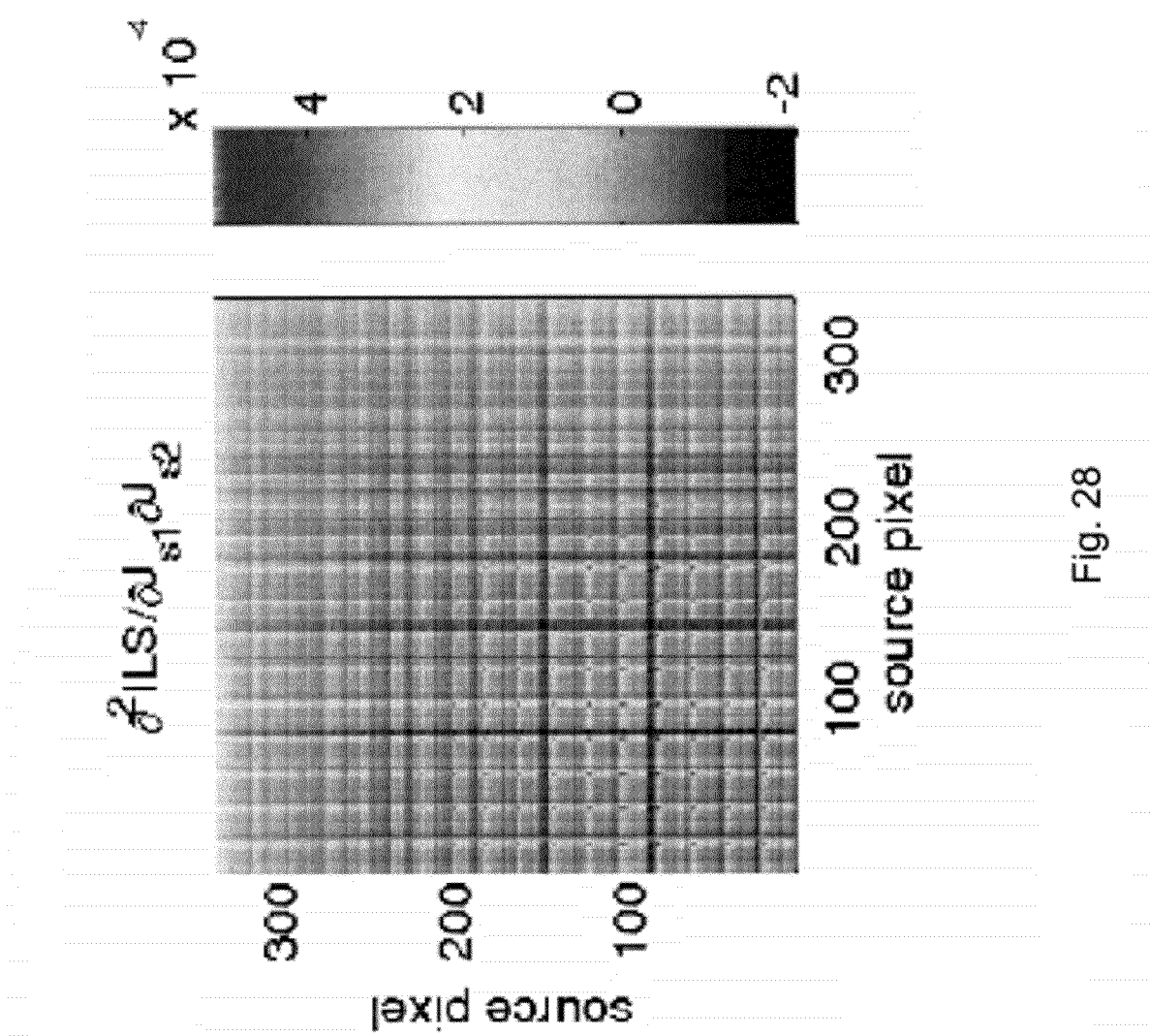
Figure 29:
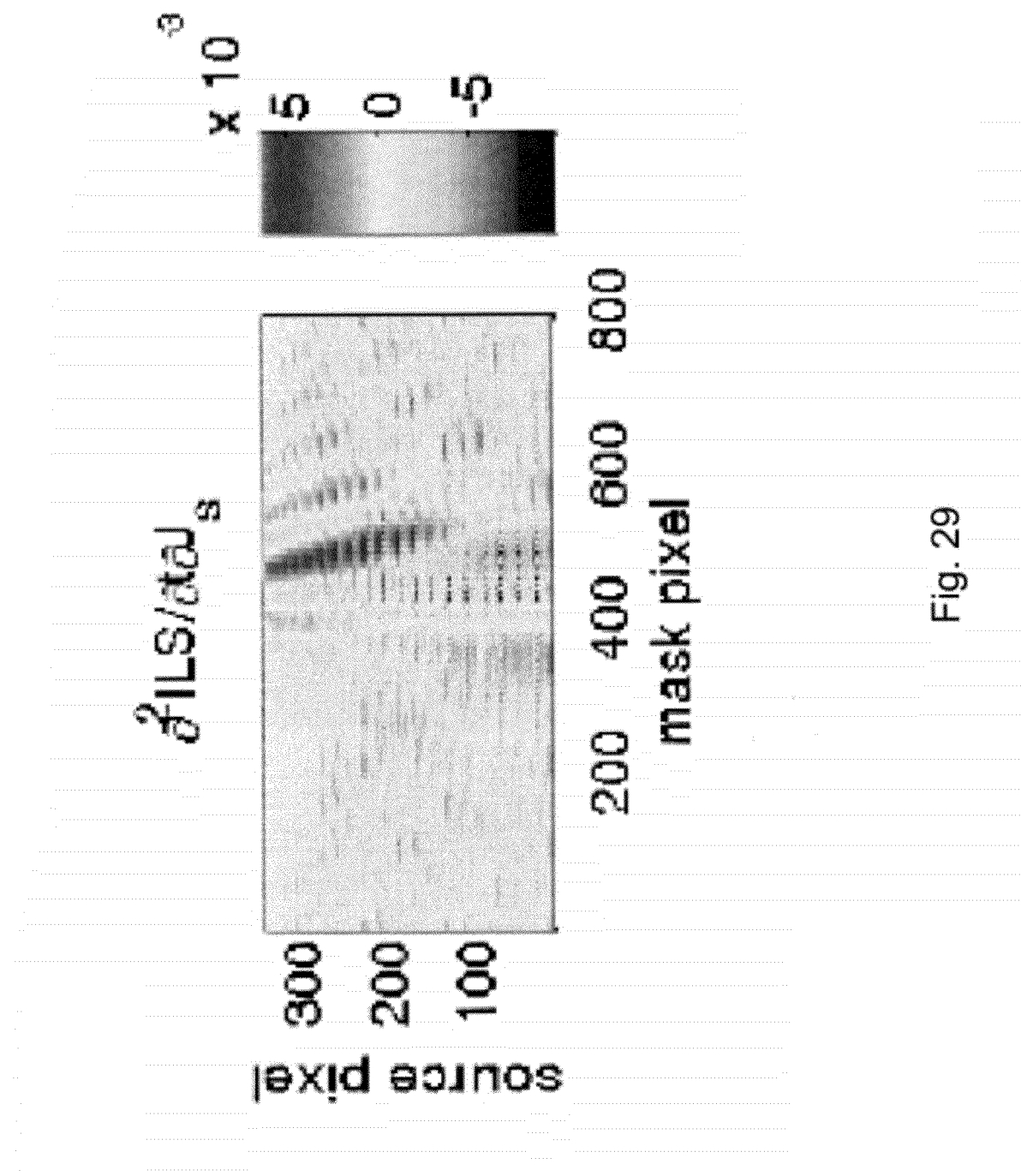
Figure 30:
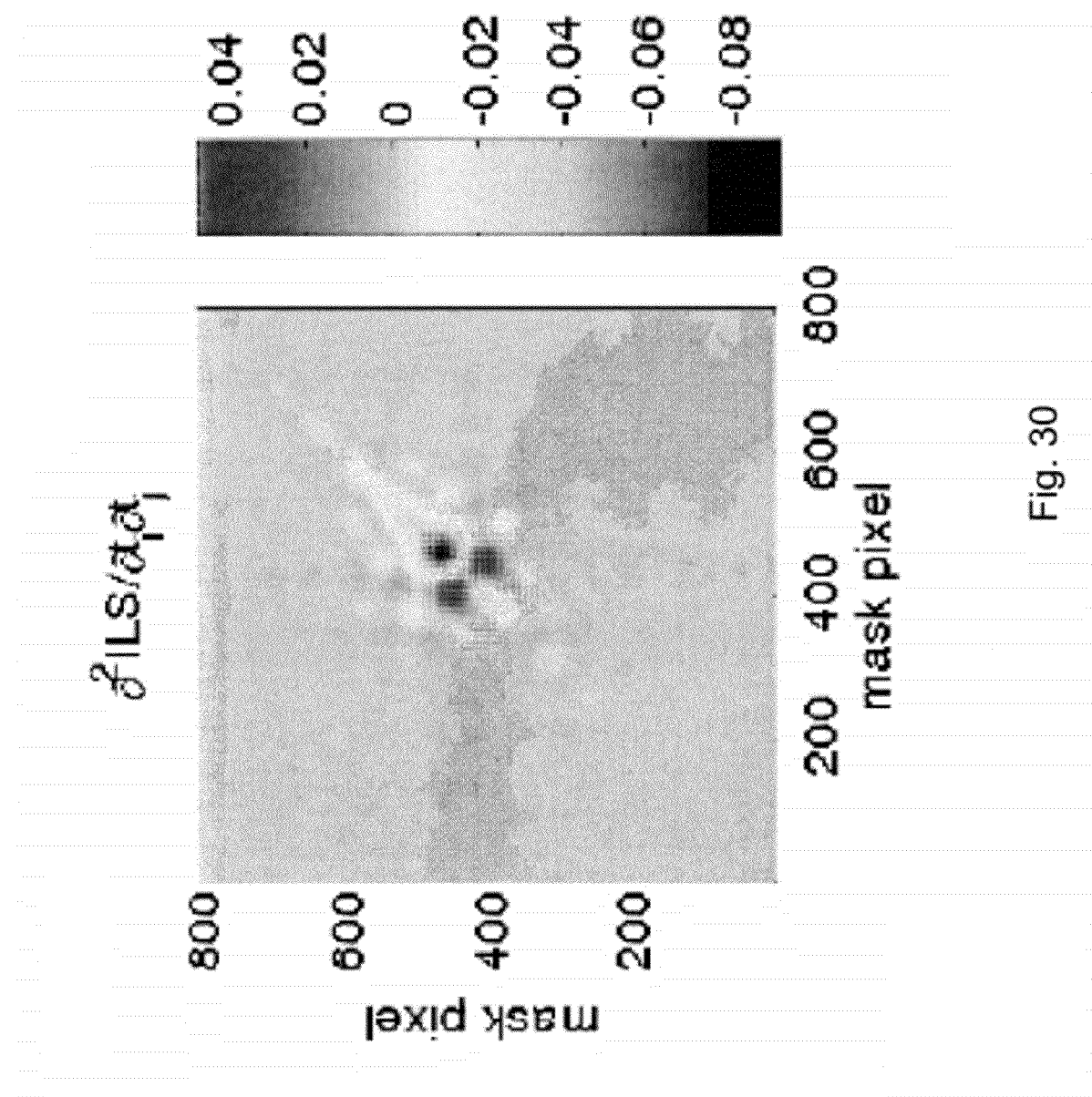

FIGS. 28 to 30 show the Hessian of the ILS with respect to t and $J_s$ at ILS evaluation point (x=42 nm, y=567 nm).

FIGS. 31 to 39 show a 44 nm vertical isolated line (pitch-1100 nm). The results are for NA=1.35 ($k_1$=0.31), and for a binary mask. The mask pixel size is 11 nm and the source pixel size is 0.05 sigma. For the line, one ILS evaluation points was selected. This point is along side (x=572 nm, y=0 nm). The line is centered at x=550 nm. The gradient of ILS with respect the mask pixel, ∂ILS/∂t, and the Hessian, $\partial^2 ILS/\partial t_i \partial t_j$, is calculated with conventional illumination σ=0.98 and with the source is 90° dipole x $\sigma_{in}$=0.45 $\sigma_{out}$=0.98.

Figure 31:
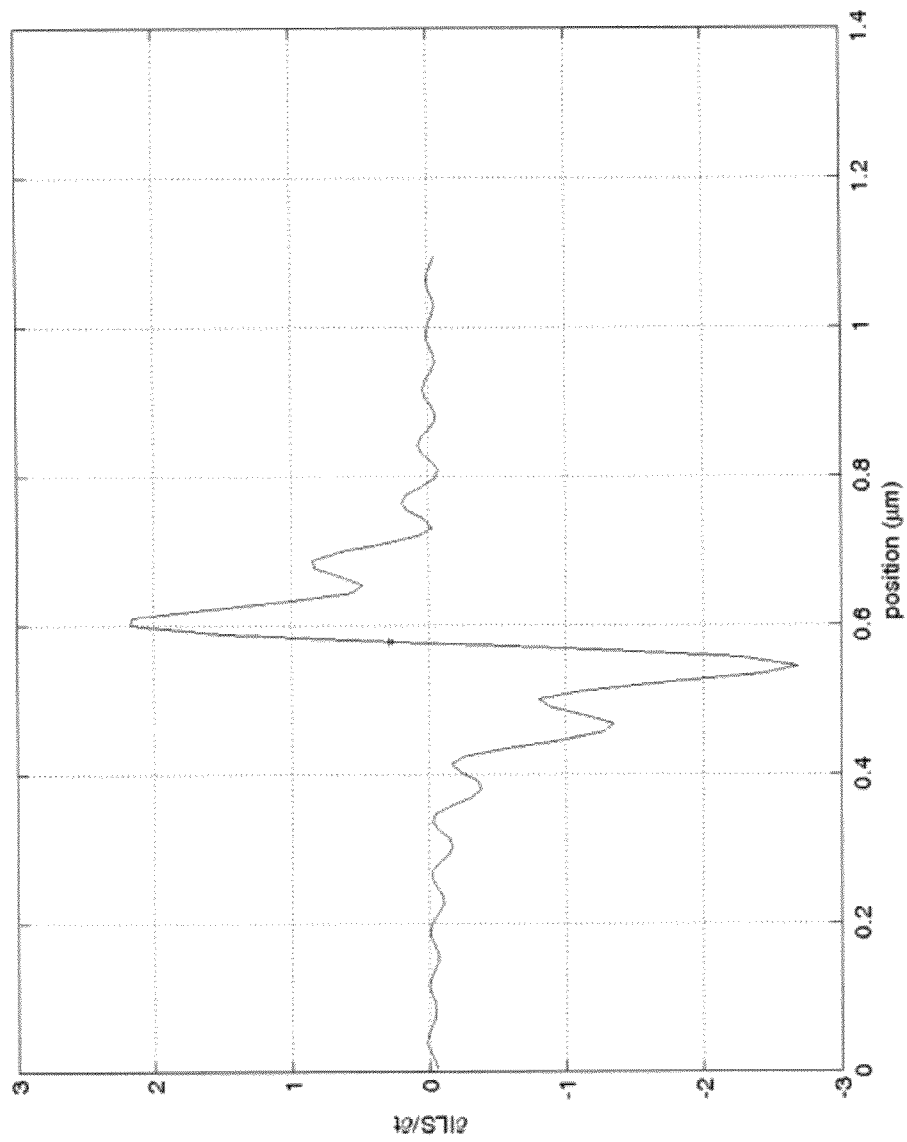
FIGS. 31-32 show the gradient of ILS with respect to t of an isolated line.
Figure 32:
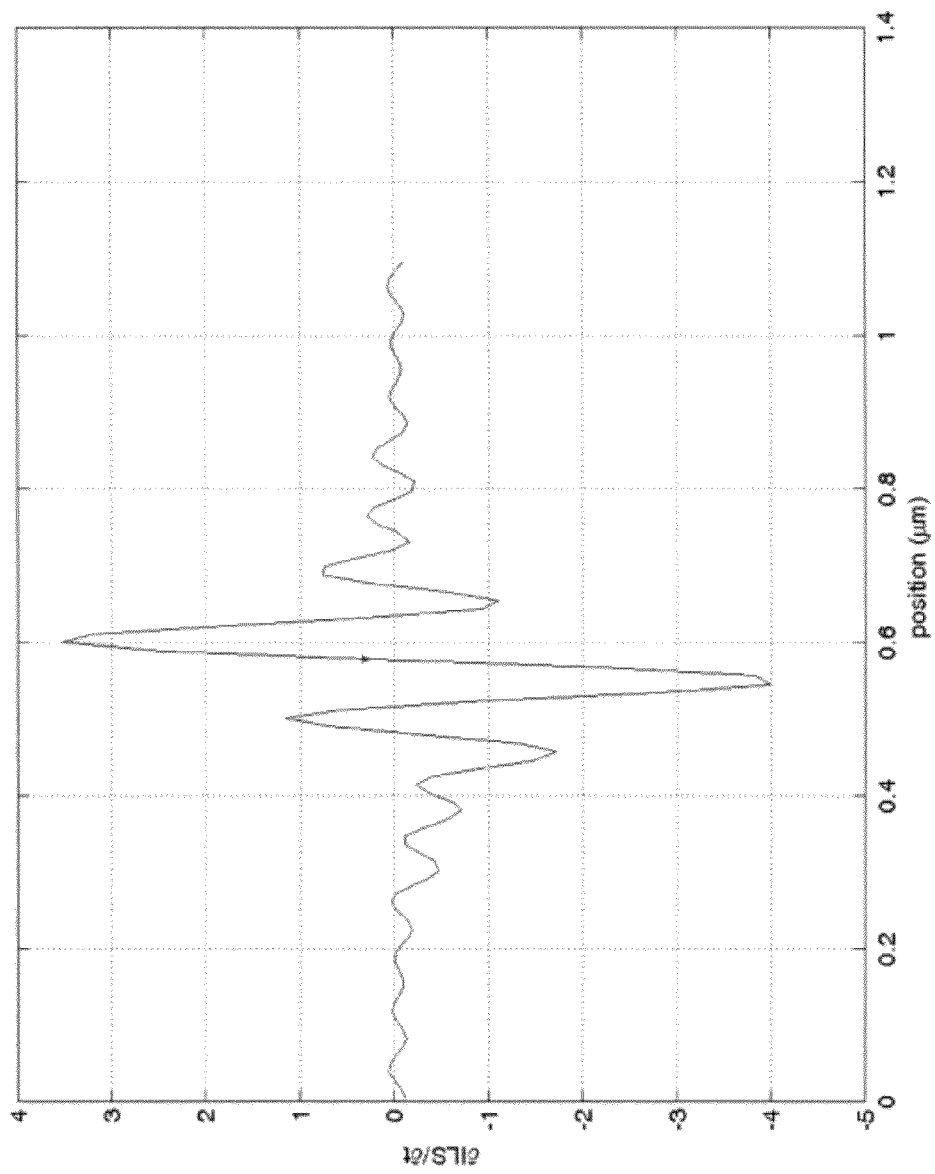

FIGS. 31 and 32 show the gradient of ILS with respect to t.

FIG. 31 shows the gradient of the ILS with respect to t, ∂ILS/∂t, at ILS evaluation point (x=572 nm, y=0 nm) which is marked by a small asterisk. For this result, the source is high sigma conventional. The line is centered at 550 nm. Note that the ∂ILS/∂t plot wants the transmission in the dark area to decrease and the transmission in the bright area to increase. This is not possible for a binary mask. Also the ∂ILS/∂t plot shows that the line width should decrease a little to improve the ILS. It should be noted that the gradient with respect to the transmission is highly dependent on the source.

FIG. 32 shows the gradient of the ILS with respect to t, ∂ILS/∂t, at ILS evaluation point (x=572 nm, y=0 nm) which is marked by a small asterisk. For this result, the source is 90° dipole x $\sigma_{in}$=0.45 $\sigma_{out}$=0.98. The line is centered at 550 nm. Note that the ∂ILS/∂t plot wants the transmission in the dark area to decrease and the transmission in the bright area to increase. This is not possible for a binary mask. Also the ∂ILS/∂t plot shows that the line width should decrease a little to improve the ILS. In comparing the conventional versus the dipole x, it should be noted that the ∂ILS/∂t has larger amplitude with dipole x and there is a distinct location at position=0.65 μm for a SRAF with dipole x FIG. 33 shows the gradient of ILS with respect $J_s$.

Figure 33:
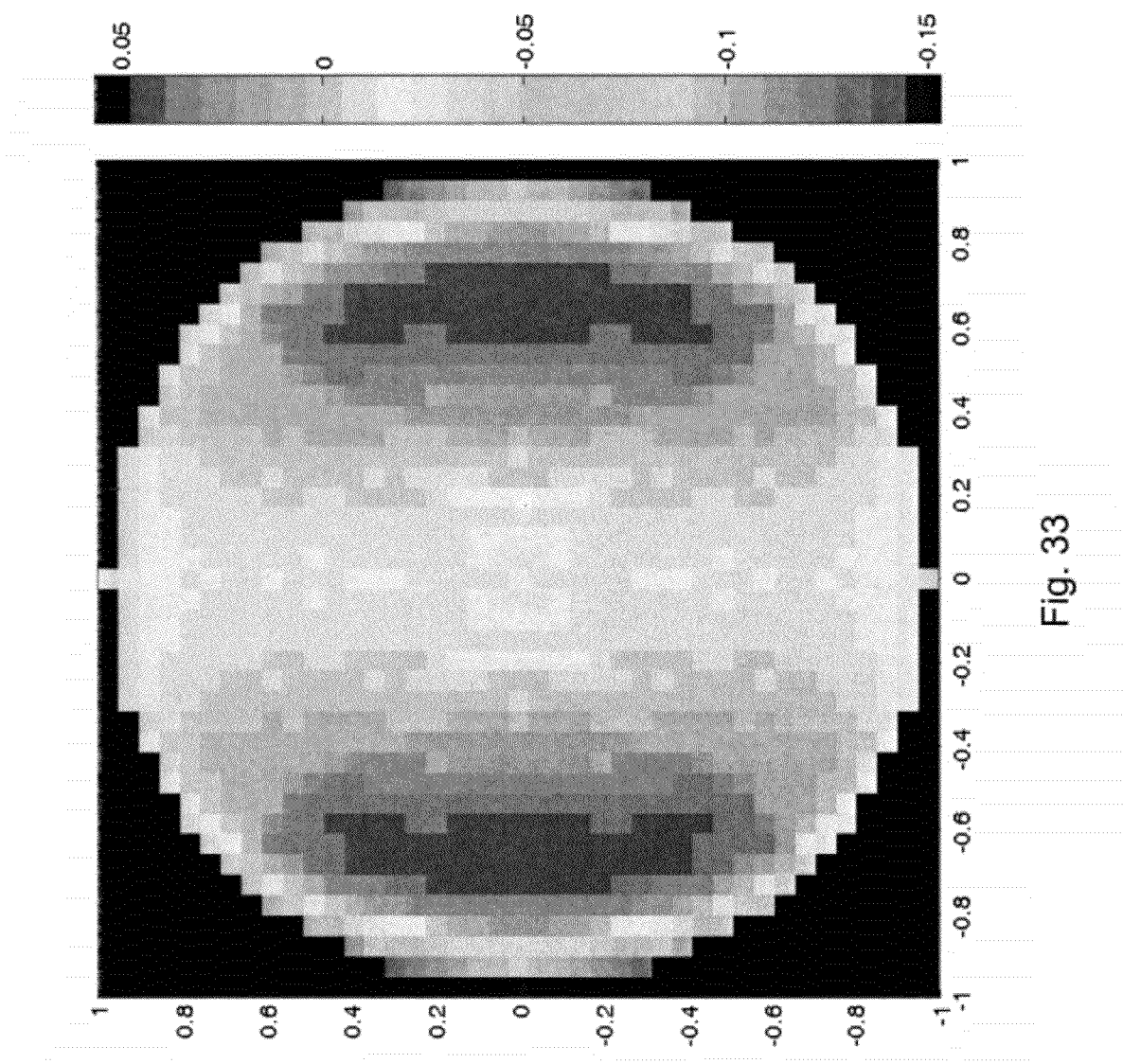
FIG. 33 shows the gradient of ILS with respect to $J_s$ of the isolated line.

FIG. 33 shows the gradient of the ILS with respect to t, ∂ILS/∂t, at ILS evaluation point (x=572 nm, y=0 nm). The optimal illumination for this point is dipole x. This is due to the obliquity factor in the projection lens.

FIGS. 34 to 39 show the Hessian of ILS with respect to t and $J_s$.

Figure 34:
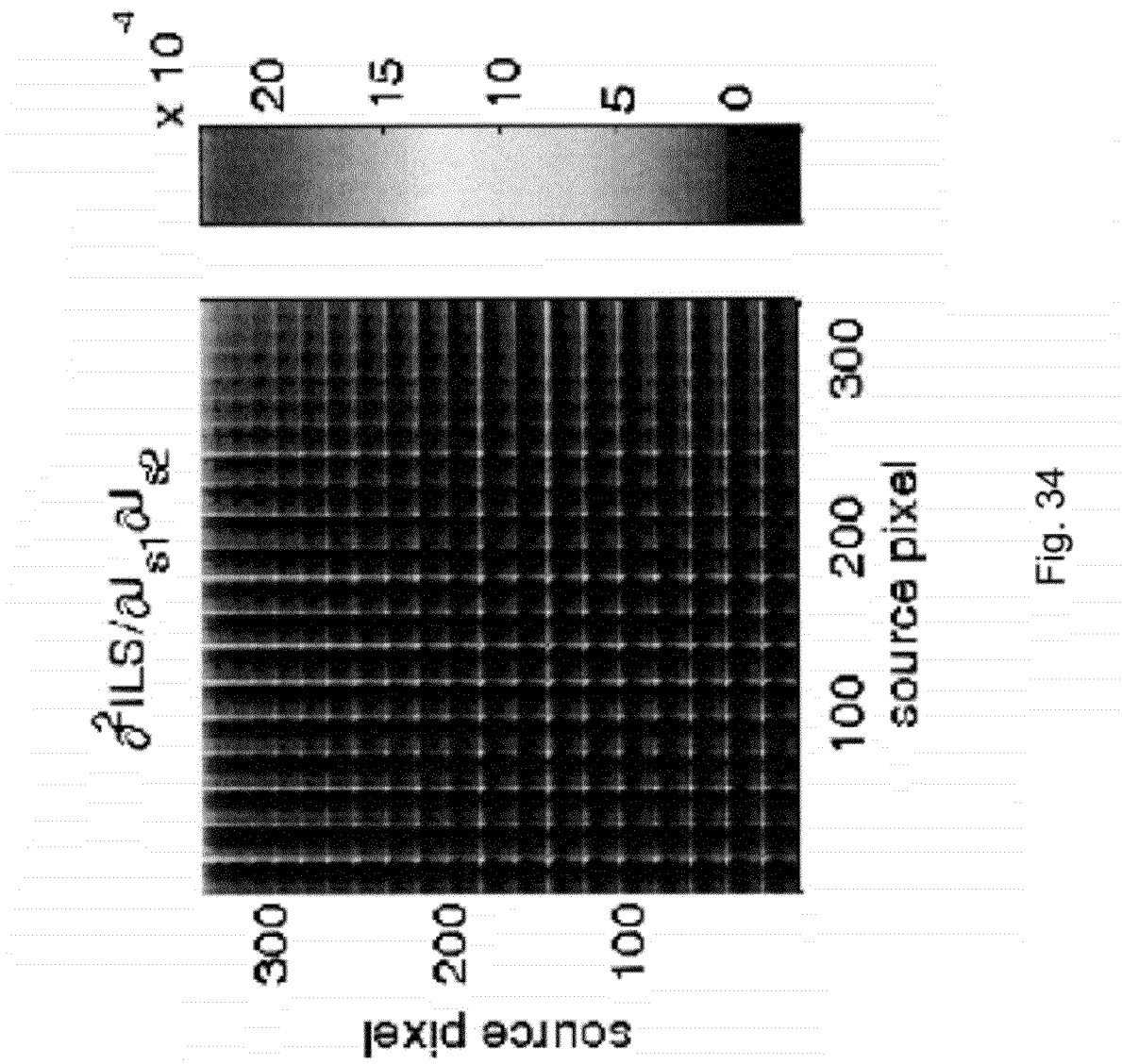
FIGS. 34-39 show the Hessian of ILS with respect to t and $J_s$ of the isolated line.
Figure 35:
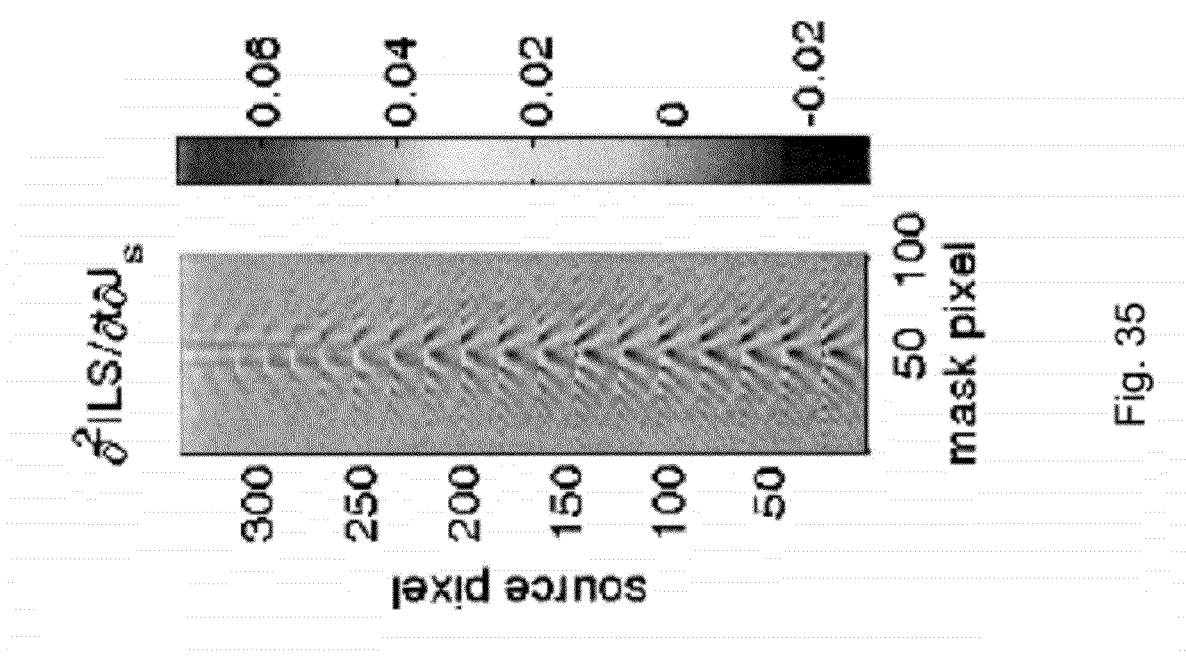
Figure 36:
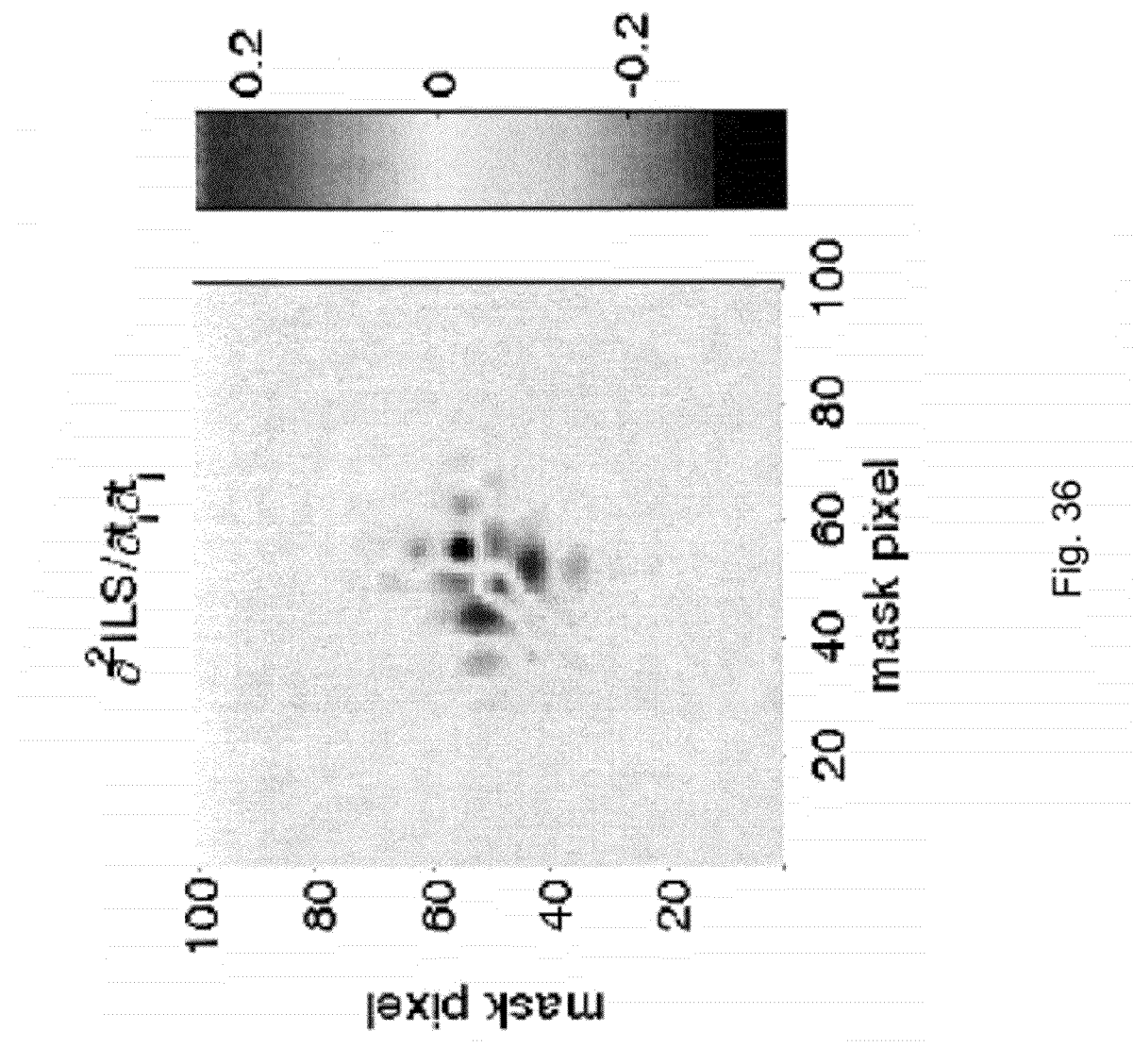

FIGS. 34 to 36 show the Hessian of the ILS with respect to t and $J_s$ at ILS evaluation point (x=572 nm, y=0 nm). For this result the source is high sigma conventional.

Figure 37:
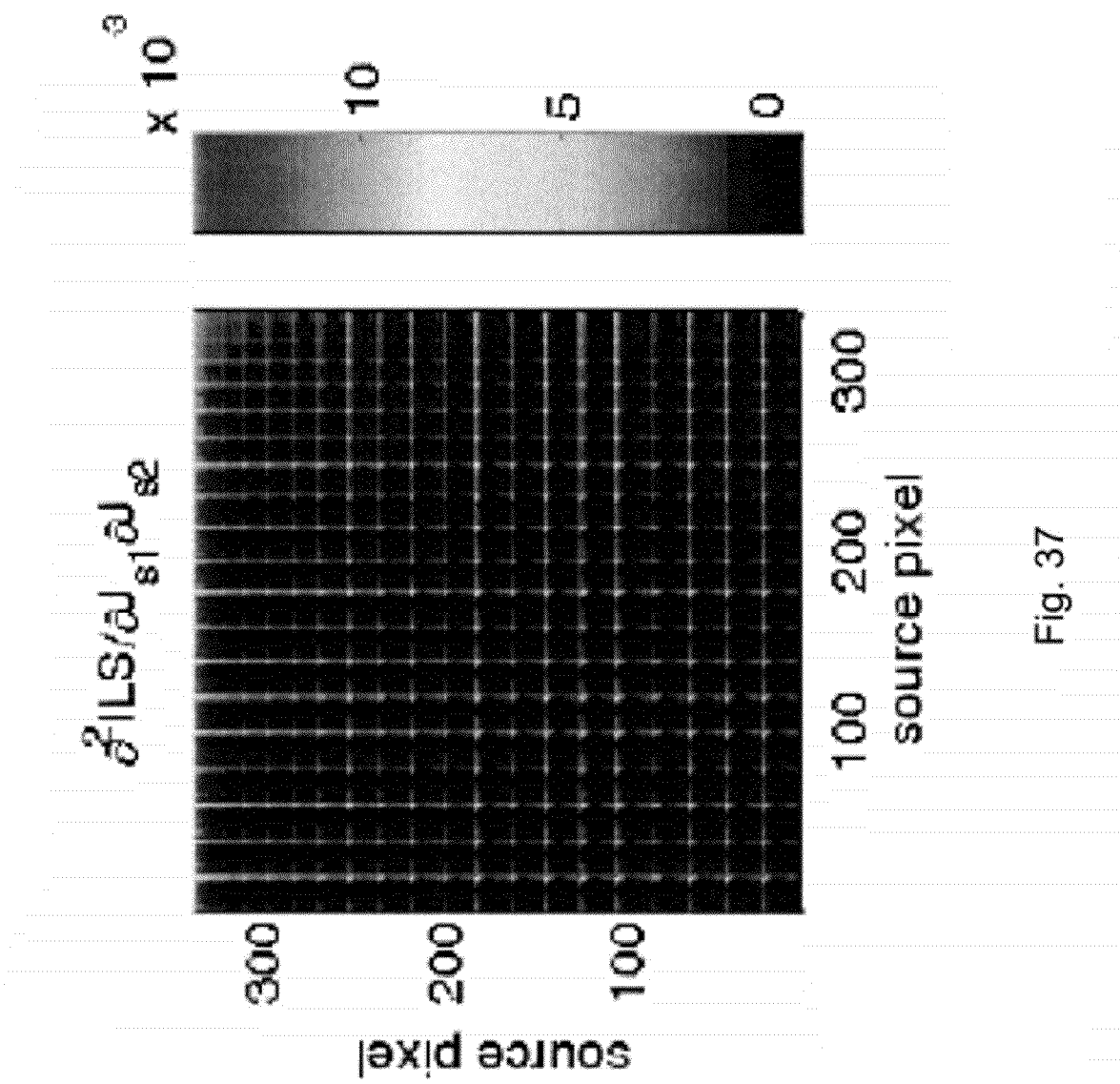
Figure 38:
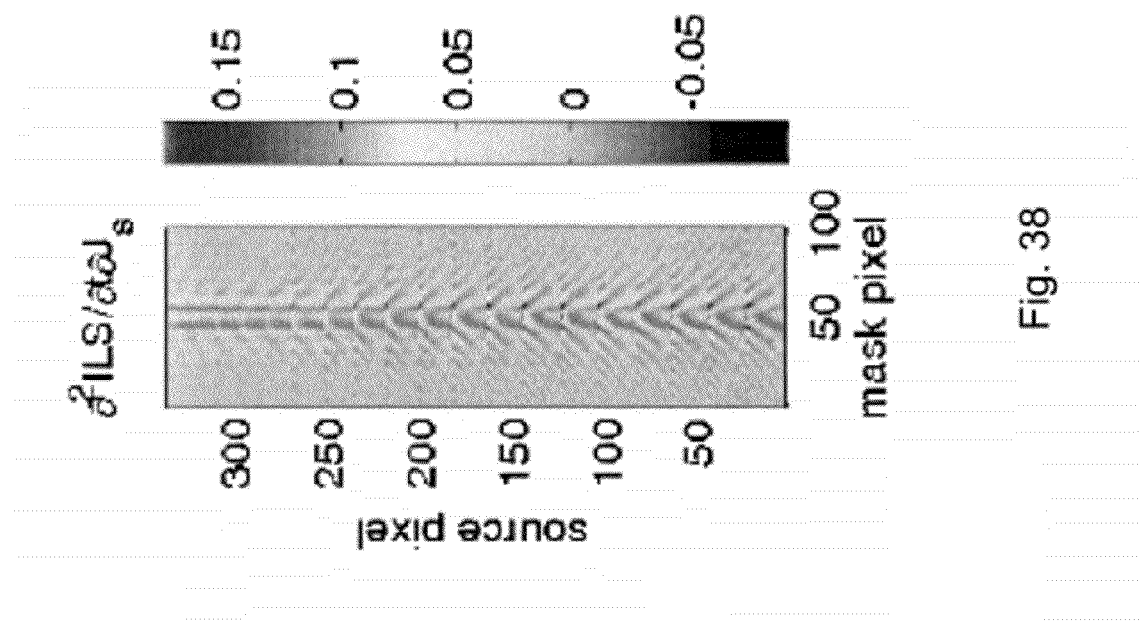
Figure 39:
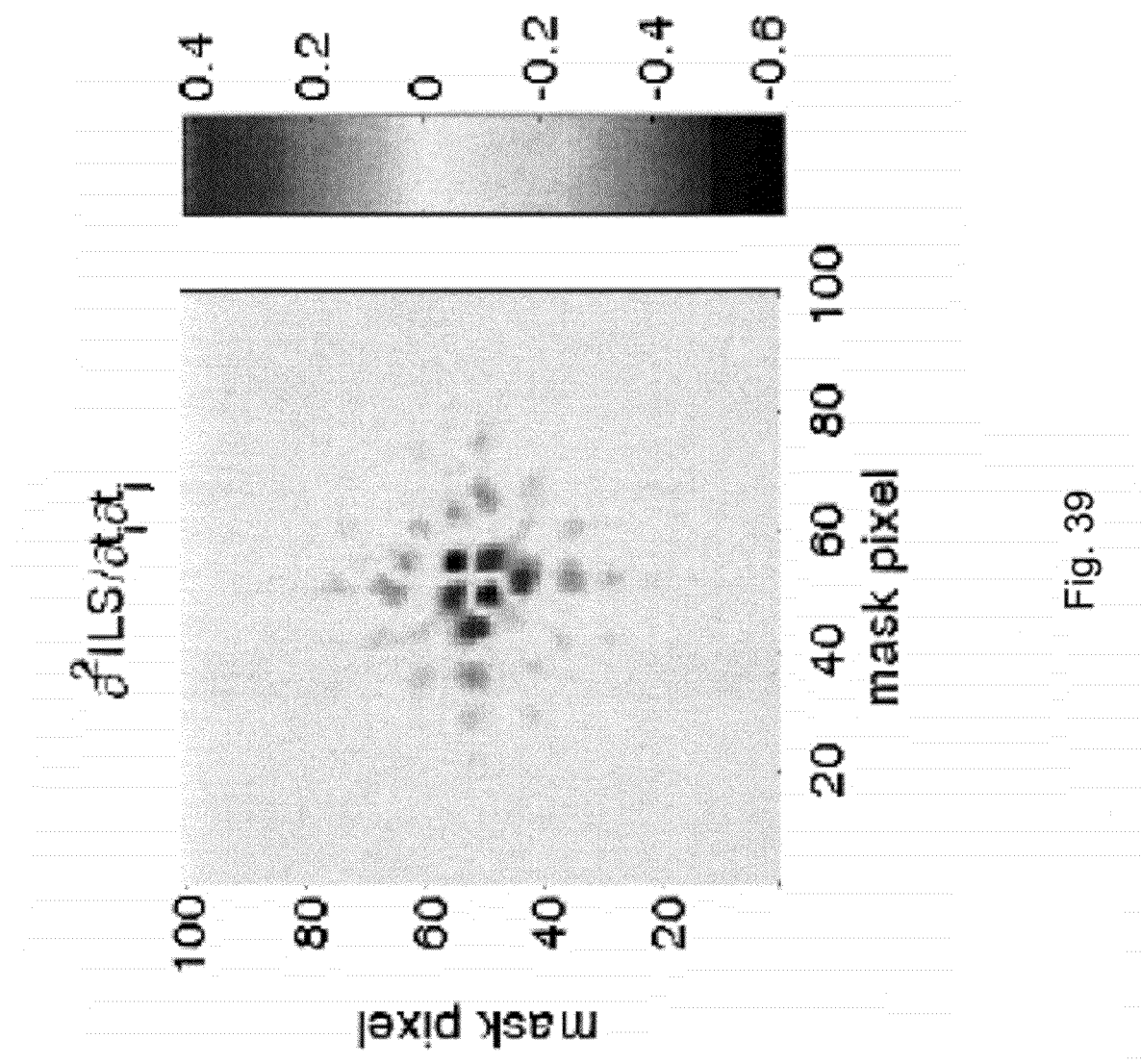

FIGS. 37 to 39 show the Hessian of the ILS with respect to t and $J_s$ at ILS evaluation point (x=572 nm, y=0 nm). For this result, the source is 90° dipole x $\sigma_{in}$=0.45 $\sigma_{out}$=0.98.

FIGS. 40 to 49 show using the gradient of the ILS with respect to t, ∂ILS/∂t, to provide design rule guidance. The gradient of the ILS with respect to t can also provide guidance to the design rules for other parts of the chip. The 50 nm half-pitch brickwall above was shrunk to a 42 nm half-pitch (k1=0.28). At this new half-pitch the source and mask was optimized with SMO at an NA=1.35 with x-y polarization.

Figure 40:
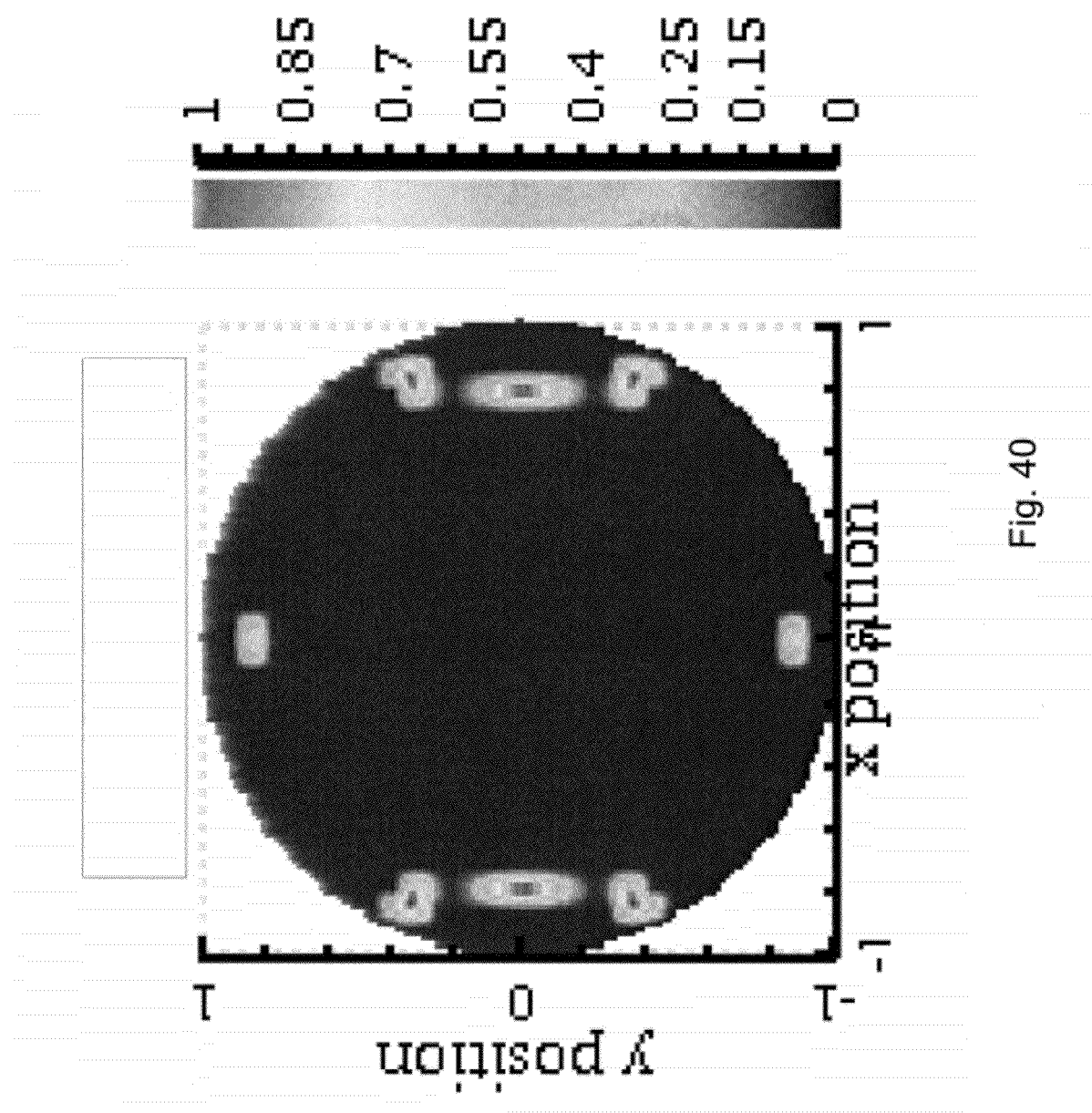
FIG. 40 shows an octopole source resulting from optimization of the mask and source for a brickwall with k1=0.28.

FIG. 40 shows the mask and source optimized for a brickwall pattern with k1=0.28 resulting in an octopole source.

FIG. 41 shows the mask after source and mask co-optimization and optical proximity correction.

With this optimal source of FIG. 40, the gradient of the ILS with respect to t was calculated for various patterns that may exist in the periphery or that may be desired in the design. With the ILS with respect to t, guidance on the optimal design rule can be provided.

FIG. 42 shows a 42 nm trench pattern at 84 nm pitch in the horizontal direction with 60 nm end-to-end trench distance used for calculating the gradient of the ILS with respect to t, the transmission.

FIG. 43 shows the gradient of the ILS with respect to t is shown for the end of trench location.

In the examples in FIGS. 42 and 43, the ILS with respect to t is calculated for the end-to-end trench pattern (the mask is a dark field binary mask). The gap between the two ends is 60 nm while the trench is 42 nm on a 84 nm pitch, i.e., the half-pitch of this periphery pattern is identical to the half-pitch of the brickwall isolation pattern. The ILS with respect to t plot on the right (FIG. 43) shows the change in the pixel needed to improve the ILS at the end of the trench (the black asterisk *). The change in transmission, t, is less than zero for all the pixels until the end-to-end trench distance is 140 nm. This implies that the optimal end-to-end trench distance is 140 nm.

FIG. 44 shows a 42 nm trench pattern at 84 nm pitch in the horizontal direction with 60 nm end-to-trench distance used for calculating the gradient of the ILS with respect to t, the transmission.

FIG. 45 shows the gradient of the ILS with respect to t for the end of trench location. The change in transmission of the trench is less than zero up to 140 nm away. This indicates that the optimal end-to-trench separation is 140 nm.

In the example of FIGS. 46-49, the ILS with respect to t of a 42 nm isolated trench with a bend in it was calculated. The ILS with respect to t is plotted for multiple locations (denoted by the asterisks *). One location is in the middle of the bottom part of the bent trench. The ILS at this first location would improve if the inside corner of the top was made larger. However, the ILS would improve if the inside corner of the bottom was made smaller. If these corners were made larger and smaller, respectively, the ILS at the top of the bent trench would suffer because the pattern has a symmetry. Given this trade-off, the only way to improve the ILS in the middle of the bent trench section is by adding a SRAF where the ILS with respect to t is greater than zero. Another location is the outside corner. The ILS at this location would improve if the inside corner of the top was made larger. However, the ILS at yet another location, the inside corner, would decrease if the top was made larger. Again there is a trade-off between the locations. The only way to improve the ILS in the inside and outside corner is by adding a sub-resolution assist feature (SRAF) where the ILS with respect to t is greater than zero.

FIG. 46 shows the 42 nm isolated trench with a bend in it. FIG. 47 shows the gradient of the ILS with respect to t in the middle of the bend (the black asterisk, *). Because of the trade-offs with the other locations, the best way to improve the ILS at this location is by adding a SRAF to the location where $\partial ILS/\partial t > 0$.

Figure 48:
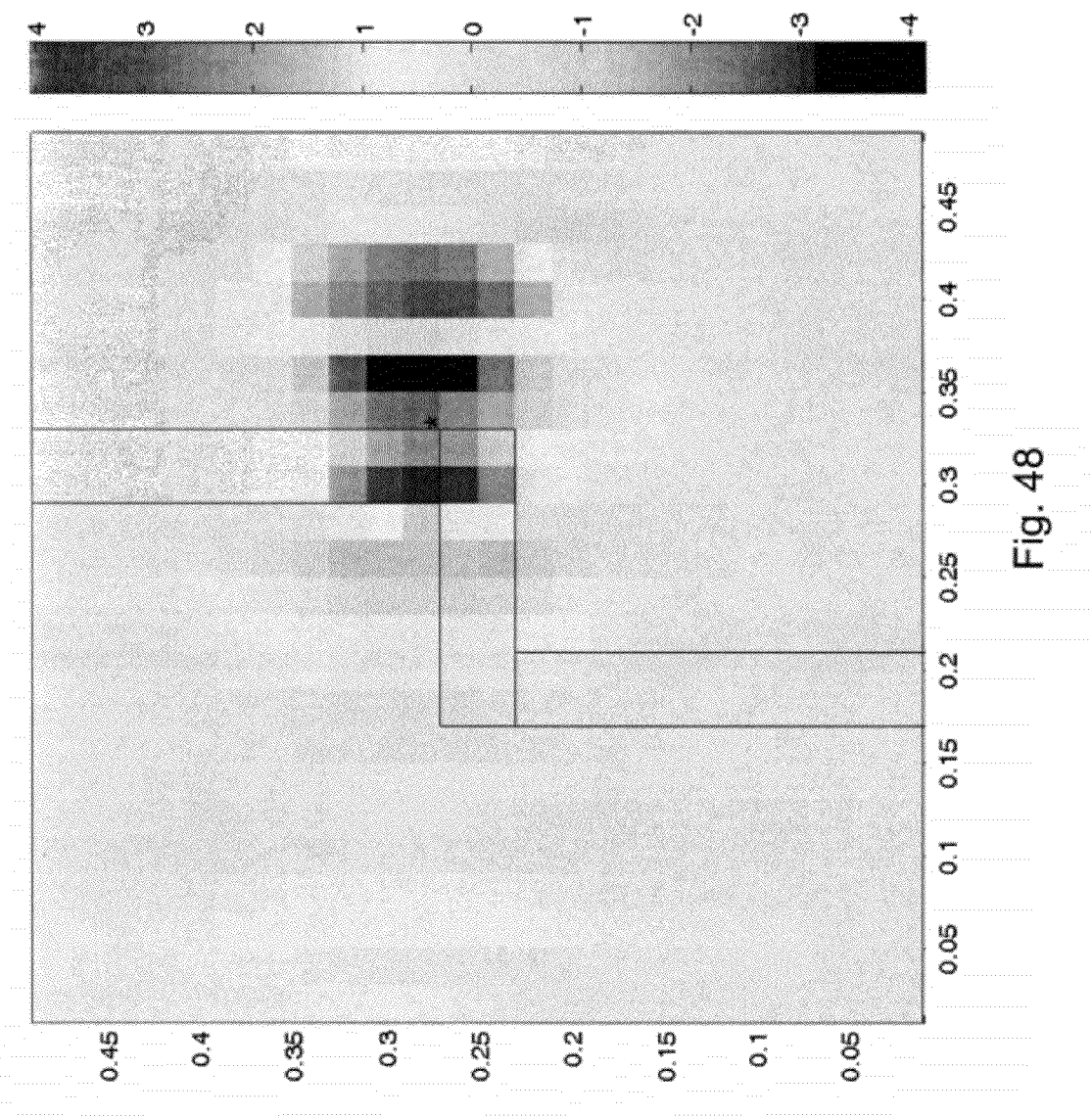
FIG. 48 shows the gradient of the ILS with respect to t for the outside corner of the isolated trench.

FIG. 48 shows the gradient of the ILS with respect to t for the outside corner (the black asterisk, *). Because of the trade-offs with the other locations, the best way to improve the ILS at this location is by adding a SRAF to the location where $\partial ILS/\partial t > 0$.

Figure 49:
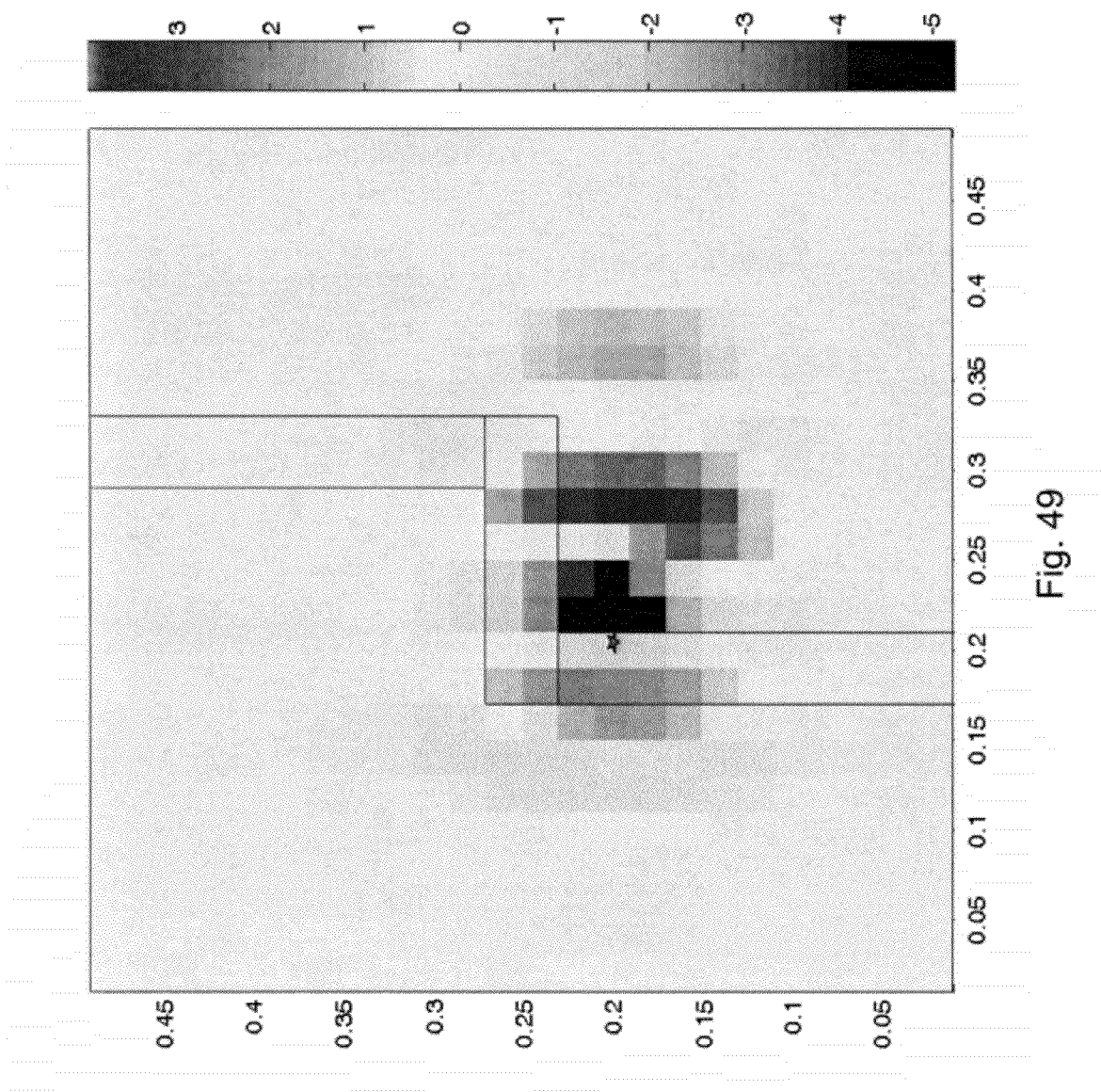
FIG. 49 shows the gradient of the ILS with respect to t for the inside corner of the isolated trench.

FIG. 49 shows the gradient of the ILS with respect to t for the inside corner (the black asterisk, *). Because of the trade-offs with the other locations, the best way to improve the ILS at this location is by adding a SRAF to the location where $\partial ILS/\partial t > 0$.

FIG. 50 is a flowchart illustrating an example methodology according to aspects of the invention described in more detail above. In some embodiments, the methodology is implemented using software embodied in a computer readable medium executing on a computer system, such as is currently done using many commercially available computational lithography tools. Those skilled in the art will understand how to implement the methodology of the invention in similar manner after being taught by the present disclosure.

As shown in FIG. 50, a method for optimizing a mask pattern and an illumination source according to aspects of the invention includes a first step 5002 of identifying a plurality of source points of an illumination source (e.g. a configurable illumination source) and a predetermined mask pattern (e.g. provided in a GDS II or OASIS file). Next in step 5004, the method includes selecting evaluation points in an image plane of an image formed by the illumination provided to the predetermined mask pattern. In step 5006, the method determines an image log slope (ILS) of illumination at each evaluation point. Step 5008 includes determining the Hessian of the image log slope. Finally in step 5010, the method determines an optimal mask pattern and illumination source which maximizes the image log slope at the selected evaluation points.

Persons skilled in the art will appreciate that the method shown in FIG. 50 only depicts illustrative steps. Not all the steps need to be included in every embodiment, and additional intermediate/terminal steps may be included in the methods, as applicable. The sequence of the steps may be altered.

Figure 51:
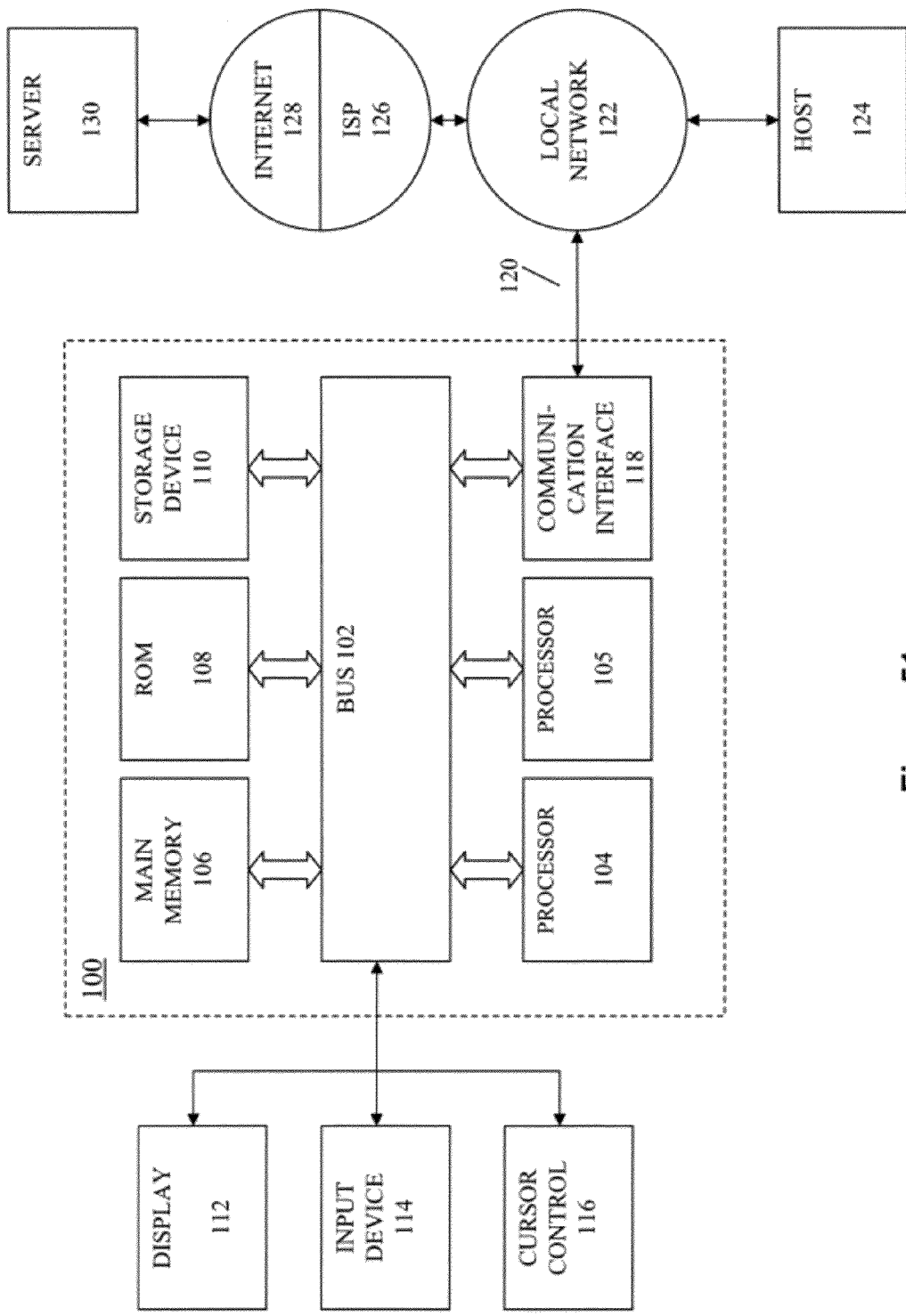
FIG. 51 is a block diagram that illustrates a computer system which can assist in the implementation of the design optimization method of the present invention.

Details of a Computer System for Implementing the Embodiments of the Present Invention FIG. 51 is a block diagram that illustrates a computer system 100 which can assist and/or implement the design rule optimization methods for lithographic tools, as disclosed herein. Computer system 100 includes a bus 102 or other communication mechanism for communicating information, and a processor 104 coupled with bus 102 for processing information. Computer system 100 also includes a main memory 106, such as a random access memory (RAM) or other dynamic storage device, coupled to bus 102 for storing information and instructions to be executed by processor 104. Main memory 106 also may be used for storing temporary variables or other intermediate information during execution of instructions to be executed by processor 104. Computer system 100 further includes a read only memory (ROM) 108 or other static storage device coupled to bus 102 for storing static information and instructions for processor 104. A storage device 110, such as a magnetic disk or optical disk, is provided and coupled to bus 102 for storing information and instructions.

Computer system 100 may be coupled via bus 102 to a display 112, such as a cathode ray tube (CRT) or flat panel or touch panel display for displaying information to a computer user. An input device 114, including alphanumeric and other keys, is coupled to bus 102 for communicating information and command selections to processor 104. Another type of user input device is cursor control 116, such as a mouse, a trackball, or cursor direction keys for communicating direction information and command selections to processor 104 and for controlling cursor movement on display 112. This input device typically has two degrees of freedom in two axes, a first axis (e.g., x) and a second axis (e.g., y), that allows the device to specify positions in a plane. A touch panel (screen) display may also be used as an input device.

According to one embodiment of the invention, portions of the design rule optimization process may be performed by computer system 100 in response to processor 104 executing one or more sequences of one or more instructions contained in main memory 106. Such instructions may be read into main memory 106 from another computer-readable medium, such as storage device 110. Execution of the sequences of instructions contained in main memory 106 causes processor 104 to perform the process steps described herein. One or more processors in a multi-processing arrangement may also be employed to execute the sequences of instructions contained in main memory 106. In alternative embodiments, hard-wired circuitry may be used in place of or in combination with software instructions to implement the invention. Thus, embodiments of the invention are not limited to any specific combination of hardware circuitry and software.

The term "computer-readable medium" as used herein refers to any medium that participates in providing instructions to processor 104 for execution. Such a medium may take many forms, including but not limited to, non-volatile media, volatile media, and transmission media. Non-volatile media include, for example, optical or magnetic disks, such as storage device 110. Volatile media include dynamic memory, such as main memory 106. Transmission media include coaxial cables, copper wire and fiber optics, including the wires that comprise bus 102. Transmission media can also take the form of acoustic or light waves, such as those generated during radio frequency (RF) and infrared (IR) data communications. Common forms of computer-readable media include, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, and EPROM, a FLASH-EPROM, any other memory chip or cartridge, a carrier wave as described hereinafter, or any other medium from which a computer can read.

Various forms of computer readable media may be involved in carrying one or more sequences of one or more instructions to processor 104 for execution. For example, the instructions may initially be borne on a magnetic disk of a remote computer. The remote computer can load the instructions into its dynamic memory and send the instructions over a telephone line using a modem. A modem local to computer system 100 can receive the data on the telephone line and use an infrared transmitter to convert the data to an infrared signal. An infrared detector coupled to bus 102 can receive the data carried in the infrared signal and place the data on bus 102. Bus 102 carries the data to main memory 106, from which processor 104 retrieves and executes the instructions. The instructions received by main memory 106 may optionally be stored on storage device 110 either before or after execution by processor 104.

Computer system 100 also preferably includes a communication interface 118 coupled to bus 102. Communication interface 118 provides a two-way data communication coupling to a network link 120 that is connected to a local network 122. For example, communication interface 118 may be an integrated services digital network (ISDN) card or a modem to provide a data communication connection to a corresponding type of telephone line. As another example, communication interface 118 may be a local area network (LAN) card to provide a data communication connection to a compatible LAN. Wireless links may also be implemented. In any such implementation, communication interface 118 sends and receives electrical, electromagnetic or optical signals that carry digital data streams representing various types of information.

Network link 120 typically provides data communication through one or more networks to other data devices. For example, network link 120 may provide a connection through local network 122 to a host computer 124 or to data equipment operated by an Internet Service Provider (ISP) 126. ISP 126 in turn provides data communication services through the worldwide packet data communication network, now commonly referred to as the "Internet" 128. Local network 122 and Internet 128 both use electrical, electromagnetic or optical signals that carry digital data streams. The signals through the various networks and the signals on network link 120 and through communication interface 118, which carry the digital data to and from computer system 100, are exemplary forms of carrier waves transporting the information.

Computer system 100 can send messages and receive data, including program code, through the network(s), network link 120, and communication interface 118. In the Internet example, a server 130 might transmit a requested code for an application program through Internet 128, ISP 126, local network 122 and communication interface 118. In accordance with the invention, one such downloaded application provides for the illumination optimization of the embodiment, for example. The received code may be executed by processor 104 as it is received, and/or stored in storage device 110, or other non-volatile storage for later execution. In this manner, computer system 100 may obtain application code in the form of a carrier wave.

Example Lithography Tool

Figure 52:
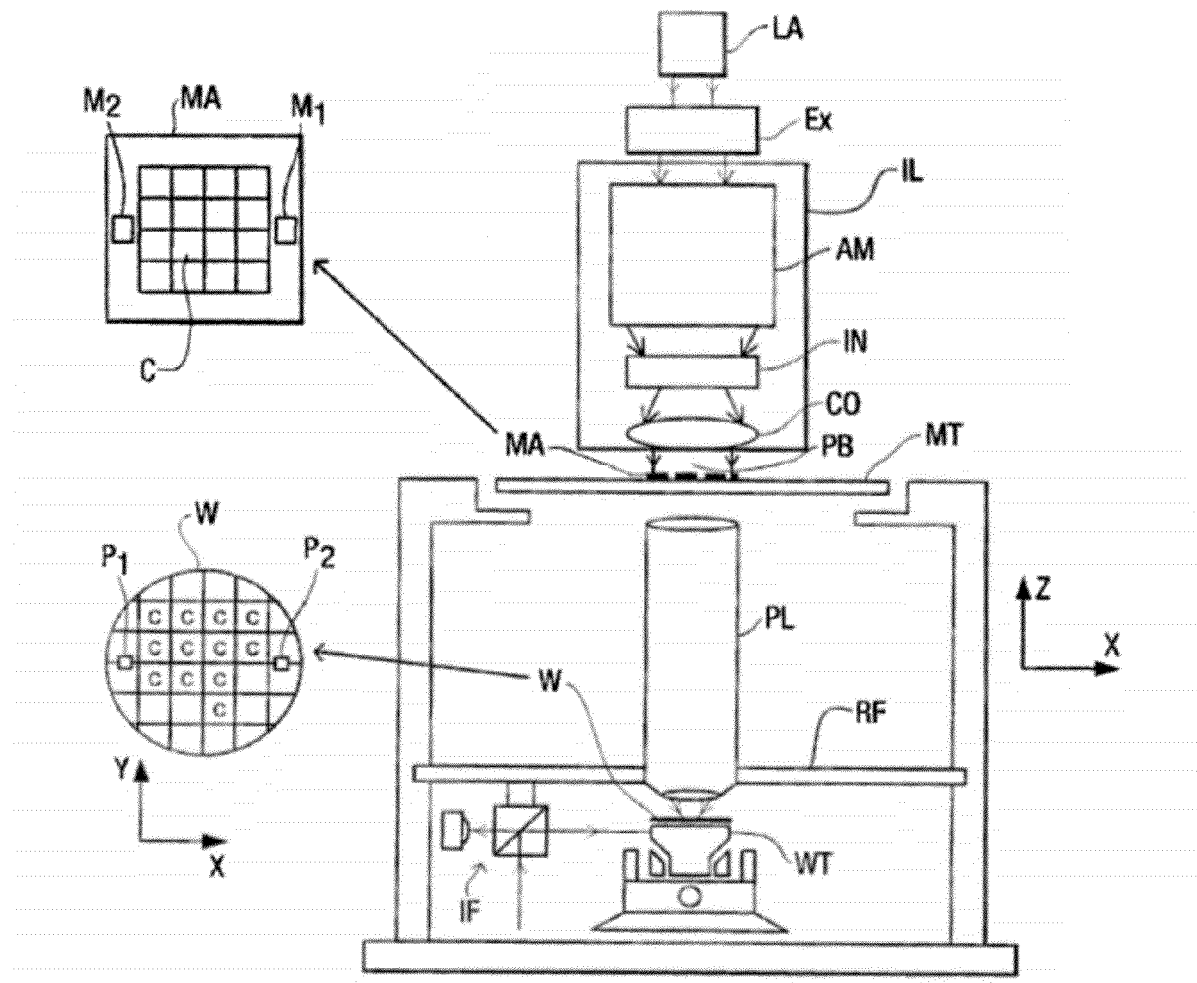
FIG. 52 shows a schematic representation of an example of a lithography apparatus.

FIG. 52 is a schematic representation of an example of a lithography apparatus for use according to the present invention. The apparatus includes a radiation system. The radiation system is made up of a lamp LA (which may be an excimer laser, for example) and an illumination system which may comprise beam shaping optics EX, an integrator IN, and a condenser lens CO, for example. The radiation system supplies a projection beam PB of radiation. For example, the radiation system may provide ultraviolet, deep ultraviolet or extreme ultraviolet radiation. In general, the radiation system may also provide soft x-ray or other forms of radiation.

A first object table, or mask table MT holds a mask MA. The mask MA includes a pattern area C which contains the mask pattern to be imaged. The mask table MT is movable relative to the projection beam PB so that different portions of the mask may be irradiated. Alignment marks $M_1$ and $M_2$ are used for determining whether the mask is properly aligned with the substrate, or wafer, W.

A projection system PL projects the projection beam PB onto the wafer W. The wafer W includes two alignment marks $P_1$ and $P_2$ which are aligned with the marks $M_1$ and $M_2$ prior to beginning imaging. The wafer W is supported by a substrate table WT which is moveable relative to the projection beam for exposing different parts of the wafer W; in this way, the mask pattern C may be imaged onto different target portions c of the wafer W. An interferometric position monitor IF is used to insure that the wafer table WT is in the correct position relative to the position of the mask table MT.

While particular embodiments of the invention have been described, it is understood that modifications will be apparent to those skilled in the art without departing from the spirit of the invention. Embodiments described as being implemented in software should not be limited thereto, but can include embodiments implemented in hardware, or combinations of software and hardware, and vice-versa, as will be apparent to those skilled in the art, unless otherwise specified herein. The scope of the invention is not limited to the specific embodiments described herein. Other embodiments, uses, and advantages of the invention will be apparent to those skilled in art from the specification and the practice of the disclosed invention.

The invention claimed is:

1. A computer-implemented method for optimizing a mask pattern and an illumination source, the method comprising:
    identifying a plurality of source points of an illumination source and a predetermined mask pattern;
    selecting evaluation points in an image plane of an image formed by illumination provided to the predetermined mask pattern by the illumination source;
    determining an image log slope (ILS) of illumination at each evaluation point;
    determining the Hessian of the image log slope, wherein the Hessian comprises a second order partial derivative with respect to two different variables associated with the mask pattern and the illumination source; and
    using the Hessian for determining at least one of an improved mask pattern and an improved illumination source which maximizes the image log slope at the selected evaluation points,
    wherein at least some of the above functions are performed by a computer.

2. The method of claim 1, wherein the Hessian of the ILS is determined with respect to mask transmission and source intensity.

3. The method of claim 1, wherein the Hessian of ILS is determined without using approximate methods based on the gradient of the ILS.

4. The method of claim 1, wherein the Hessian of the ILS is determined with respect to an illumination pupil and a mask pixel.

5. The method of claim 1, wherein a sub-resolution assist feature is added to the mask pattern to improve the ILS.

6. A non-transitory computer readable medium containing instructions for a computer to cause optimizing a mask pattern and an illumination source, the process of optimizing comprising:
    identifying a plurality of source points of an illumination source and a predetermined mask pattern;
    selecting evaluation points in an image plane of an image formed by illumination provided to the predetermined mask pattern by the illumination source;
    determining an image log slope (ILS) of illumination at each evaluation point;
    determining the Hessian of the image log slope, wherein the Hessian comprises a second order partial derivative with respect to two different variables associated with the mask pattern and the illumination source; and
    using the Hessian for determining at least one of an improved mask pattern and an improved illumination source which maximizes the image log slope at the selected evaluation points.

7. The computer readable medium of claim 6, wherein the Hessian of the ILS is determined with respect to mask transmission and source intensity.

8. The computer readable medium of claim 6, wherein the Hessian of ILS is determined without using approximate methods based on the gradient of the ILS.

9. The computer readable medium of claim 6, wherein the Hessian of the ILS is determined with respect to an illumination pupil and a mask pixel.

10. The computer readable medium of claim 6, wherein a sub-resolution assist feature is added to the mask pattern to improve the ILS.

11. A computer-implemented method of generating a design rule defining relative positioning of polygons in an integrated circuit design, the design rule being usable for producing a design layout for a mask used in a lithographic apparatus, the method comprising the steps of:
    identifying one or more source points of an illumination source;
    identifying a target pattern in a design layout of the mask;
    identifying one or more evaluation points of an image of the target pattern formed in an image plane when illuminated by the illumination source;
    calculating an image log slope (ILS) function of an intensity profile at each evaluation point;
    calculating a second order partial derivative of the ILS function; and
    using the second order partial derivative of the ILS function with respect to two different variables associated with one or both of the illumination source and the target pattern to update the design-rule for the target pattern,
    wherein at least some of the above steps are performed by a computer.

12. The method of claim 11, wherein calculating the second order partial derivative of the ILS function includes calculating one or more of the following:
    calculating variation of the ILS function with respect to two source points;
    calculating variation of the ILS with respect to electric field transmission at two pixel points on the design layout of the mask; and
    calculating variation of the ILS function with respect to one source point and electric field transmission at one pixel point on the design layout of the mask.

13. The method of claim 11, where the evaluation points are selected based on a fragmentation algorithm run on the target pattern that identifies fragmentation points.

14. The method of claim 11, wherein updating the design rule comprises repositioning edges of target pattern features to maximize ILS or minimize ILS variation.

15. The method of claim 11, wherein the method further comprises:
    optimizing the illumination source based on the updated design rule.

16. The method of claim 1, wherein the Hessian indicates whether to optimize the mask pattern, the illumination source, or both, to maximize the ILS.

17. The method of claim 1, wherein the optimizing of the illumination source occurs simultaneously with optimizing the mask pattern.

18. The computer readable medium of claim 6, wherein the Hessian indicates whether to optimize the mask pattern, the illumination source, or both, to maximize the ILS.

19. The computer readable medium of claim 6, wherein the optimizing of the illumination source occurs simultaneously with optimizing the mask pattern.

20. The method of claim 15, wherein the optimizing of the illumination source occurs simultaneously with optimizing the design layout of the mask using the generated design rule.

* * * * *